US005088184A

United States Patent [19]

Jarabak et al.

[11] Patent Number: 5,088,184

[45] Date of Patent: Feb. 18, 1992

[54] PROCESS FOR MAKING A SUPERCONDUCTING MAGNET FOR PARTICLE ACCELERATORS

[75] Inventors: Andrew J. Jarabak, Pittsburgh; Wallace H. Sunderman, McCandless Township, Allegheny County; Edward G. Mendola, Fallowfield Township, Washington County; Ralph W. Kalkbrenner, Hempfield Township, Westmoreland County, all of Pa.

[73] Assignee: Westinghouse Electric Corp., Pittsburgh, Pa.

[21] Appl. No.: 605,865

[22] Filed: Oct. 30, 1990

Related U.S. Application Data

[62] Division of Ser. No. 360,192, Jun. 1, 1989.

[51] Int. Cl.[5] .......... H01L 39/24

[52] U.S. Cl. .......... 29/599; 29/605; 29/606; 505/879; 505/924

[58] Field of Search .......... 505/879, 880, 924; 29/594, 605, 606, 609, 738, 564.2, 564.7, 564.1; 335/216; 174/125.1

[56] References Cited

U.S. PATENT DOCUMENTS

| | | | |
|---|---|---|---|
| 2,370,828 | 3/1945 | Widmont . | |
| 2,685,629 | 8/1954 | Peck | 219/8 |
| 2,809,230 | 10/1957 | Moses et al. . | |
| 2,975,088 | 3/1961 | Rossman et al. . | |
| 2,979,432 | 4/1961 | Thiessen . | |
| 3,086,562 | 4/1963 | Price . | |
| 3,389,038 | 6/1968 | Robison, Jr. | 156/361 |
| 3,423,814 | 1/1969 | Davis | 29/738 |
| 3,431,639 | 3/1969 | Reimer et al. | 29/605 |
| 3,453,726 | 7/1969 | Roen | 29/605 |
| 3,600,801 | 8/1971 | Larsen et al. | 29/605 |
| 3,626,585 | 12/1971 | Hammer et al. | 29/599 |
| 3,744,112 | 7/1973 | Lindenberg et al. | 29/204 |
| 3,798,736 | 3/1974 | Gibbons et al. | 29/208 |
| 3,801,942 | 4/1974 | Elsel . | |
| 3,813,764 | 6/1974 | Tanaka et al. | 29/599 |
| 3,932,928 | 1/1976 | King | 29/596 |
| 3,955,264 | 5/1976 | Klappert | 29/738 |
| 4,143,801 | 3/1979 | Sargent | 228/17.5 |
| 4,149,309 | 4/1979 | Mitsui | 29/596 |
| 4,158,161 | 6/1979 | Suzuki | 318/578 |
| 4,192,986 | 3/1980 | Udagawa et al. | 219/137 |
| 4,250,614 | 2/1981 | Schwab | 29/732 |
| 4,271,585 | 6/1981 | Satti | 29/599 |
| 4,370,188 | 1/1983 | Otty | 156/245 |
| 4,438,558 | 3/1984 | Mitsui | 29/732 |
| 4,462,152 | 7/1984 | Okamoto et al. | 29/598 |
| 4,502,213 | 3/1985 | Madden et al. | 29/730 |
| 4,503,602 | 3/1985 | Hillman | 29/599 |
| 4,531,284 | 7/1985 | Matsuura et al. | 29/784 |
| 4,554,731 | 11/1985 | Borden | 29/605 |
| 4,577,796 | 3/1986 | Powers et al. | 228/102 |
| 4,586,236 | 5/1986 | Jones | 29/564.5 |
| 4,597,172 | 7/1986 | Bourgeois | 29/736 |
| 4,608,752 | 9/1986 | Muller | 29/598 |
| 4,640,005 | 2/1987 | Mine et al. | 29/599 |
| 4,677,744 | 7/1987 | Muller | 29/729 |

FOREIGN PATENT DOCUMENTS

| | | | |
|---|---|---|---|
| 0235809 | 9/1987 | European Pat. Off. | 29/605 |
| 62-1208 | 1/1987 | Japan | 505/879 |

OTHER PUBLICATIONS

Taylor et al., "Design of Epoxy-Free Superconducting Dipole Magnets and Performance in Both Helium I and Pressurized Helium II", LBL-12455, IEEE Transaction on Magnetics, Sep. 1981.

Taylor et al., "High-Field Superconducting Accelerator Magnets", LBL-14400, May 1982.

*Primary Examiner*—Carl E. Hall

*Attorney, Agent, or Firm*—Michael G. Panian

[57] ABSTRACT

An automated facility for the large-scale production of superconducting magnets for use in a particle accelerator. Components of the automated facility include: a superconducting coil winding machine; a coil form and cure press apparatus; a coil collaring press; collar pack assembly apparatus; yoke half stacking apparatus; a cold mass assembly station; and a final assembly station. The facility can produce, on an economical manufacturing basis, magnets made of superconducting material for use in the ring of the particle accelerator. Each of the components is under the control of a programmable controller for operation having repeatable accuracy. All of the elements which are combined to form the superconducting magnet are thus manufactured with the dimensional precision required to produce a known, uniform magnetic field within the accelerator.

1 Claim, 83 Drawing Sheets

PROCESS FOR MAKING A SUPERCONDUCTING MAGNET FOR PARTICLE ACCELERATORS

This is a division of application Ser. No. 07/360,192 filed Jun. 1, 1989.

TECHNICAL FIELD

The invention relates to superconducting magnets for particle accelerators, and more particularly to a process and apparatus for making superconducting magnets for a particle accelerator.

BACKGROUND OF THE INVENTION

Recent development of superconducting magnets for particle accelerators has been undertaken, such as by the Fermi, Brookhaven, and Berkeley National Laboratories, and the Continuous Beam Acceleration Facility, with industry production expected in the near future. The magnets in a particle accelerator are used to generate a large magnetic field, on the order of about 1 to 12 Tesla (T) so as to cause a beam of charged particles to travel in a generally circular path. The results of the collision of these charged particles are then studied to further the knowledge and understanding of subatomic particles. It is expected that these devices will have a circumference of about 85 km (53 mi). An example of such a facility is the superconducting supercollider (SSC). Such a large facility would have to be constructed at a relatively high cost.

The use of coils manufactured from superconducting material for the magnet can help defray the cost, since this type of magnet can be made with a relatively small bore for a more compact configuration while still being able to generate the required magnetic field. It would be even more advantageous if components of the particle accelerator were made on a large scale manufacturing basis. The manufacture of superconducting magnets, however, present special difficulties. In the winding of the coils, for example, a high degree of dimensional accuracy is specified on each coil, which has a large aspect ratio (length-to-width) along the superconducting coil cross-section.

The superconductor coil is an elongated oblong shape and is comprised of multiple strands of wire, with a cross-sectional configuration approaching that of semicircle. During their construction the magnets are vulnerable to detrimental affects in the various handling, clamping, manipulating and transporting tasks performed during the construction of the coils and other components. Thus, extra precaution is required since even slight anomalies may cause the magnet to lose its superconducting properties. Moreover, the superconducting magnet is to be specially constructed to include passageways for coolant, such as helium or nitrogen, to maintain the magnet at the optimum temperature to enhance superconductivity.

There are many steps to be performed in the construction of a superconducting magnet for particle accelerators. Each of these requires precision operation, as well as careful handling. To date, superconducting magnets could not be made on a large-scale, production basis. Heretofore, the methods and procedures for building experimental magnets were not necessarily applicable to mass production. What is needed is a viable design for major manufacturing equipment, to cover practically all phases of construction of a superconducting magnet, for such a large scale production facility.

DISCLOSURE OF THE INVENTION

It is therefore an object of the present invention to provide automated manufacturing equipment for the manufacture of superconducting magnets for a particle accelerator.

It is another object of the present invention to provide an automated facility for the staqed implementation of procedures in the assembly of the magnets.

It is a further object of the present invention to provide automated manufacturing stations for the economical production of most of the components of the magnets for particle accelerators.

It is a still further object of the present invention to provide such a facility requiring the exercise of conventional operator skills.

The above objects are attained by the present invention, according to which, briefly stated, a method of assembling a superconductor magnet comprises the steps of first providing a cold mass assembly comprised of a collared superconducting coil subassembly rigidly secured within a shell assembly. A first generally cylindrical heat shield adapted to receive the cold mass assembly is provided, along with a second generally cylindrical heat shield which is adapted to receive the first heat shield therein. An elongated vacuum vessel is also provided for receiving the second heat shield. Finally the cold mass assembly is placed within the first heat shield, the first heat shield with cold mass assembly therein within the second heat shield, and the second heat shield with the first heat shield and cold mass assembly therein is placed within the vacuum vessel, whereby the superconducting magnet is finally assembled. In a preferred form, both the first and second heat shields include cooling tubes integral therewith for the passage of coolant therethrough so as to maintain the superconducting magnet at the optimum temperature to enhance superconductivity.

The step of providing a cold mass assembly comprises the steps of providing a pair of both inner and outer coil assemblies, the coil assemblies being generally arcuately-shaped, placing one of the outer coil assemblies within a generally C-shaped lower collaring member, placing one of the inner coil assemblies on top of the one of the outer coil assemblies, and placing an elongated tubular member within the inner coil assembly. The other of the inner coil assemblies is placed on top of the tubular member, and the other of the outer coil assemblies on top of the other inner coil assembly. A generally C-shaped upper collaring member is then positioned on top of the other outer coil assembly, and the upper and lower collaring assemblies are secured together so as to form a collared coil subassembly. A pair of elongated, generally U-shaped yoke halves are provided, each of the yoke halves having a pair of holes therein through the longitudinal length thereof. The collared coil subassembly is placed within one of the yoke halves, and the other of the yoke halves is placed around the collared coil subassembly such that the collared coil subassembly is essentially completely enclosed within the yoke halves. The collared coil subassembly having the half yoke assemblies thereon is positioned within a first arcuately-shaped half shell, and a second arcuately-shaped half shell is placed over the collared coil subassembly having the yoke half assemblies thereon. The second half shell is clamped in position with respect to the first half shell, and the first and second half shells secured along the longitudinal length thereof to form the cold mass assembly.

BRIEF DESCRIPTION OF THE DRAWINGS

Various other objects, features, and advantages of the invention will become more readily apparent by reading the following detailed description in conjunction with the drawings, which are shown by way of example only, wherein.

DESCRIPTION OF THE PREFERRED EMBODIMENTS

Figure 1:
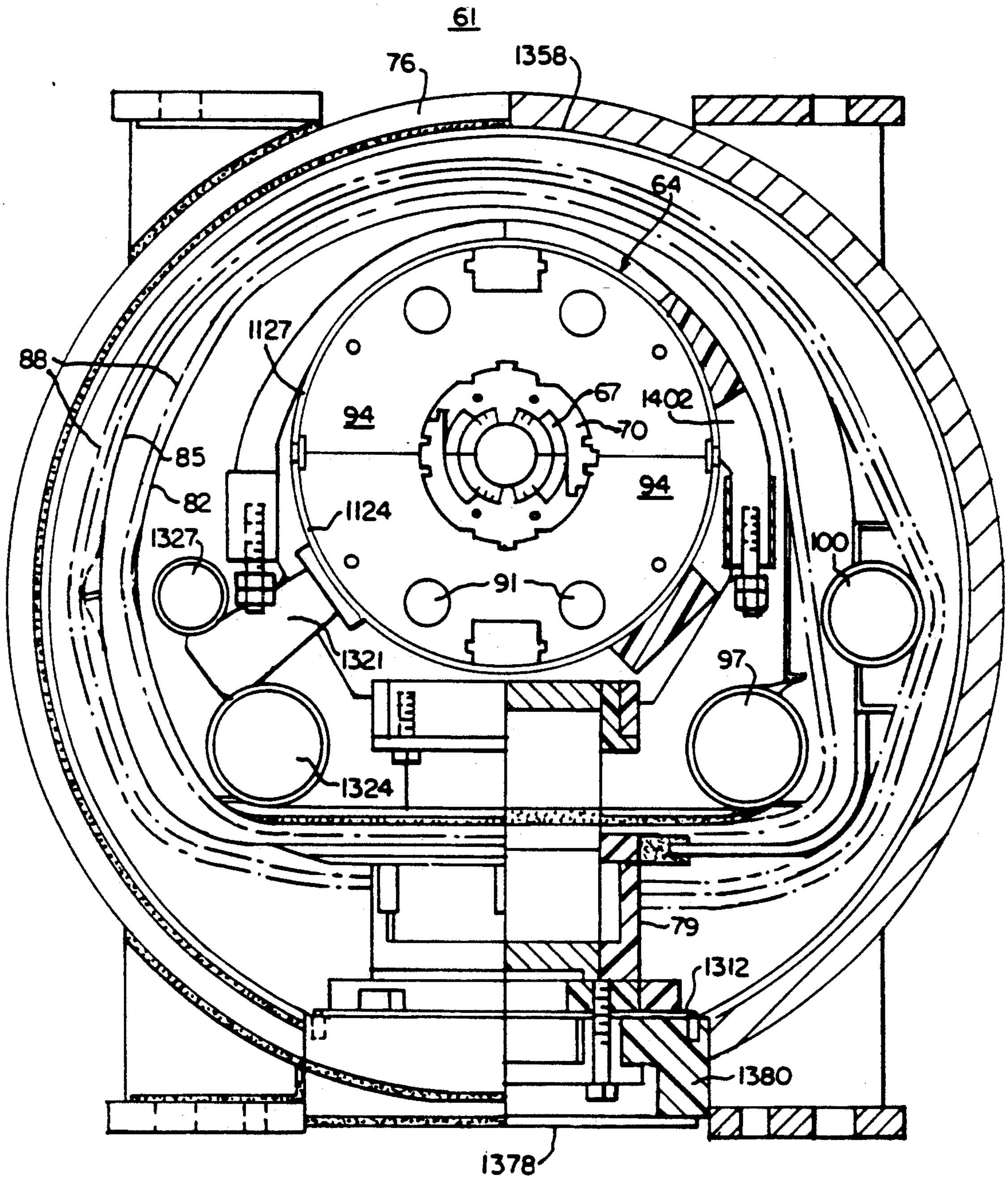
FIG. 1 is a cross-sectional view of a dipole magnet for a particle accelerator, such as the superconducting supercollider (SSC), after final assembly according to the present invention.

Referring now to the drawings in detail, FIG. 1 shows a cross-sectional view of a final assembly of a superconducting dipole magnet 61 for a particle accelerator, such as the superconducting supercollider (SSC). A cold mass assembly 64 containing coils 67 made of superconducting material are collared 70 around a tubular member 73, which assembly is received within a vacuum, or pressure, vessel 76. The cold mass 64 is supported within the vacuum vessel 76 by a plurality of re-entrant posts 79 disposed between the cold mass 64 and the vacuum vessel 76. Two (2) insulating shields 82,85, preferably made of aluminum, which have wrapped around them one or more layers of insulation blankets 88, are disposed between the cold mass 64 and the vacuum vessel 76. The internal shield is commonly referred to as a 20 K. shield 82 whereas the outer shield is referred to as an 80 K. shield 85 assembly, denoting the temperatures at which the interiors thereof are to be maintained. The cold mass 64 itself is to be maintained at a cryogenic temperature of about 4.3 K. (Kelvin) and is cooled by transfer of a coolant through coolant holes or tubes 91 in a yoke assembly 94 of the cold mass 64. Both the 20 K. 82 and 80 K. 85 heat shields also include coolant tubes 97,100 respectively, for the passage of coolant, typically helium and nitrogen, therethrough, in order to maintain the cold mass assembly 64 at the optimum temperature to enhance superconductivity. The cold mass assembly 64 comprises the main component for the superconducting dipole magnet 61 for the particle accelerator.

APPARATUS AND METHOD FOR MANUFACTURING A SUPERCONDUCTING COIL

Figure 2:
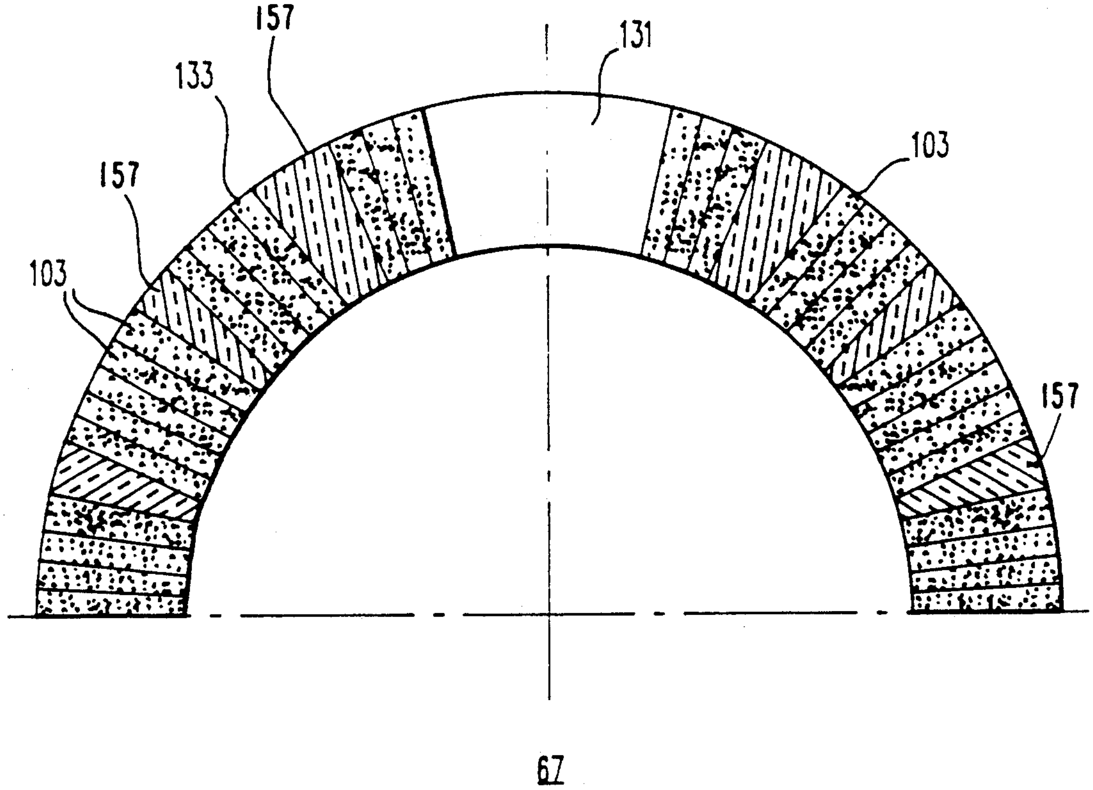
FIG. 2 is a view in cross section of a typical superconducting coil utilized in the magnet.
Figure 3A:
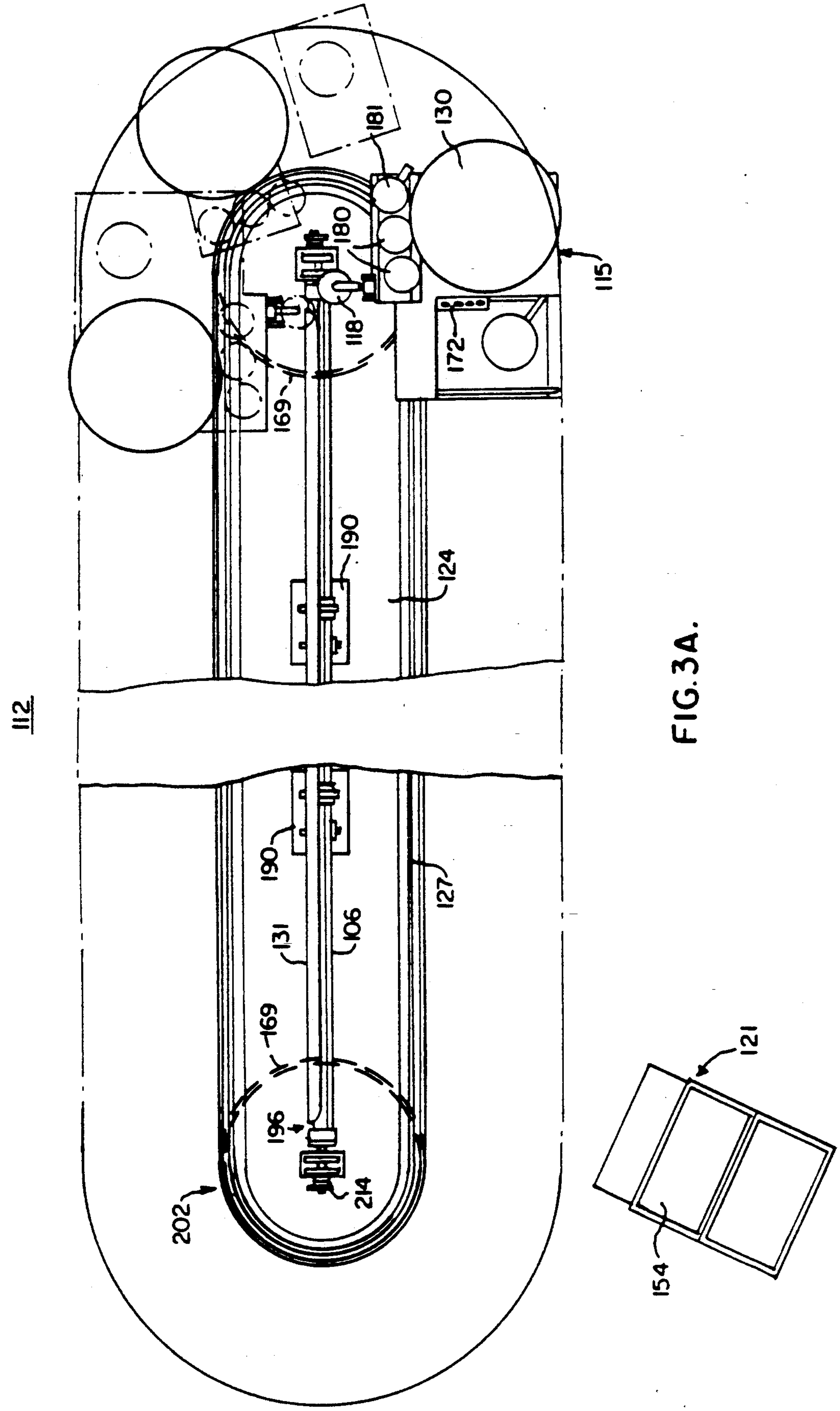
FIG. 3 is a top plan view of a coil winding machine of the present invention.
Figure 3B:
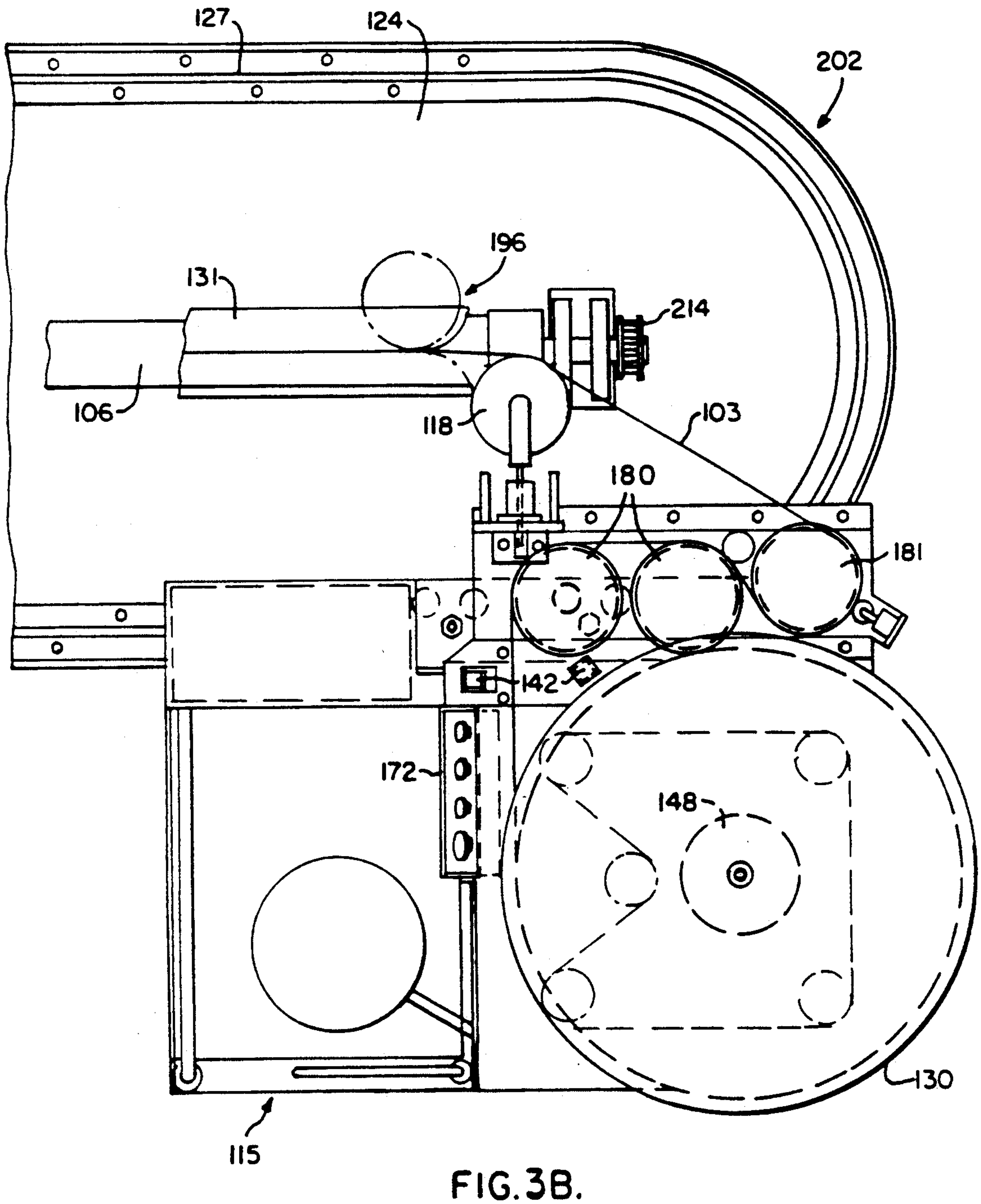
Figure 4:
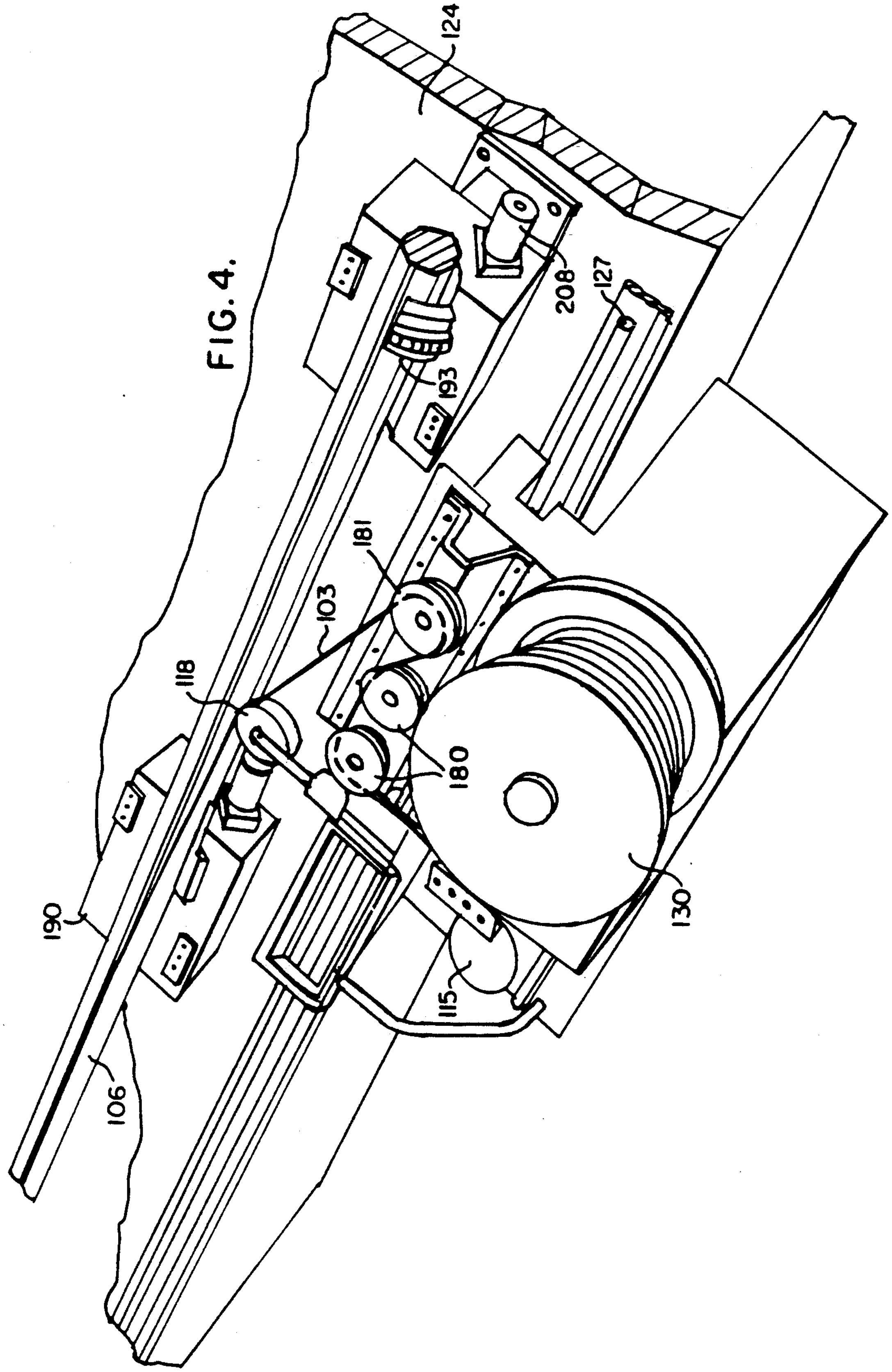
FIG. 4 is a partial perspective view of the coil winding machine.
Figure 5:
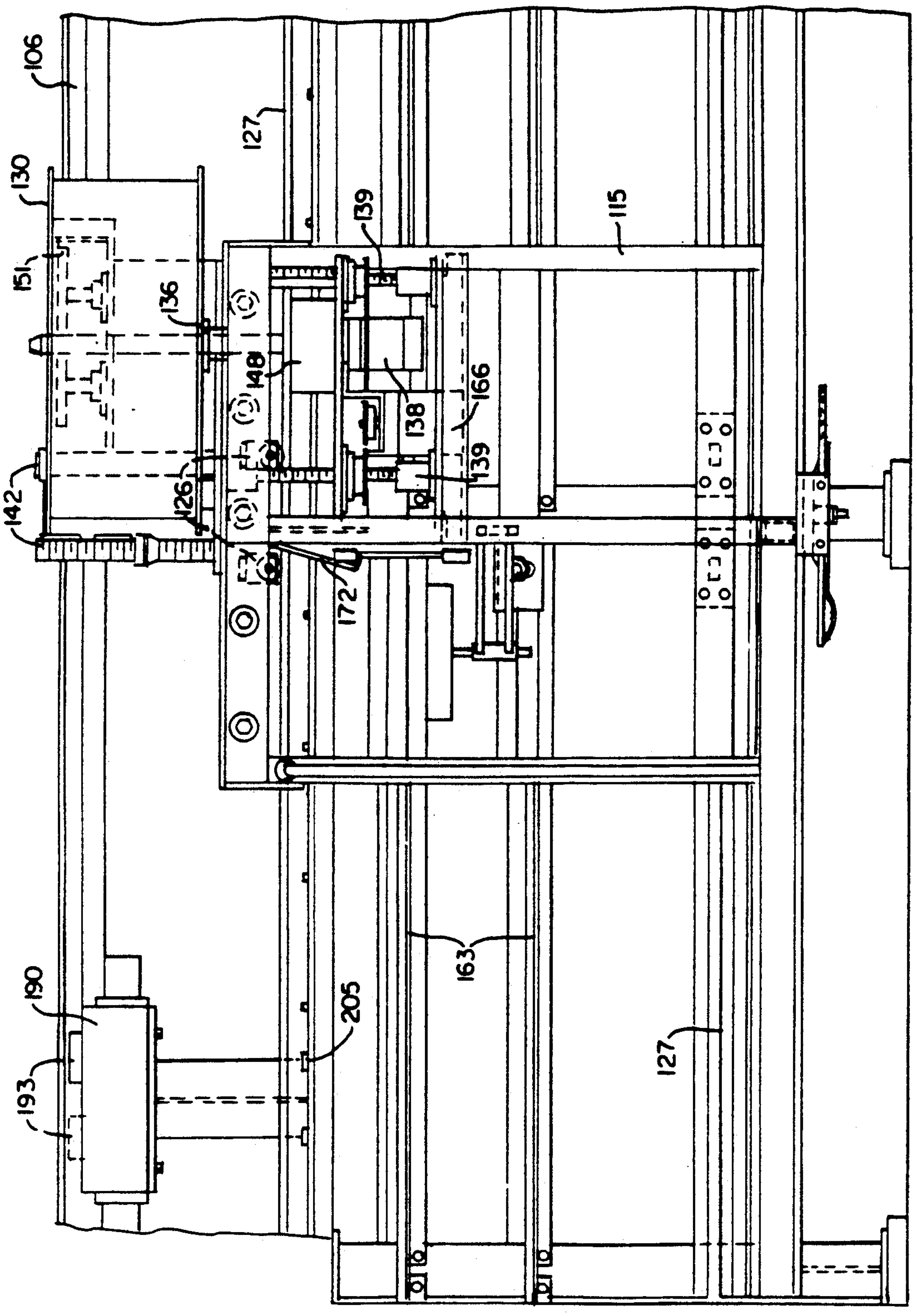
FIG. 5 is a right-side elevational view of the coil winding machine.
Figure 6:
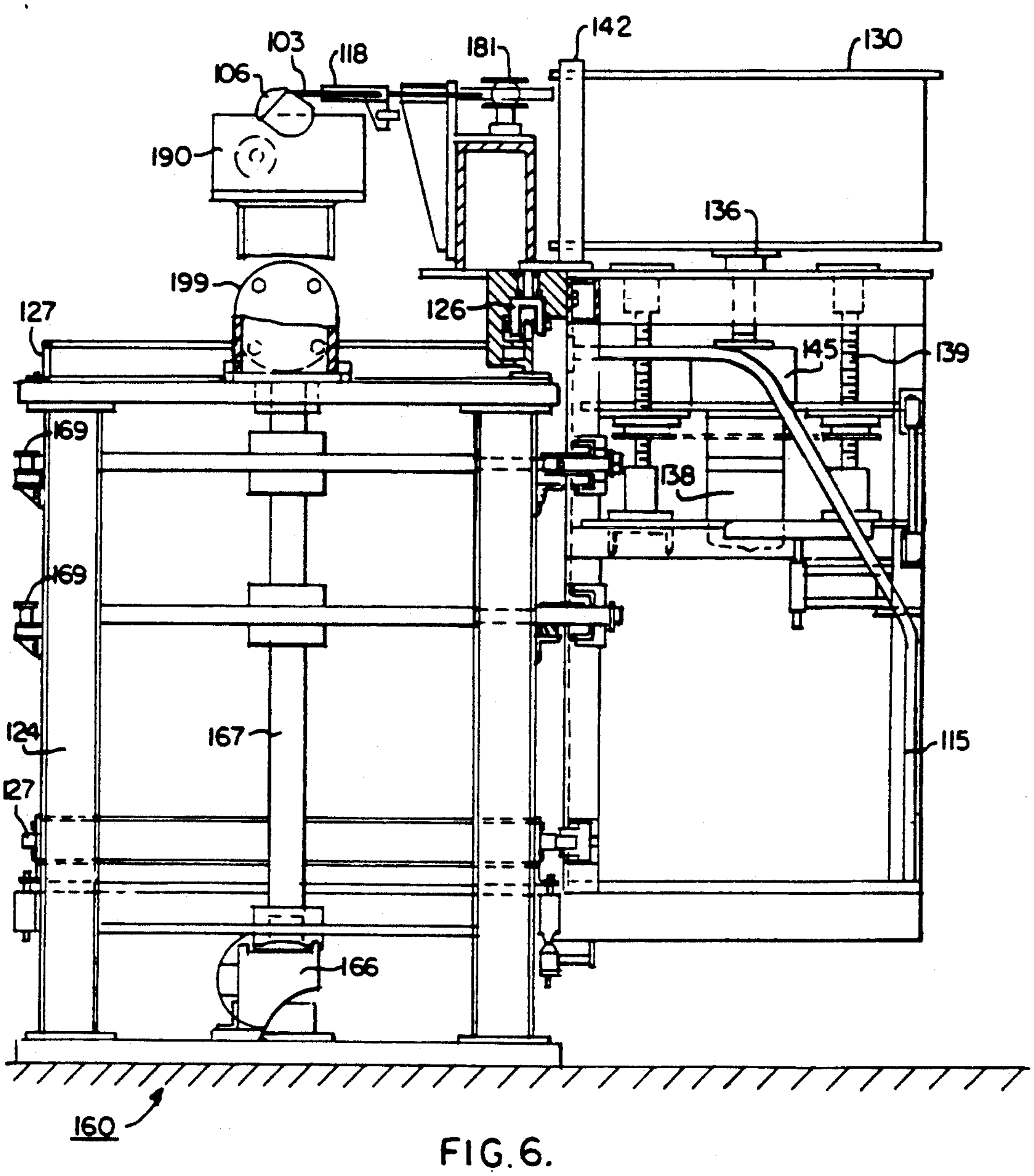
FIG. 6 is a cross-sectional view of the coil winding machine taken along the line VI—VI of FIG. 5.

For the particle accelerator, a typical coil 67 is made of either sixteen (16) turns (inner) or twenty (20) turns (outer) of wire 103 made of superconducting material wound around a winding mandrel 106. FIG. 2 is a cross-sectional view of an exemplary inner coil. In order to provide for the precise dimensional accuracy demanded for the magnetic field accuracy, at various points during the winding of the coil 67, shims 109 must be positioned between the individual turns of wire 103 made of superconductor material. A coil winding machine 112 of the present invention can provide, on a large scale manufacturing basis, coils 67 made of superconducting material for the economical production of magnets for the particle accelerator (see FIGS. 3–6).

SUPERCONDUCTING COIL WINDING MACHINE

The coil winding machine 112 has as its main elements the winding mandrel 106 having automatic clamping, an operator's workbench 115, guide roller 118, and an operator's control console 121. The winding mandrel 106 and the operator's workbench 115 are operably mounted on a machine base 124 such that the operator's workbench 115 rotates about the winding mandrel 106, via flanged guide wheels 126 riding along a guide rail 127 which is part of the machine base 124, so as to deliver superconducting wire 103, which is wound on a spool 130 which is placed on the operator's workbench 115, to the winding mandrel 106 for precise dimensional configuration of the coils 67. The winding mandrel 106 includes a centerpost 131 against which the coil 67 of superconducting material 103 is wound. This allows the elongated, oblong-shaped coil 67 to be formed on the winding mandrel 106, with the cross-sectional configuration shown in FIG. 2. This winding process will be more fully described hereinafter. The superconducting material which is wound onto the spool 130 typically comprises wire 103 having superconducting properties and a generally rectangular cross-section, which has helically wound around it a tape 133 having an epoxy material associated therewith. This tape 133 has an integral function in the coil curing process, which will be more fully described hereinafter. The superconducting cable 103 itself is slightly tapered in its cross-section, commonly referred to as a "keystoned cable" because of its shape, in order to facilitate winding.

Operator's Workbench

The spool 130 of superconductor material rests on an adjustable platform 136 which raises and lowers the spool 130 as the coil 67 is unwound in order to ensure that the coil wire 103 is de-reeled or payed off from the spool 130 on a plane parallel to the winding plane of the mandrel centerpost 131 and perpendicular to the center axis of the spool 130. Preferably, this is accomplished by raising and lowering the supply spool 130 by use of a DC motor 138 and ball screw 139 arrangement (see FIGS. 5–6). The operative signal to raise or lower the spool 130 is produced by two limit switches 142 which are activated by positive and negative wire 103 deflections from a predetermined payoff center line. Also, as part of the operator's workbench 115, controlling wire 103 payoff from the superconductor supply spool 130, is included a tensioning package 145 which allows bidirectional wire 103 payoff from the spool 130 at a constant preset tension. By keeping the wire 103 payoff parallel to the winding mandrel 106, no side or edge stress is produced on the wire 103 itself during the winding process.

This constant preset tension, preferably about 178N (40 lbs), is maintained on the wire 103 as it is unwound from the spool 130 and delivered to the mandrel 106. This is done by use of a hysteresis brake 148 as part of the spool 130 adjustable unwinding platform 136 of the operator's workbench 115. The hysteresis brake 148 system also includes a potentiometer follow arm 151. The hysteresis brake 148 is mounted concentrically to the spool 130, its current input controlled by the potentiometer follow arm 151, which constantly adjusts input as the diameter of the superconductor supply spool 130 decreases. This constant tension on the coil 67, as the wire 103 is wound onto the mandrel 106 against the centerpost 131, helps ensure that the coil 67 keeps to its desired shape and does not sag or otherwise lose its shape during the various manufacturing and manipulating tasks performed in the overall production of the superconducting coil 67.

The operator's workbench 115 rides along the guide rail 127 on the top of the machine base 124 and is automatically controlled by a programmable controller 154 as to its speed, direction, and stopping locations (where shims 109 and wedges 157, to be described, are to be installed). Preferably, the speed and location of the operator's workbench 115 is controlled by a DC servo system 160 as part of a chain drive mechanism 163. The chain drive mechanism 163 is operated by a drive motor 166, shaft 167 and sprockets 169 (see FIG. 6). The DC servo system 160 used to drive the operator's workbench 115 is under the direct control of the programmable controller 154, to ensure that proper coil winding is performed. The workbench 115 itself contains a control panel 172 so that an operator (not shown) at all times may directly control the operation of the winding machine 112 should such control be necessary. These control procedures may include the stopping of the operator's workbench 115 at certain points so that shims 109 or wedges 157 can be installed on the coil 67 for dimensional accuracy. The operator's workbench 115 includes all the mechanisms required to ensure that superconductor material 103 is properly delivered to the winding mandrel 106 to satisfy the precise dimensional requirements of the coil 67 for the superconducting magnet 61.

Figure 10:
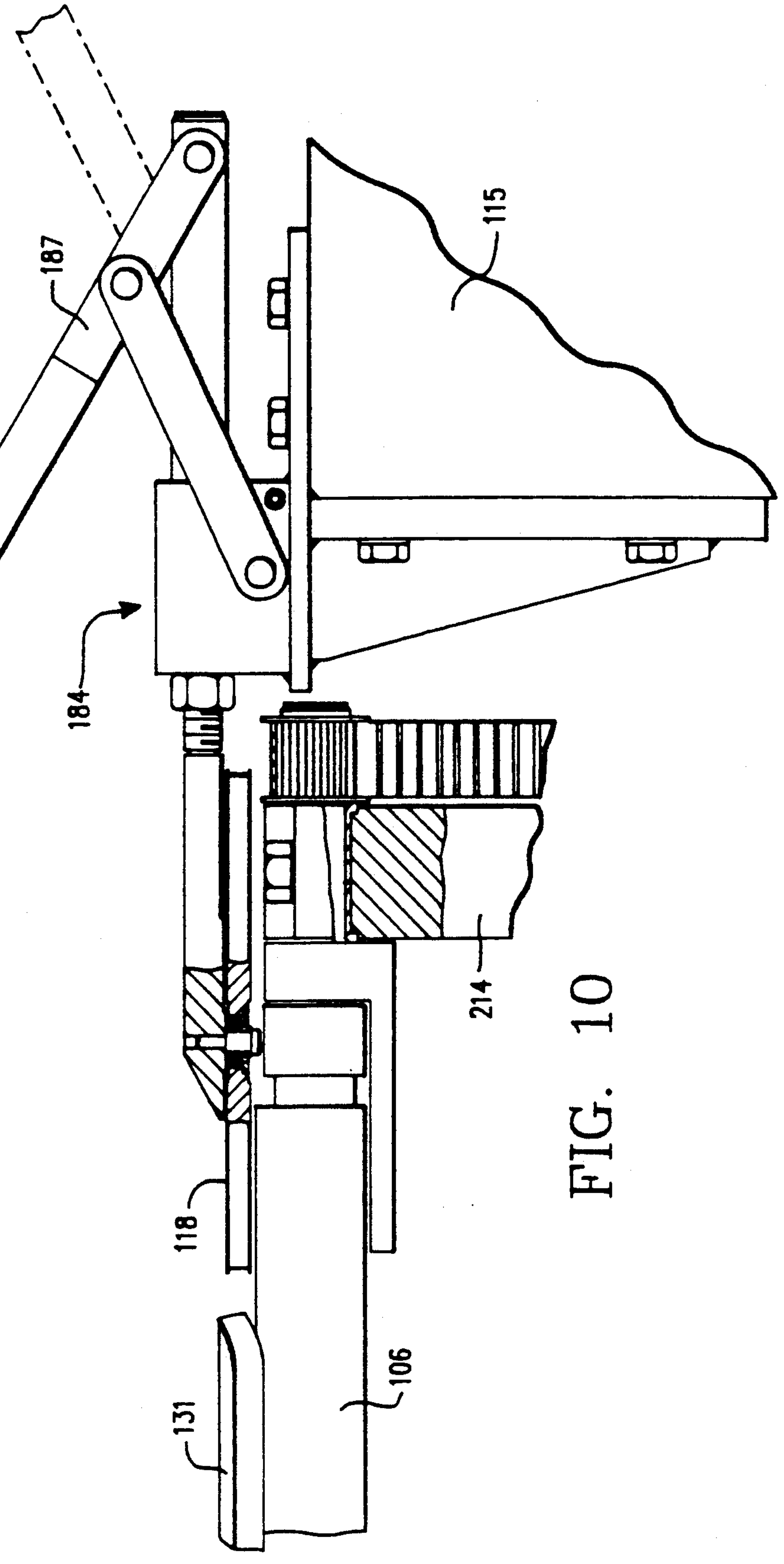
FIG. 10 is a representation of the guide roller layout for delivering wire made of superconducting material to the winding mandrel.

As the wire 103 is de-reeled from the spool 130, it passes through the two limit switches 142, preferably a photoelectric sensing device, which is operably connected to the DC motor 138 ball screw 139 arrangement for raising and lowering the supply spool 130. The wire 103 is then passed around a series of pulleys, preferably two idler pulleys 180 and a fleet angle adjustment pulley 181, to help maintain tension on the wire 103. The superconducting wire 103 is then looped around the guide roller 118 which delivers the wire 103 directly to the centerpost 131 on the winding mandrel 106, without angular deviation. The guide roller 118 (FIG. 10) maintains the superconducting cable 103 at the correct relationship with the mandrel centerpost 131 to ensure that no side or edge stresses are imparted on the wire 103 as it is delivered to the winding mandrel 106. The guide roller 118 is pivotally mounted 184 with respect to the operator's workbench 115 so that, at points where wedges 157 are to be installed, the guide roller 118 can be retracted so as to relieve the tension on the superconducting cable 103. After an appropriate wedge 157 is installed on the coil 67, the operator actuates a clamp 187 on the guide roller 118 which pushes the superconductor cable 103 forward to the mandrel centerpost 131 so that coil winding can begin again.

Winding Mandrel

Figure 7:
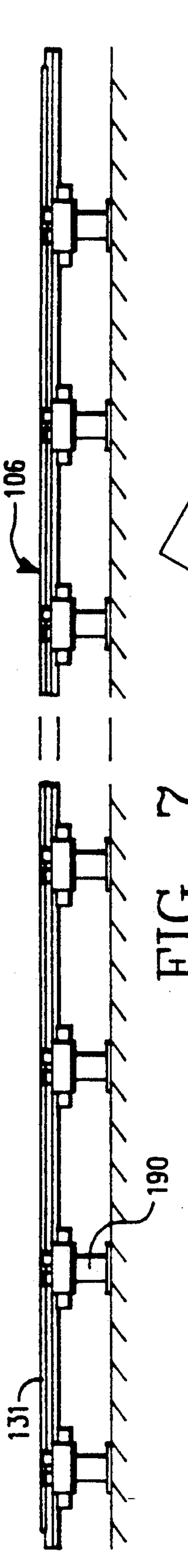
FIGS. 7 and 8 are detailed views of a winding mandrel used in the winding machine.
Figure 8B:
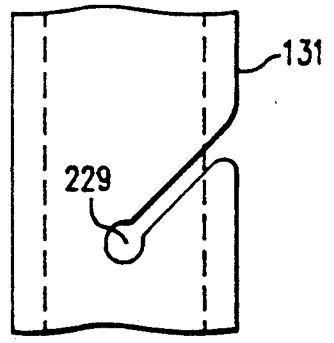
Figure 8A:
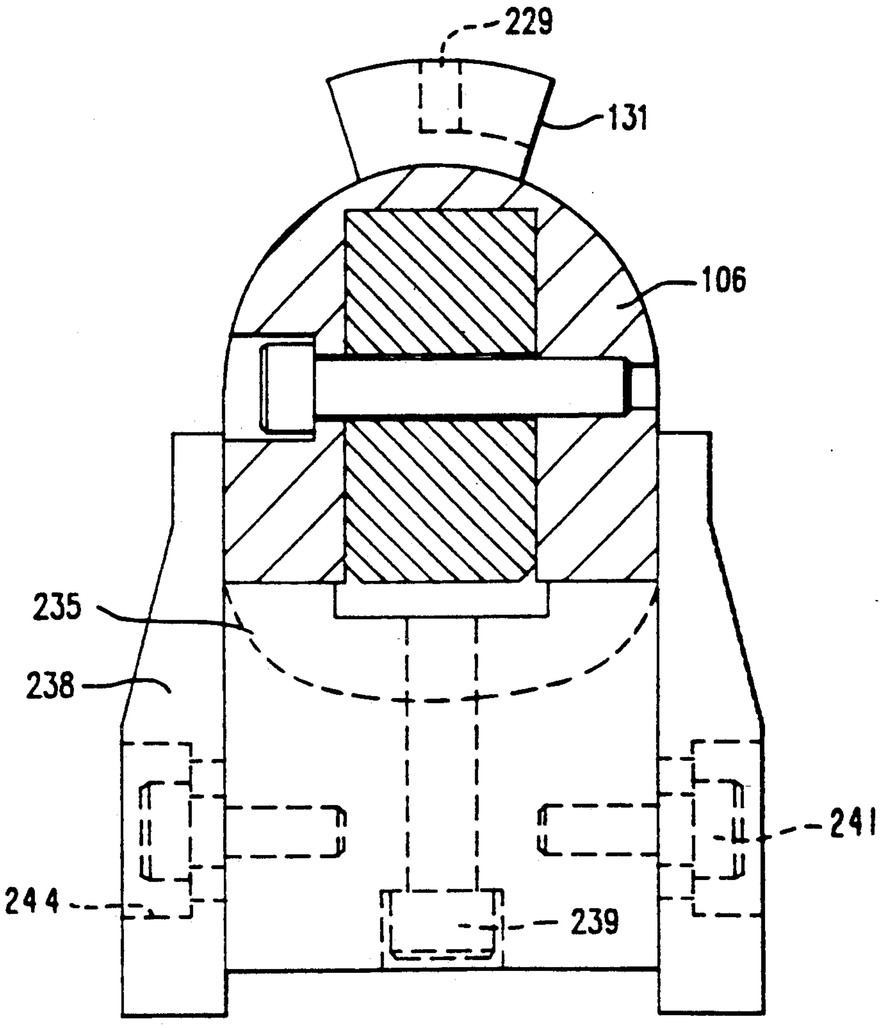

The winding mandrel 106, shown in FIGS. 7–8, is supported above the machine base 124, preferably in ten locations equally divided along the length of the winding mandrel 106, by support saddles 190. These saddles 190 include radial clamps 193 which hold the superconductor wire 103 against the centerpost 131 on the winding mandrel 106. Also, at either end 196 of the winding mandrel 106 are rotational drive motors 199 for rotation of the mandrel 106 as the operator's work station 115 is rotated about circular ends 202 of the machine base 124.

Figure 9A:
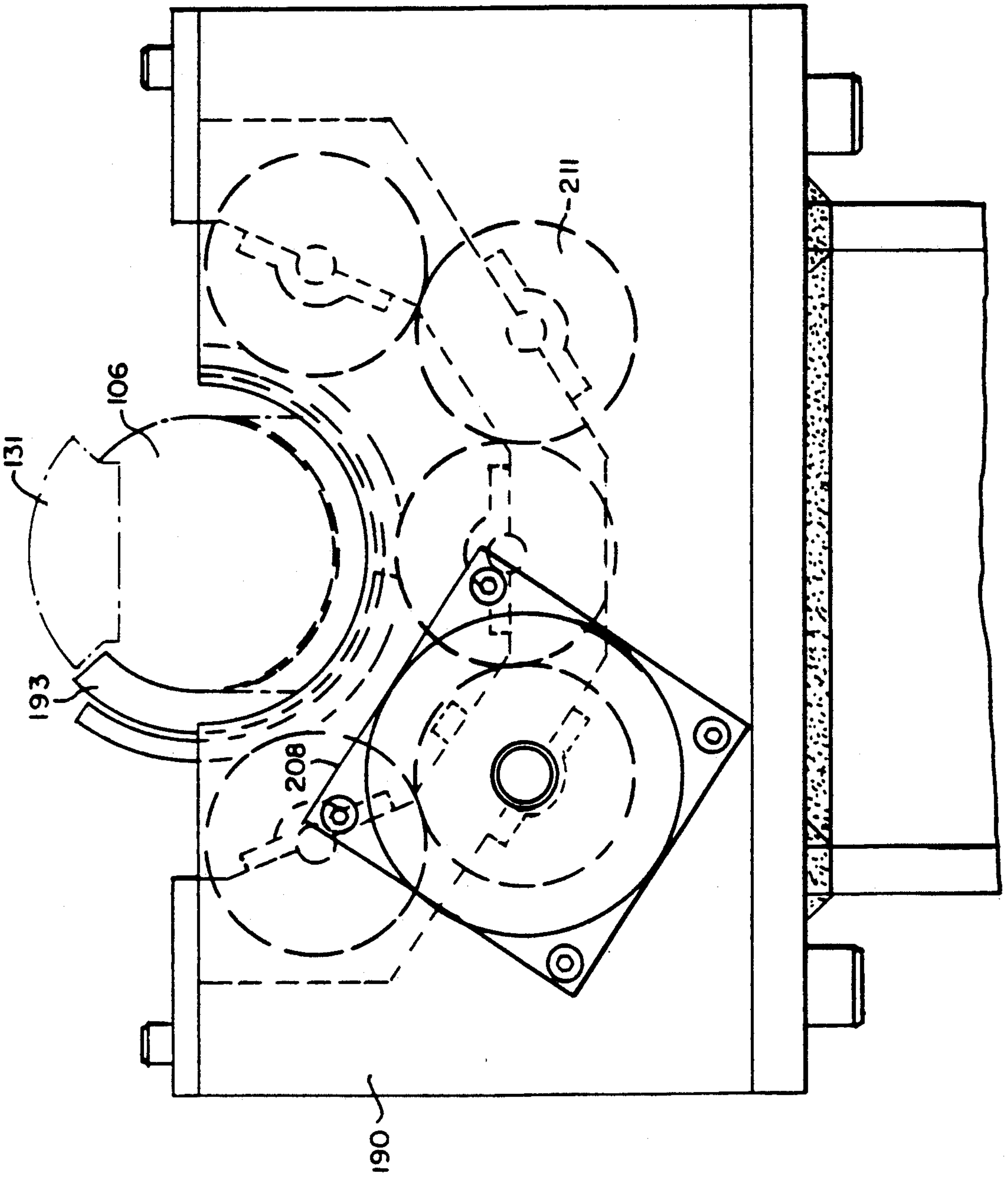
FIG. 9 is a detailed view of a winding mandrel clamp of the present invention.
Figure 9B:
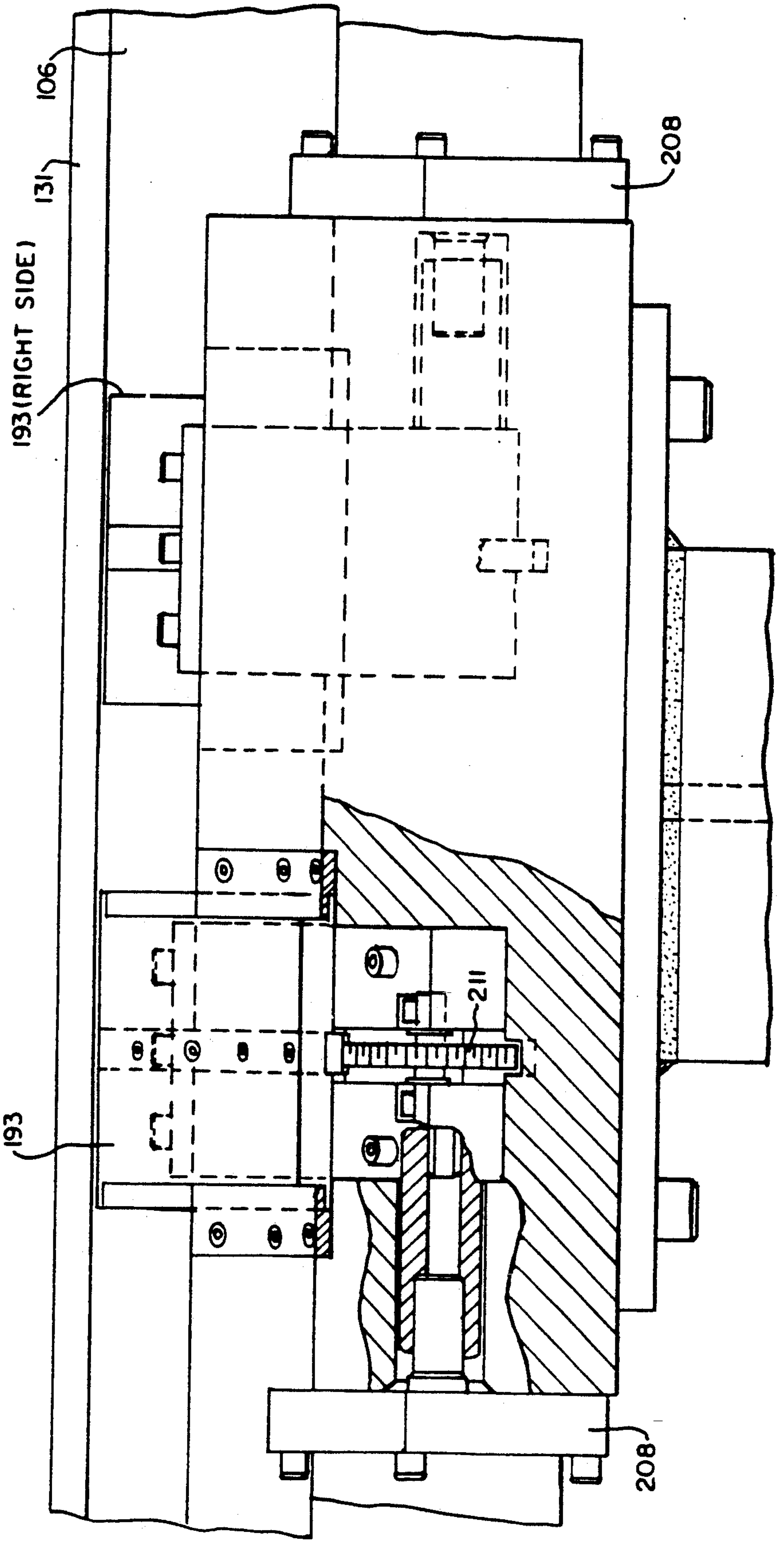

In order to keep the superconducting material from sagging from the winding mandrel 106 as the wire 103 is wound thereon, the series of radial clamps 193 (FIG. 9) are attached to the machine base 124 and are associated with the winding mandrel 106. These clamps 193 are preferably pneumatically operated and are controlled by proximity sensors 205 along the guide rail 127 which interrelate with the operator's workbench 115 as it is guided along the machine base 124. Each support saddle 190 includes two such clamps 193, one for either side of the winding mandrel 106. These clamps 193 are driven by a pneumatically controlled rotary actuator 208, through a series of spur gears and a gear rack 211 (see FIG. 9A). After the first winding pass of the operator's workbench 115, the clamps 193 are constantly in contact with the superconductor wire 103, except at that point of winding in front of the workbench 115. As the operator's workbench 115 approaches the location of the clamp 193, activation of the proximity switch 205 in turn activates the rotary actuator 208, causing the radial clamp 193 to be rotated open in order to allow the superconducting material to be delivered to the winding mandrel 106. When the workbench 115 contacts the proximity sensors 205 on the guide rail 127, the coil winding clamps 193 are rotated 45° from the vertical so that the wire 103 can be delivered to the centerpost 131 on the winding mandrel 106. As the workbench 115 passes over the proximity sensor 205 and past the area of the clamps 193, the proximity sensor 205 is deactivated, the winding clamp 193 thus rotating back the 45° to the vertical to secure the superconducting wire 103 against the mandrel centerpost 131. These support saddles 190 and clamps 193 are provided at approximately 0.91 m (3 ft) intervals along the mandrel 106 to ensure adequate clamping of the coil 67 thereto. Preferably, only one (1) clamp 193 at a time is opened during the winding operation and all clamps 193 are engaged during end turn winding.

In order to keep the delivery of the wire 103 to the mandrel 106 on a plane perpendicular to the mandrel 106, the coil winding machine 112 includes a mandrel rotation control package 214 for indexing the winding mandrel 106 as the superconducting wire 103 is wound thereon. This indexing is done through small DC servo motors 199 under direct control of the programmable controller 154. This servo-driven control package 214 includes drivers and absolute positioning encoders at each end 196 of the mandrel 106 to reduce any twisting effect of the mandrel 106 and to ensure proper indexing. Rotation of the mandrel 106 occurs as the operator workbench 115 rotates around the circular ends 202 of the machine base 124. The rotation of the mandrel 106 is directly related to the rotational motion of the workbench 115, and hence the superconductor wire 103, around the ends 202 of the machine base 124, as well as the turn number of the coil 67 which is being wound. This ensures that coil end turns 217 remain perpendicular to the centerpost 131 on the winding mandrel 106. As wire 103 is wound onto the centerpost 131, the winding mandrel 106 is rotated to maintain this orientation.

Figure 11B:
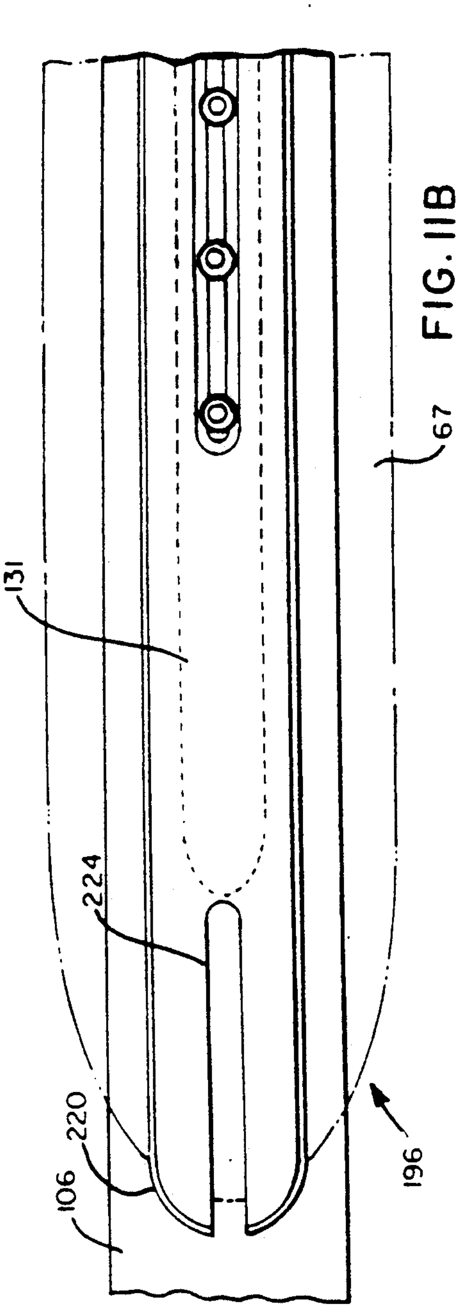
FIG. 11 is a detailed view of a coil end clamp design.
Figure 11A:
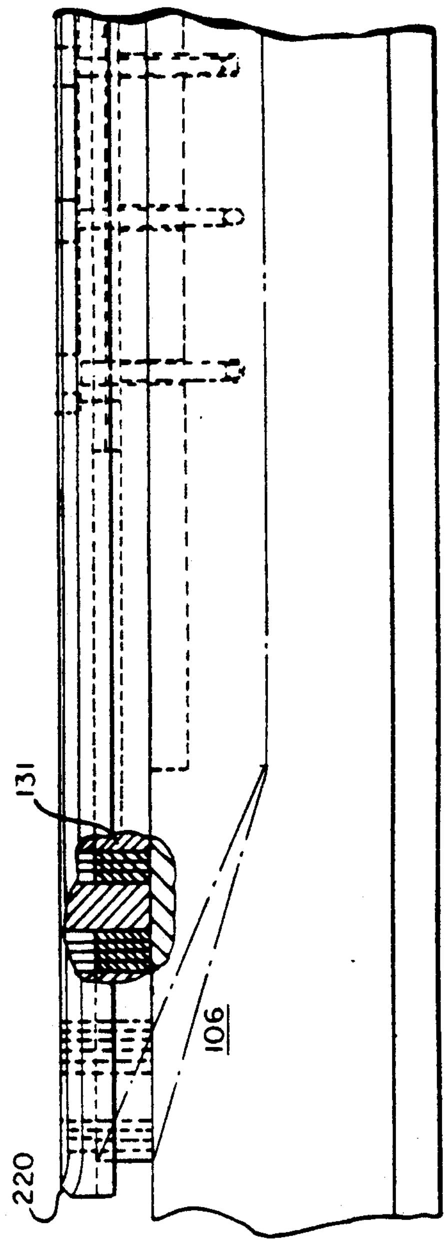
Figure 11D:
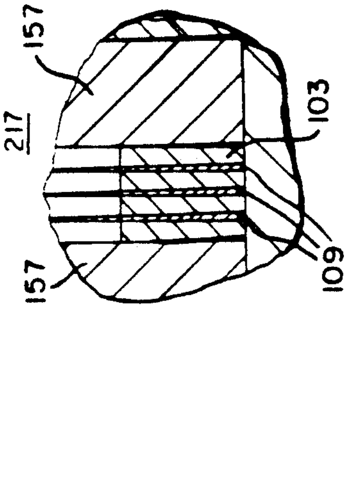
Figure 11C:
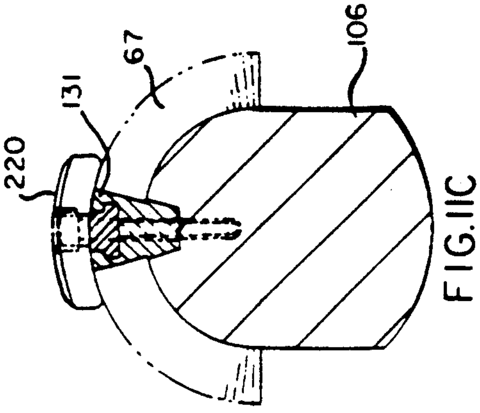
Figure 12:
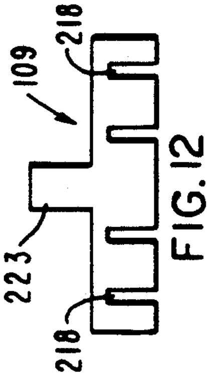
FIG. 12 is a detailed view of an inverted wedge shim used in the coil construction.

When the operator's workbench 115 reaches one end 196 of the winding mandrel 106, the workbench 115 begins to rotate around the circular machine end 202. As the workbench 115 rotates to the opposite side of the table 124, the mandrel 106 begins to rotate in the opposite direction with respect to the workbench 115 travel, which allows the superconductor wire 103 to form to the end 196 compound radius of the mandrel centerpost 131 tangent at the winding mandrel 106 center line, until the workbench 115 is traveling in the opposite direction along the straight portion of the machine base 124. As shown in detail in FIG. 3B, as the workbench 115 rotates about the circular end 202 of the machine base 124, the mandrel 106 is correspondingly rotated in the opposite direction. This helps ensure that the wire 103 is delivered to the mandrel centerpost 131 in the desired orientation. FIG. 11 shows detailed views of the superconductor coil 67 at the mandrel end 196. The enlarged view of FIG. 11B shows the windings of the coil 67 and the positioning of shims 109 and wedges 157. FIG. 12 is a detailed view of an inverted wedge shim 109 used at the end 217 of the coil 67. The shim 109 includes slots 218 to facilitate its being bent around the coil end turn 217.

On the mandrel end 196 a coil end turn hold-down clamp 220 is utilized to hold the ends 217 of the coil 67 against the winding mandrel 106 and the centerpost 131. Although this clamp 220 is adjustable, it preferably is held in a fixed position as the coil 67 is wound on the mandrel 106. As the coil 67 is wound, it is placed under the hold-down clamp 220 as the workbench 115 rotates around the machine end 202 and as the mandrel 106 rotates in the opposite direction. The inverted shim 109 assures that the cable 103 is perpendicular to the winding mandrel 106 at the end turn 217 positions. The inverted shims 109 include alignment tabs 223 which are used during the installing period and may be removed after the coil 67 is cured. The alignment tabs 223 are received in slot 224 in the end turn hold-down clamp 220.

Winding Machine Control System

The coil winding machine programmable controller 154 comprises a collection of functionally independent and semi-independent control packages. The packages include: spool payoff tensioning package; spool payoff height package; mandrel rotation package; and workbench driver package. The winding machine 112 is under the overall control of the programmable controller 154. This programmable controller 154 preferably controls all machine sequencing, and in the case of the mandrel 106 and workbench 115 rotation, the required synchronization for proper winding.

The tensioning package allows bi-directional wire 103 payoff at the constant preset tension. This package need not tie in with any other control package.

The function of the spool payoff height package is to keep the coil wire 103 de-reeling from the supply spool 130 parallel with the winding plane and perpendicular to the spool 130 axis. This is accomplished by the raising and lowering of the supply spool 130 using the DC motor 138 and ball screw 139. The signal to raise or lower the spool 130 is produced by the two limit switches 142 by positive and negative wire 103 deflections from a predetermine payoff centerline, monitored by the photoelectric sensor 178. This package can work independently (i.e., with its own logic) of the other two winding machine control packages.

The mandrel rotation control package is responsible for indexing the winding mandrel 106 to allow the coil 67 to be wound perpendicular and tangent to the winding mandrel's rotational axis and parallel with the centerpost 131. The indexing is done through the small DC servo system 214 under the direct control of the programmable controller 154. The servo system 214 includes drivers and absolute position encoders at each end 196 of the mandrel 106 to reduce the twisting effect of the mandrel 106 and to insure proper indexing.

The workbench 115 driver package controls the speed, direction, and stopping of the operator's workbench 115. Because the speed and location of the workbench 115 are critical, the DC servo system 160 is utilized. This system 160 is also under the direct control of the winding machine programmable controller 154, which adjusts the winding mandrel's degree of rotation for each turn wound.

The winding machine 112 includes the main operator console 121 that is physically separate from the winding machine base 124. The console 121 contains the programmable controller 154 along with the various control relays, power conditioning equipment, machine status displays, and machine sequencing switches.

Sequence of Winding Operations

After a fully loaded spool 130 of superconductor material is loaded onto the operator's workbench 115, the wire 103 is laced through the idler pulleys 180, the fleet angle adjustment pulley 181 and the guide roller 118. A roll pin (not shown) is attached to the wire end which is then secured in an opening 229 in the mandrel centerpost 131 (see FIG. 8B). When the wire 103 is thus secured, the coil winding procedure can begin. The operator activates power to the workbench 115 via the control panel 172 mounted on the workbench 115. As the drive motor 166 is activated to drive the sprockets 169, the chain 163 which is secured to the workbench 115 pulls the workbench 115 around the machine base 124 along the guide rail 127. The winding speed can be varied between an inching mode during the end turns 196, 202, up to approximately 18.29 km (60 ft) per minute along the straight sections. As the wire 103 is unwound from the spool 130, it passes through the two through-beam photoelectric sensors 178 which are operably connected with the motor controller and ball screw arrangement 139 that raises or lowers the conductor spool 130 to keep the wire 103 perpendicular to the vertical axis of the spool 130 as it is de-reeled therefrom. At the same time the tension on the wire 103 is monitored by the hysteresis brake 148 system and potentiometer follow arm 151. The brake 148 is constantly adjusted as the diameter of the superconductor supply spool 130 decreases. The operator continues to travel with the workbench 115 along the length of the mandrel 106, feeding the conductor cable 103 in a vertical position.

At predetermined locations, which can either be controlled by the operator on the workbench 115 or automatically programmed into the automatic controller 154, the workbench 115 is stopped so that shims 109 and/or wedges 157 can be positioned on the mandrel 106. These shims 109 are generally made of a material which is of a fiberglass-type referred to as G-10CR. Preferably, the wedges 157 are made of copper with the same cross-section as the superconducting cable 103, and are wrapped or insulated with kapton and B-stage epoxy tape. These materials spread out the turns of the coil 67 so that the correct magnetic field can be produced when the coil 67 is incorporated into the superconducting dipole magnet 61 for the particle accelerator.

While the wire 103 is wound onto the mandrel 106, it is automatically clamped in place against the centerpost 131 by the right- and left-hand radial clamps 193. Before the first winding pass of the workbench 115, all clamps 193 are rotated or positioned 45° from the vertical during the first winding pass. After the first winding pass, these clamps 193 are always in contact with the superconductor wire 103 except at those points in front of the workbench 115. As the workbench 115 moves along the guide rail 127, the clamps 193 are activated to clamp and unclamp by the proximity sensors 205 positioned along the winding machine base 124. As the workbench 115 travels along the guide rail 127, it passes over the proximity sensor 205 which activates its respective clamp 193. The workbench 115 is designed such that the leading edge of the workbench 115 will activate the sensor 205 prior to the guide roller 118, and hence the superconductor wire 103, approaching the clamp 193 area. The clamps 193 are released to rotate back to the start position (i.e. 45° from the vertical) to allow the operator to wind the superconducting wire 103 onto the centerpost 131 of the winding mandrel 106. As the workbench 115 continues to pass by the proximity sensor 205, preferably one sensor 205 per clamp 193, the proximity sensor 205 is deactivated such that the winding clamp 193 rotates forward to the vertical and contacts the superconducting wire 103, capturing it against the winding mandrel 106 at the centerpost 131.

Near the ends 196 of the mandrel 106, the workbench 115 rotates around the circular end 202 of the winding machine base 124. As it does so, the mandrel 106 begins to rotate in the opposite direction with respect to the workbench travel until the workbench 115 reaches the opposite side of the base 124. When the workbench 115 again reaches a straight portion of the winding machine base 124, the mandrel 106 rotation stops in order to ensure that the wire 103 is always perpendicular to the plane of the winding mandrel 106 and parallel with the surface of the centerpost 131. Also, at the end turn 217 positions, the inverted shim 109 can be added during the turn. The shims 109, like the wedges 157, provide the specific, precise geometry necessary for the coil 67 so as to produce the desired magnetic field. In this manner, the workbench 115 continuously rotates about the mandrel 106 on the winding machine base 124 along the guide rail 127, stopping at specified points so that the wedges 157 and shims 109 can be installed.

Where wedges 157 are to be installed, after the workbench 115 is stopped the operator from the control panel 172 deactivates the clamp 187 on the guide roller 118 which releases the tension on the superconductor wire 103 so that the wedge 157 can be installed. When this has been completed, the guide roller 118 is then reclamped in position so as to deliver the wire 103 to the centerpost 131 on the winding mandrel 106.

Figure 13:
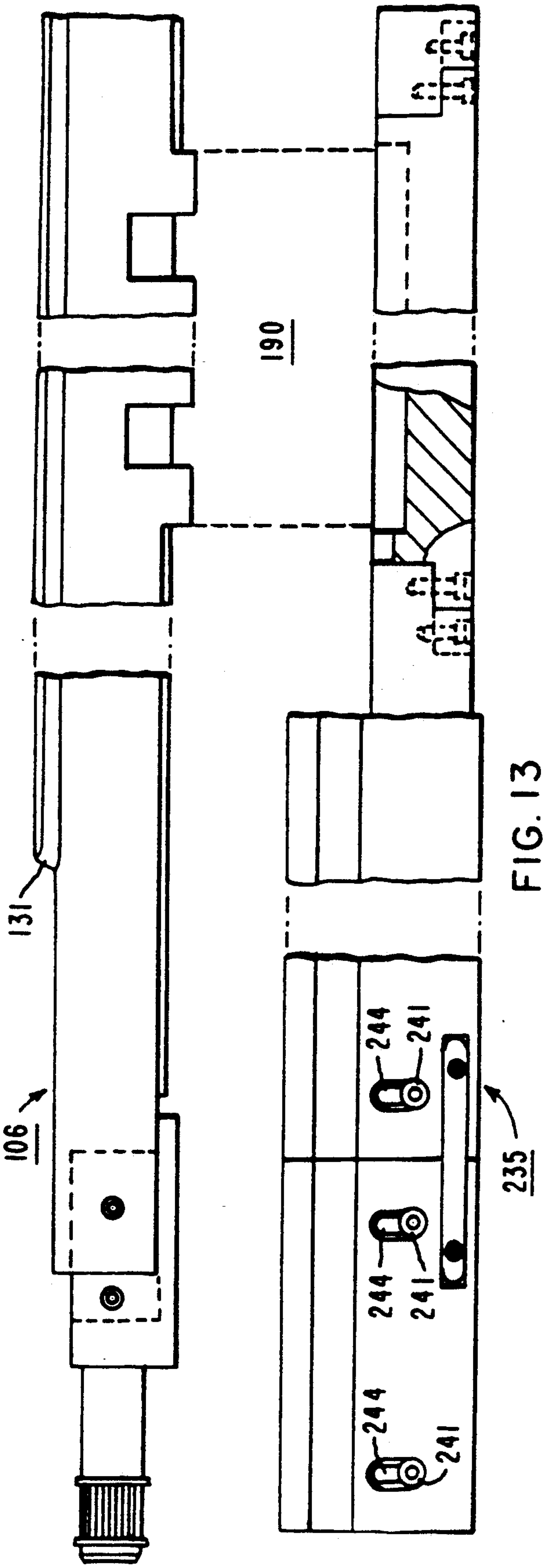
FIG. 13 is a partial view of the winding mandrel and the coil pressing bar.
Figure 14A:
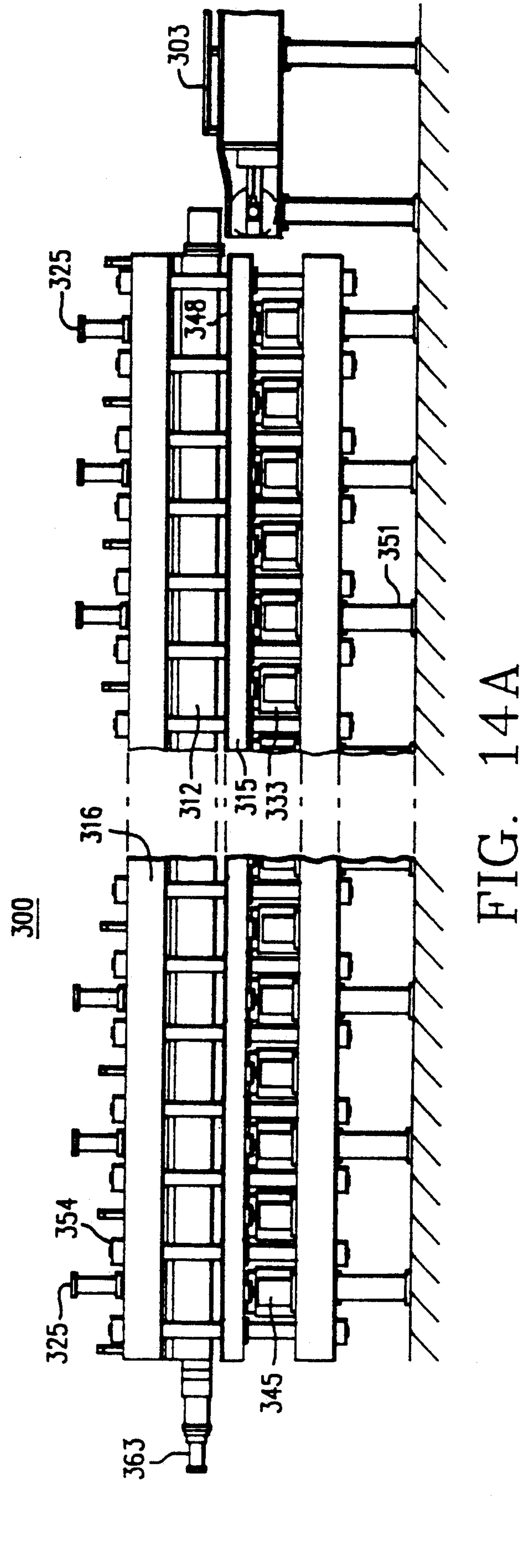
FIG. 14 is a side elevational view of a form and cure press apparatus used in the manufacture of superconducting coils of the present invention.
Figure 14B:
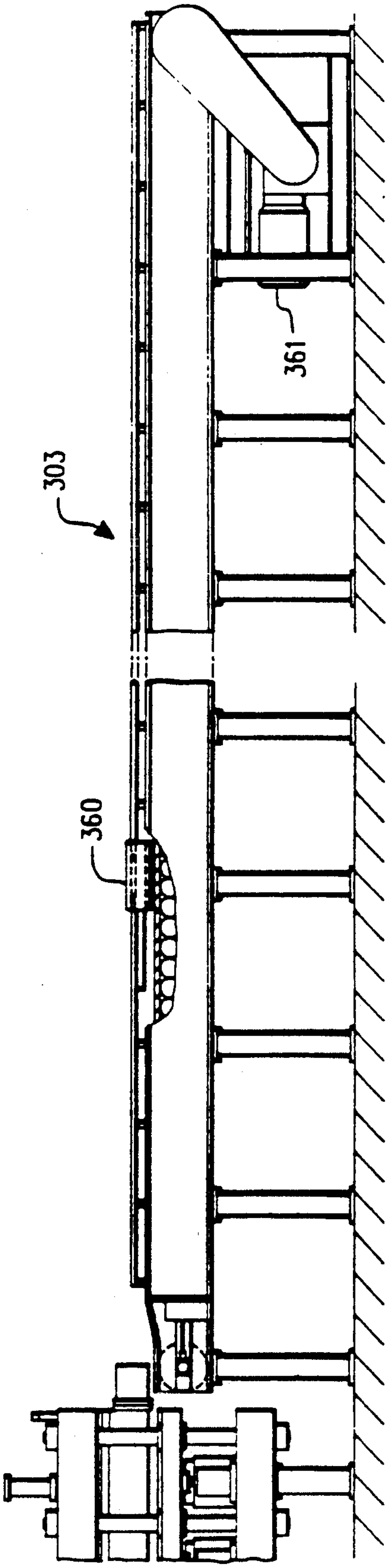

The above operations are performed until a full coil 67 is wound, which is typically after sixteen (16) complete turns for an inner coil (FIG. 2), and twenty (20) for an outer coil. When either coil 67 is complete, the operator manually cuts the superconductor wire 103 and securely attaches it to the wound coil 67, and releases the clamp 187 on the guide roller 118. At this point, a coil pressing bar 235 having vertical side rails 238 (FIG. 13) is installed under the mandrel 106, and secured thereto by bolts 239, so as to secure the coil 67 against the centerpost 131 on the winding mandrel 106 for transporting to a coil cure and press apparatus 300 (see FIG. 14). The coil pressing bar 235 has side rails 238 which eliminate the possibility of the coil 67 sagging during transfer to the cure and press apparatus 300, and also aids in the pressing and curing process. The side rails 238 are adjustable by way of screws 241 sliding in slots 244, to facilitate placement of the winding/curing mandrel 106 in the coil pressing bar 235. When the coil pressing bar 235 is in place, the clamps 193 are deactivated since the side rails 238 of the coil pressing bar 235 will maintain the coil 67 in the prescribed geometry against the mandrel centerpost 131.

FORM AND CURE PRESS APPARATUS

Figure 15A:
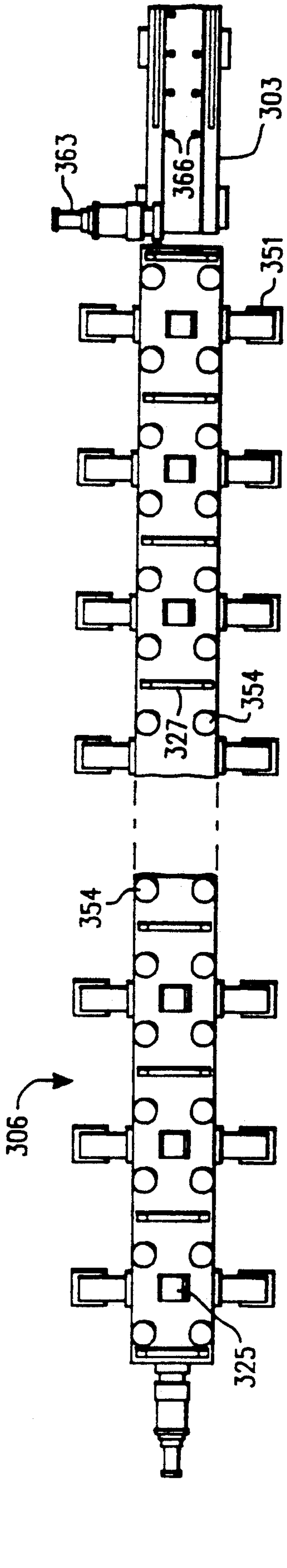
FIG. 15 is an overall plan view of the cure press of FIG. 14.
Figure 15B:
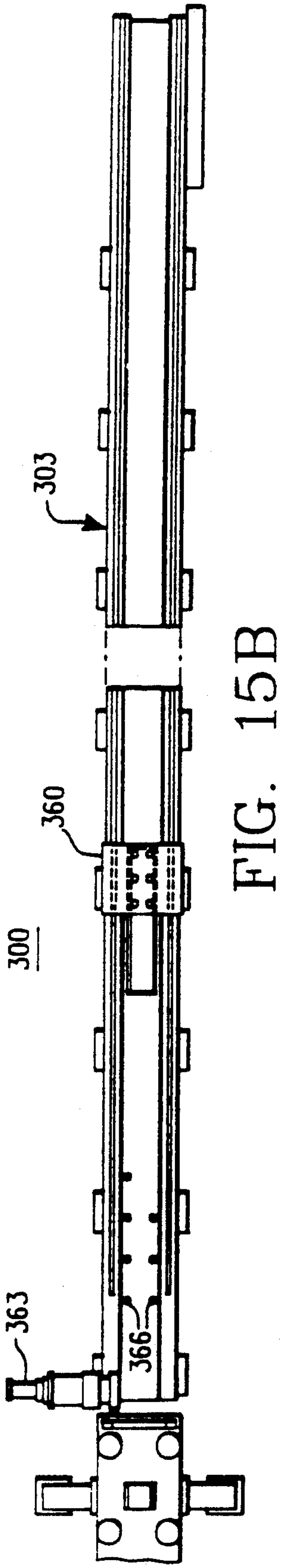

The form and cure press apparatus 300 (FIGS. 14–16) is used to form the coil 67 into a precise, fixed shape after winding has been completed. The main elements of the form and cure press apparatus 300 are a conveyor 303 and a cure, or mold, press 306. The conveyor 303 is used to deliver and initially align the mandrel 106 and superconducting coil 67 wound thereon with the cure press 306. The mold press 306 comprises the necessary mold form and heating elements, which are preferably under the control of a microprocessor-based controller (not shown), for the precise dimensional forming of the coil 67 for the superconducting magnet 61.

The cure press 306 comprises an upper platen cure mold 312 and a lower pressing plate, or bolster platen, 316. The upper platen 312 is supported by a press top plate 316 and includes a cavity, or mold, 318 therein, on its underside, which is formed to the desired shape of the finished coil 67. The upper platen 312 also includes passageways 321 (see FIG. 21) for the flow therethrough of a heating fluid for the curing of the epoxy tape 133 on the coil 67, as will described hereinafter. The heating fluid is delivered to the upper platen 312 by hoses 322. The upper platen 312 includes alignment shafts 324 operated by pneumatic cylinders 325 for aligning the winding mandrel 106 with respect to the cavity or curing mold 318 in the upper platen 312. After curing, these cylinders 325 can assist in the releasing of the coil 67 and winding mandrel 106 from the mold 318.

Figure 21:
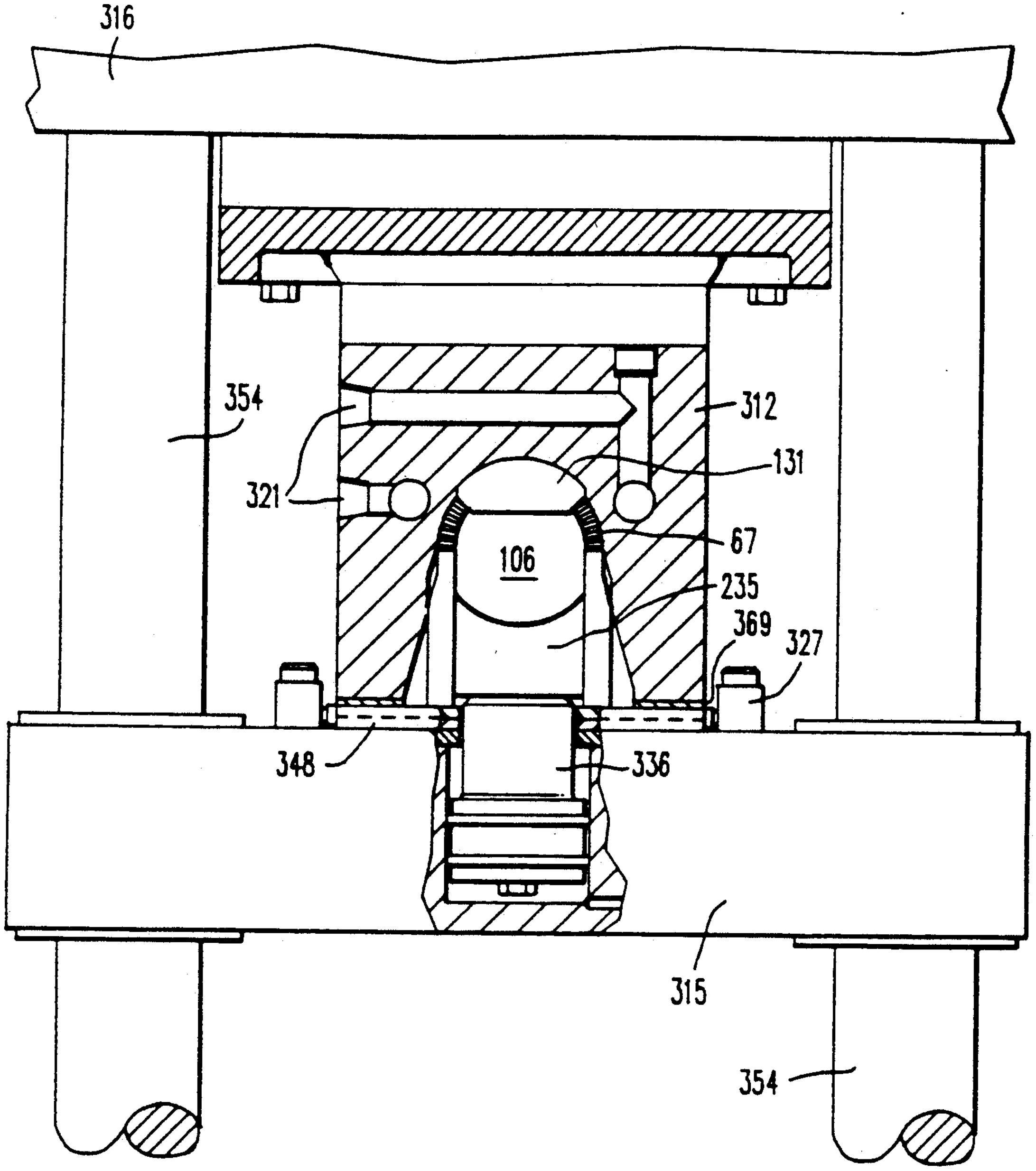
FIG. 21 is a detailed view taken along the line XXI—XXI of FIG. 14B.
Figure 22:
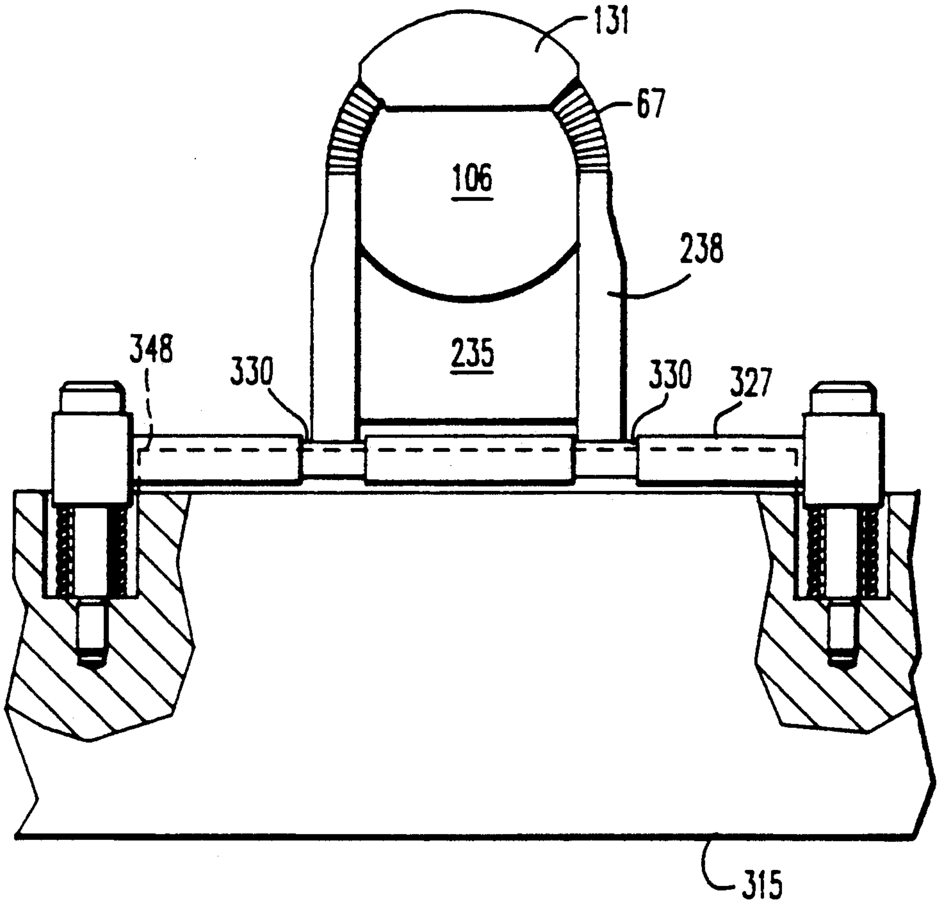
FIG. 22 is a detailed view of a load roller used in loading the mandrel into the cure press.

The lower bolster platen 315 has a plurality of spring-loaded load rollers 327 for receiving the pressing bar 235 and guiding the winding mandrel 106 and coil 67 thereon into the cure press 306. The load rollers 327 include grooves 330, which receive the side rails 238 of the coil pressing bar 235, to aid in this alignment (see FIG. 22). Located under the bolster platen 315 is a series of single acting hydraulic cylinders 333 for applying the necessary force to the coil 67 during the curing process (see FIG. 16). Small hydraulic pistons 336, disposed within the bolster platen 315, are used to initially seat the coil 67 and winding mandrel 106 into the upper platen 312 curing mold 318 (FIG. 21). The single acting hydraulic cylinders 333 are utilized to place the desired preload on the coil 67 during pressing. The hydraulic cylinders 333 are fluidly connected by a supply manifold 339 which is connected to a hydraulic fluid supply 341 by hoses 342. A secondary set of double acting hydraulic cylinders 345 are used to actively lower the bolster platen 315 when curing of the coil 67 is completed (see FIG. 17). The press 306 also includes a coil pressing plate 348 made of hardened steel, positioned between the bolster platen 315 and the pressing bar 235. The coil pressing plate 348 includes spaces or indentations for the load rollers 327.

Figure 16:
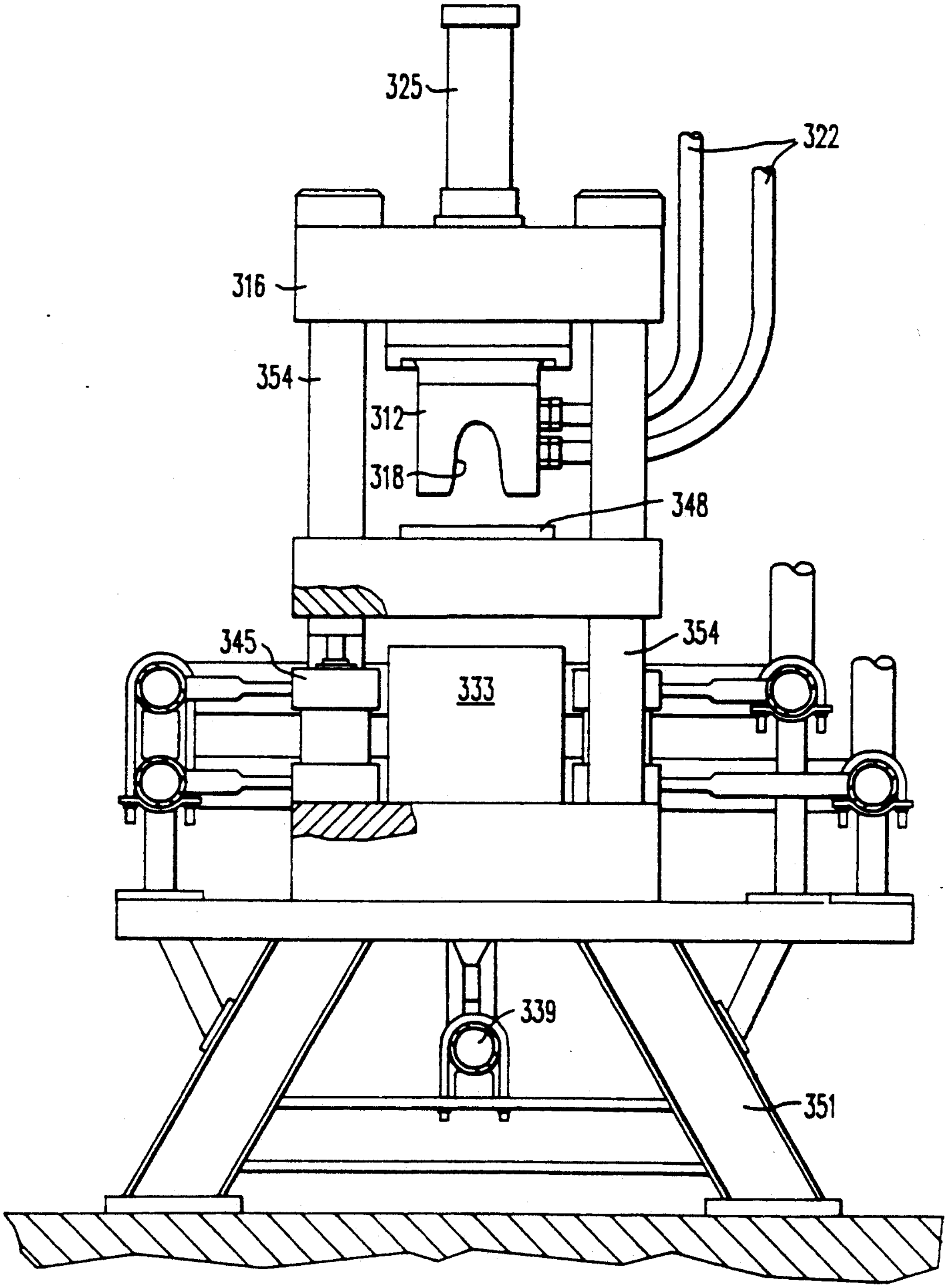
FIG. 16 is a cross-sectional view of the cure press shown in its open position.
Figure 17:
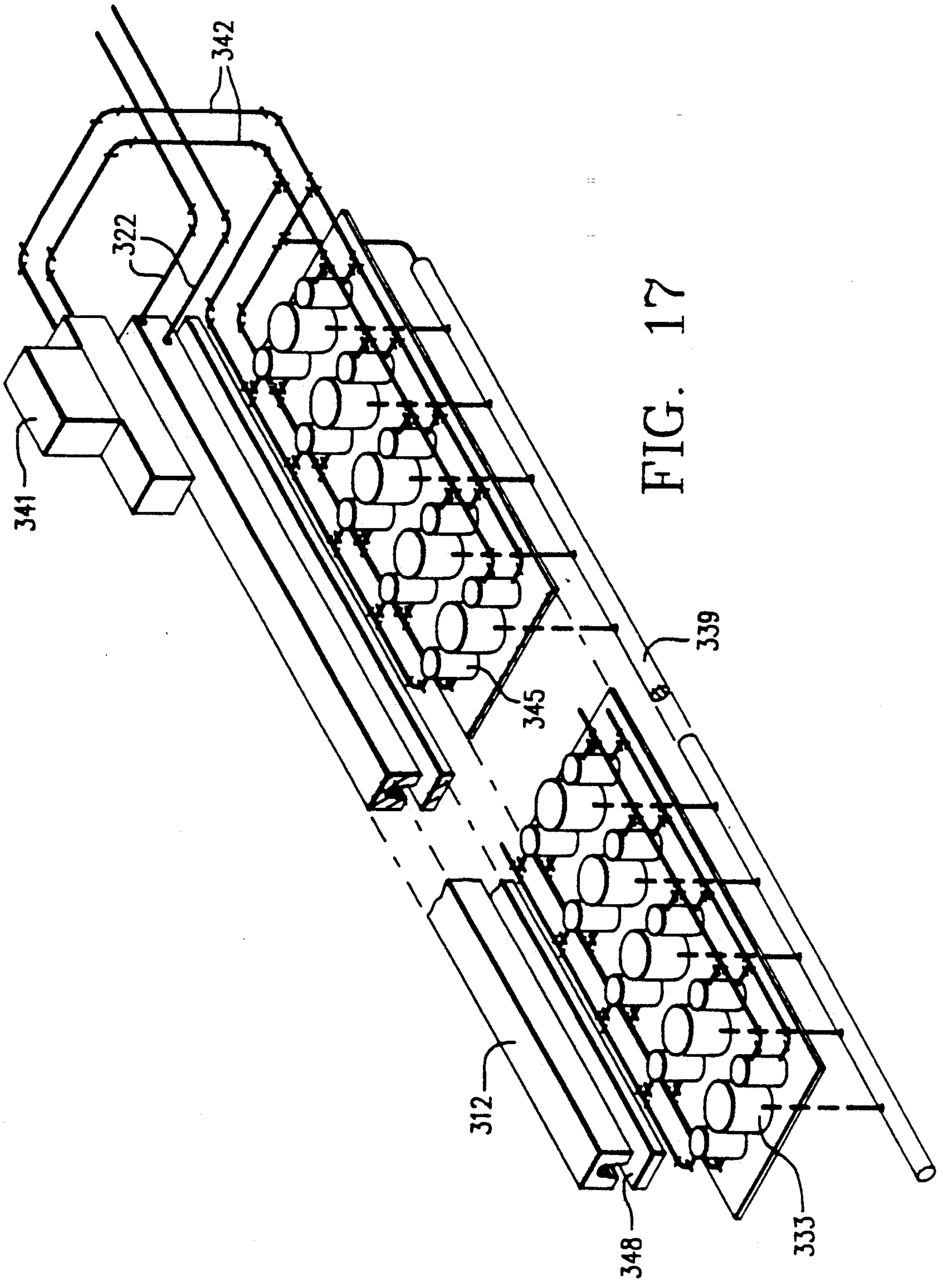
FIG. 17 is a schematic view of the form and cure press piping system of the present invention.

As shown in FIG. 16, the cure press 306 is installed on a machine base, or support stand, 351. Positioned between the press top plate 316 and the bolster platen 315 are a plurality of press guide rods 354 for guiding the bolster platen 315 as it is raised to press the coil 67 in the upper platen 312 curing mold 318. Preferably, the guide rods 354 also act as a support and are secured between the support stand 351 and the press top plate 316.

Form and Cure Press Control System

The form and cure press apparatus 300 is also under the control of a programmable controller. An operator's console (not shown) is also provided. Heat transfer, hydraulic, and pneumatic control units interact with the controller for overall press control. The programmable controller handles the press 306 sequencing and monitors the status of all subsystems. If necessary, manual control is also provided. The operator's console is the main control area for press 306 operation. The console contains the programmable controller along with the various relays, power conditioning, press status displays and sequencing switches. The console may also contain a temperature logging system for monitoring and recording the output of multiple temperature detectors (not shown) within each of the press platens 312, 315. The heat transfer control unit is physically part of the heat transfer system and contains the equipment necessary to heat, cool, and circulate the upper press platen's transfer oil. The control unit is self-contained and handles the continuous operation of the heat transfer system. Temperature regulation is provided by a standard temperature controller and a resistive temperature detector (RTD) (not shown) measuring the heating oil return temperature.

The hydraulic control unit 341 is part of the hydraulic system and manages the system to provide the high pressures needed to form the coil 67. The unit 341 contains the pump controls and solenoid valves necessary to operate the press cylinders 333. The programmable controller monitors the status of this unit 341 and provides high level control signals. The pneumatic system control preferably comprises a four way, double acting solenoid valve which is sequenced by the programmable controller. The pneumatic pressure is provided by a shop air connection well known in the art.

The cure press control system will include all the interlocks required to prevent the initiation of the next sequence step, unless the completion of the previous step is proven and verified. These interlocks are fully operational in the manual mode, as well as the automatic mode.

Form and Cure Press Operation

The operating sequence of the superconducting coil form and cure press apparatus 300 can now be described in detail.

After the pressing bar 235 has been installed on the winding mandrel 106 to press the coil 67 against the centerpost 131, they are lifted by a strongback lifting apparatus (not shown) and transferred to the conveyor 303 situated near the press 306. When the mandrel 106 is loaded on the conveyor 303, it is securely attached to a loading carriage 360 with two quick disconnect pins (not shown). Temperature sensing thermocouples (not shown) are inserted into the winding mandrel 106 and secured.

The loading carriage 360 is activated by a drive mechanism 361 to push the mandrel 106 forward on the conveyor 303 to the cure press 306. An end pressing cylinder 363 of the cure press 306 is rotated 90° to the preload/unload position and secured in place. As the mandrel 106 approaches the cure press 306, it encounters a series of guide rollers 366 on the conveyor 303. The guide rollers 366 initially align the winding mandrel 106 with respect to the cure press 306. As the mandrel !06 enters the press 306, it comes in contact with the series of spring-loaded load rollers 327 (see FIG. 22). The load rollers 327 support and guide the winding mandrel 106, keeping the coil 67 and mandrel 106 aligned with the curing mold 318. The conveyor 303 continues to advance forward until the winding mandrel 106 is fully loaded in the press 306, at which point the two quick disconnect pins are disconnected and the load carriage 360 is withdrawn by reversing the conveyor 303. The end pressing cylinder 363 is then rotated back 90° to the press position.

Figure 18:
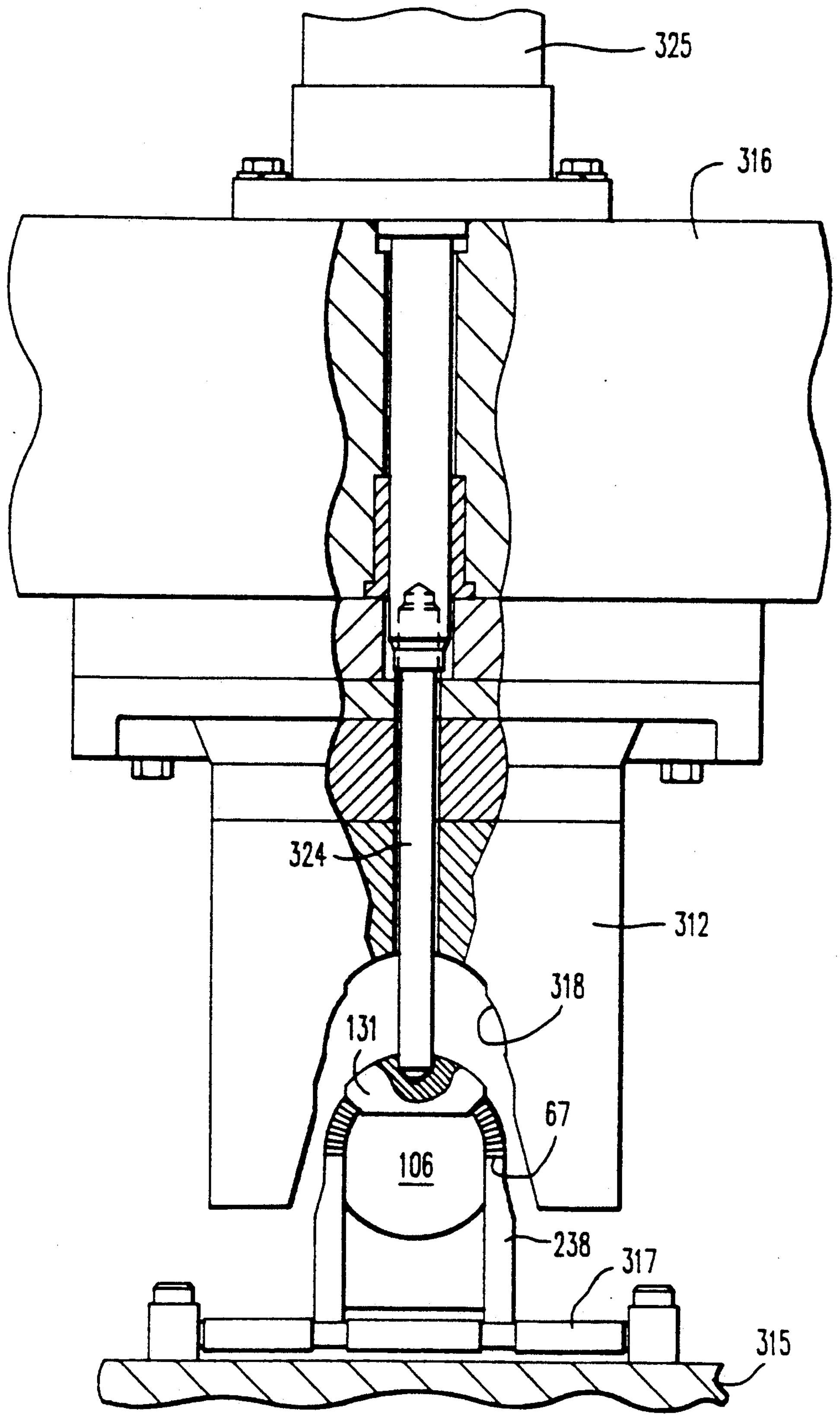
FIGS. 18–20 are detailed cross-sectional views of the coil and winding mandrel as they are loaded into the cure press.
Figure 19:
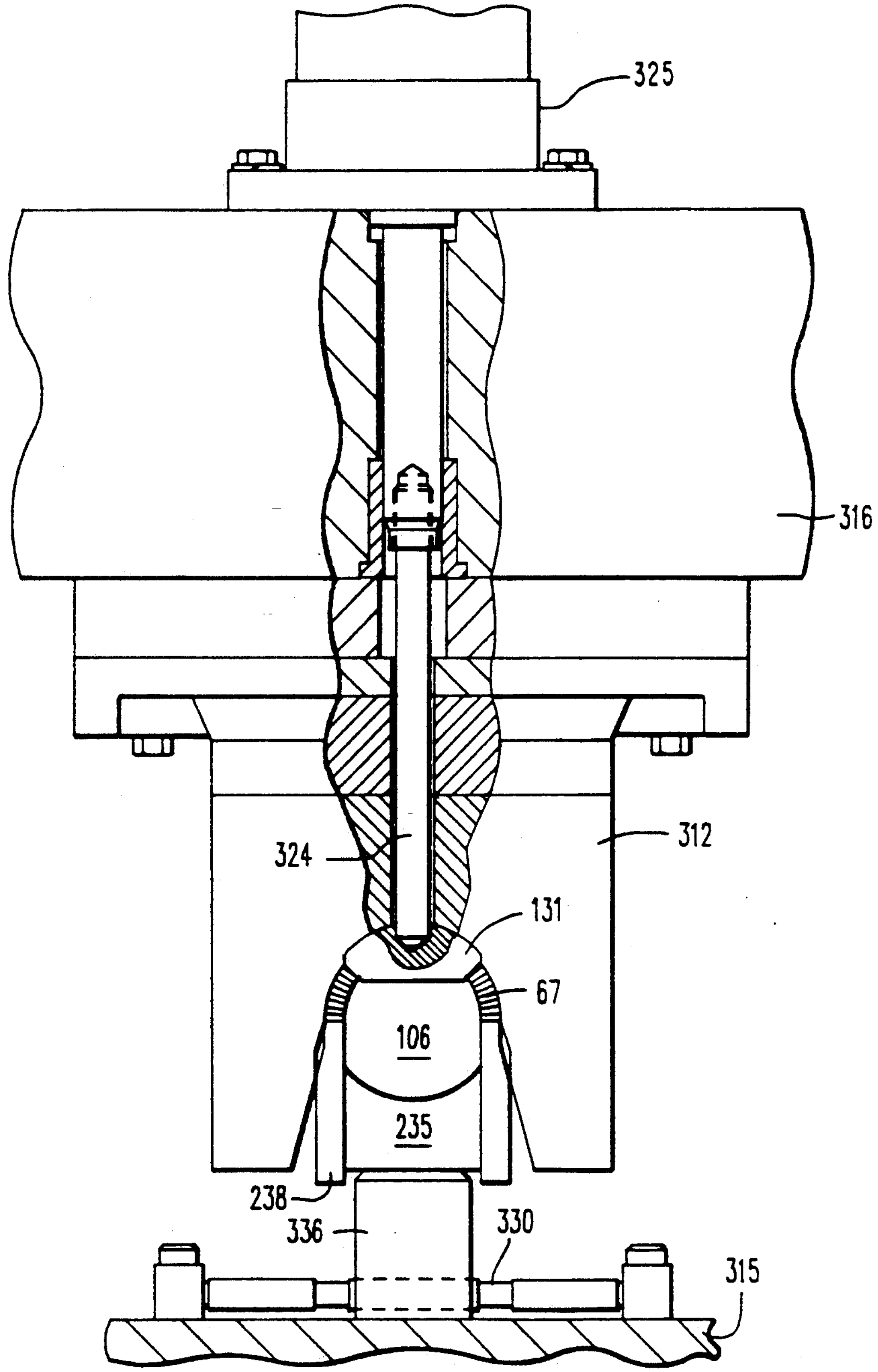
Figure 20:
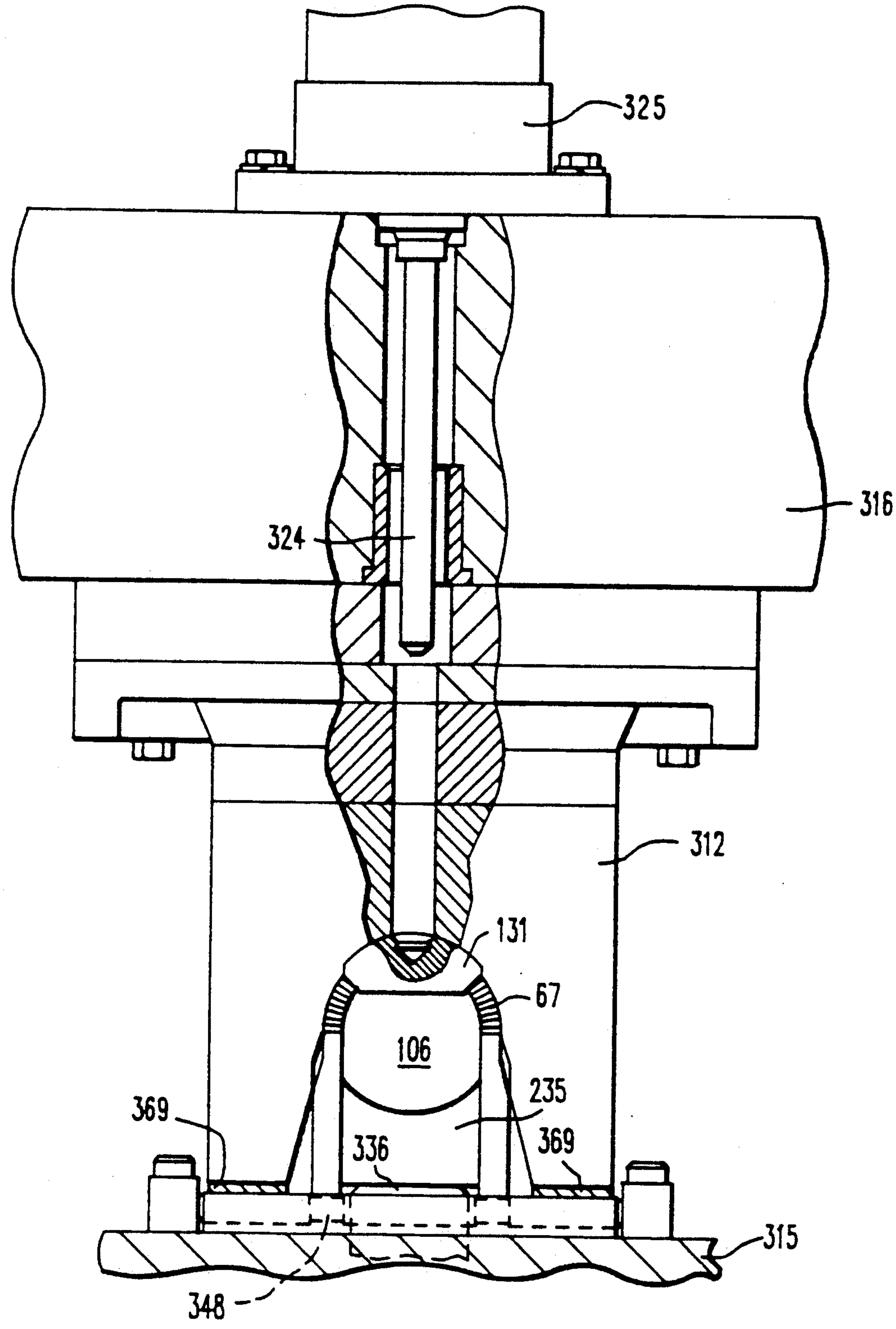

The winding mandrel 106 is then seated into the upper platen 312 of the cure press 306 by the hydraulic seating pistons 336 located in the lower bolster platen 315 and pneumatic guide cylinder rods 324 mounted on the press top platen (FIG. 21). These cylinders 336 raise the winding mandrel 106 off the load rollers 327 and, at approximately 1.187 lift, the winding mandrel 106 contacts the centering shafts, or keys, 324 installed in the upper platen 312 for further aligning the mandrel 106 and the coil 67 within the press 306. Proximity switches (not shown) within the upper platen 312 will sense when the winding mandrel 106 is fully seated in the upper platen 312 (see FIGS. 18–20). At this point the operator then installs spacer shims 369 onto the center pressing plate 348 of the lower bolster platen 315. These spacer shims 369 determine the proper azimuthal dimension of the coil 67 required at curing. When the spacer shims 369 have been installed, the lower bolster platen 315 is then raised via the large hydraulic cylinders 333. These pressing cylinders 333 force the small hydraulic seating cylinders 336 to collapse at the same rate that the bolster platen 315 is raised while maintaining the preload pressure, allowing the pressing plate 348 to apply hydraulic pressure to the vertical side rails 238 of the pressing bar 235, and hence the coil 67, until the press 306 stroke bottoms out on the spacer shims 369.

At this point the curing process is started and is continued until the epoxy foil tape 133, which is typically wrapped helically around the superconducting wire 103, is fully cured. Curing takes place at a temperature of about 116° C. (depending on the type of epoxy tape 133 is used to wrap the wire 103) and at a pressure of about 267,870 kg/m (15,000 lb/in). As the coil 67 is cured by transfer of heating oil through the passageways 321 in the upper platen 312, the hydraulic press 306 is lowered a predetermined amount, on the order of about every fifteen (15) minutes, to allow for thermal linear expansion of the coil cure mold which is calculated to be about 3.81 cm (1.5 in) over the length. At the same time, the coil 67 expands into the desired preformed shape of the upper platen curing mold 318. When the curing cycle is complete and the cured coil 67 is cooling down to ambient temperature, the press pressure cycles up and down, as it does during heat up. At this point the bolster platen 315 is fully withdrawn by the double-acting hydraulic cylinders 345, which are located in line with the guide rods 354. The top mounted pneumatic cylinders 325 push (strip) the winding/curing mandrel 106 with the coil 67 down out of the cure mold 318 while overhauling the small hydraulic cylinders 336 in the press 306 lower bolster platen 315. The pneumatic cylinders 325 then retract. The end pressing cylinder 363 is then released and swung 90° to the unload position. The carriage 360 on the conveyor 303 is then advanced forward until it contacts the winding mandrel 106, at which point it is attached to the mandrel 106 and reversed, pulling the mandrel 106 and the coil pressing bar 235 from the cure press 306. At this stage a finished coil 67 is provided and will hold its desired shape.

This process is utilized for both the inner and outer coils required for the superconducting magnet 61. The coils 67 are typically about 16.5 m (54 ft) long and comprise sixteen (inner) and twenty (outer) turns of wire 103. On the outer coil, the cross-sectional dimension is about 6.35 cm (2.5 in), whereas the inner coil has a cross-section of about 3.02 cm (1.19 in). The winding machine 112 and form and cure press 300 can be used for both size coils 67. On the winding machine 112, the size of the coil 67 is determined by the size of the winding mandrel 106 and its centerpost 131, one mandrel and centerpost used for inner coils and another, larger arrangement used for outer coils. Compare, for example, the arrangement in FIG. 9A with that in FIG. 11C. Preferably, one coil pressing bar 235 is dedicated to the inner coil and one to the outer coil. Also, a different upper platen cure mold 312 having a desired preformed cavity 318 therein is used for the differing size coils 67. With these apparatuses 112, 300, superconductor coils 67 of precise geometry can be economically manufactured on a large-scale basis, providing coils 67 of uniform dimensions. When incorporated into the superconducting magnet 61 for the particle accelerator, these coils 67 will produce the required uniform magnetic field, such as, for example, for the superconducting supercollider. Since most of the critical dimensional parameters can be programmed into the automatic controllers, such that the precise temperature and pressure are obtained during curing for example, conventional operator skills only are required. The apparatuses 112, 300 provide the repeatable accuracy necessary for magnetic field uniformity.

COIL COLLARING PRESS FOR A SUPERCONDUCTING MAGNET

Figure 24:
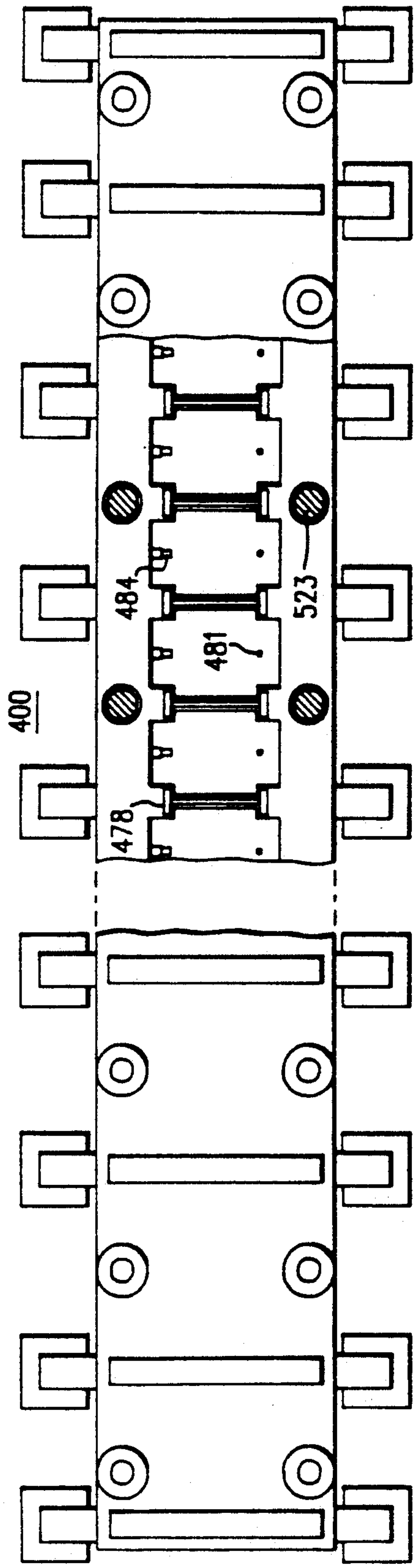
FIG. 24 is a top plan view of the coil collaring apparatus of FIG. 23.
Figure 23:
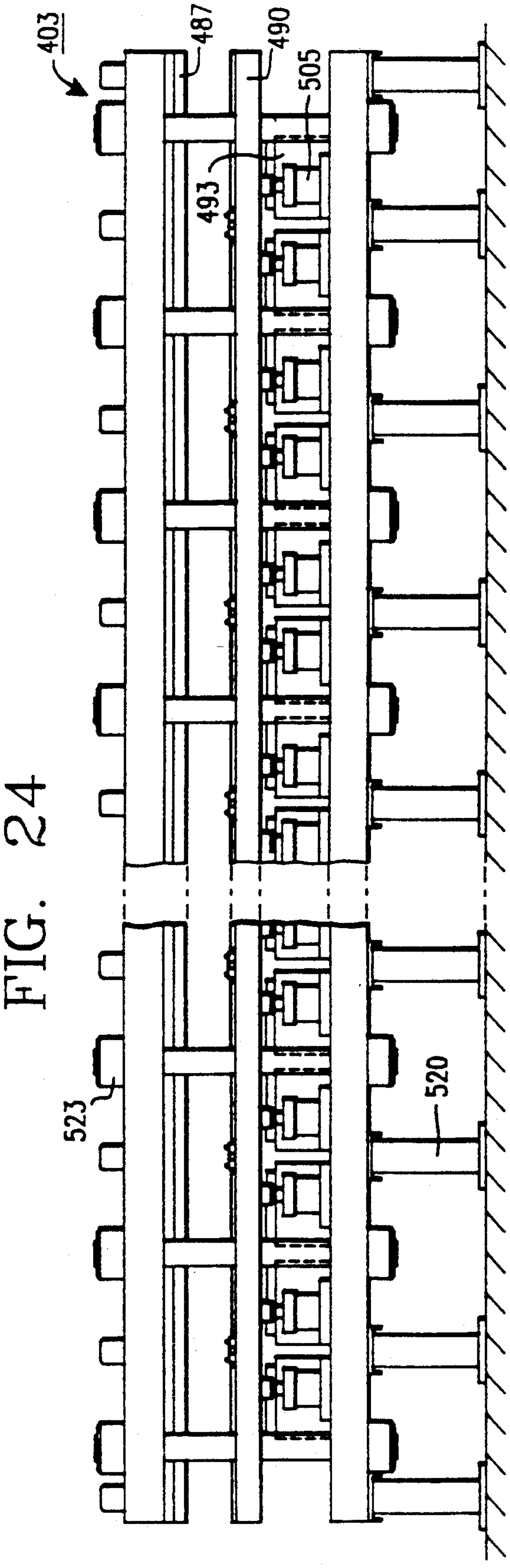
FIG. 23 is an elevational view of a coil collaring apparatus of the present invention.
Figure 33:
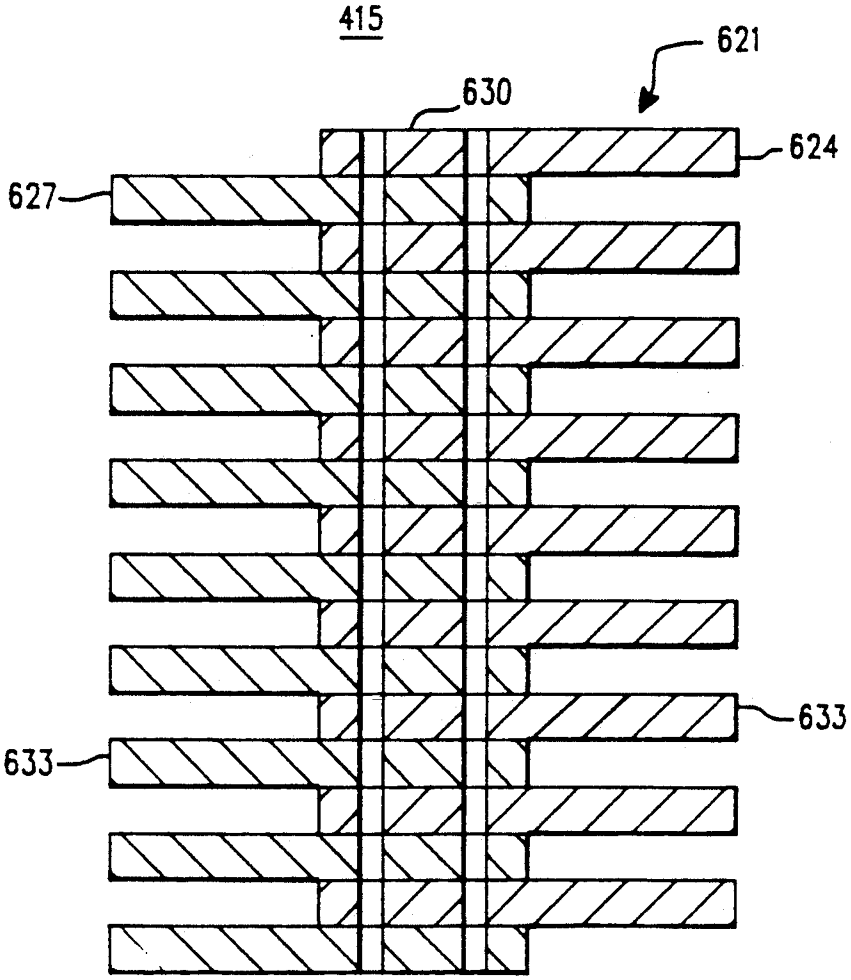
FIG. 33 as an elevational of a typical collar pack used in the collaring process.

The next step in the manufacture of the superconducting dipole magnet 61 involves the securing of a pair of both inner and outer coils about a tube, through which the charged particles are to be accelerated. In order to provide dimensionally accurate collared coils on a large scale production basis for the superconducting dipole magnet 61, a coil collaring apparatus 400 of the present invention is utilized. As shown in FIGS. 23 and 24, the apparatus 400 comprises as its main elements a coil collaring press 403 and an assembly load/unload conveyor 406. The coil collaring operation is a very important step to the correct functioning of the superconducting magnets 61. It is imperative that the superconducting coils 67, (shown in cross-section in FIG. 2) be precisely pre-stressed during collaring 70 around the generally cylindrical tubular member or bore tube 73 so that the precise uniform magnetic field is maintained such that charged particles are correctly accelerated through the bore tube 73. The collaring member 70 is preferably in the form of laminated collar packs 415 (see FIG. 33), which preferably are manufactured by means of a coil collar pack assembly machine disclosed hereinafter. By way of brief explanation, the laminated collar packs 415 are approximately 15.24 cm (6 in) in length and are of a comb-shaped configuration. Upper 418 and lower 421 coil collaring assemblies 70 are securely enmeshed or interdigitated in place, as will be more fully described hereinafter.

Whereas the coil collaring press 400 provides the necessary preload and is the site where the comb-shaped collar packs 415 are securely positioned about the superconducting coils 67 and the bore tube 73, the manufacture and placement of the components for the collared coil 427 (see FIG. 30) are installed in a lower pressing die 424 which is positioned on the conveyor 406. The lower pressing die 424 resides on the conveyor 406 and is positioned with respect to the collaring press 103 by means of a plurality of alignment blocks 430 on the conveyor unit 406.

As outlined in FIGS. 26–29, the collared coils 427 are initially assembled in the lower pressing die 424 on the conveyor unit 406. The lower pressing die 424 is formed so as to receive the collar packs 415 therein and to maintain them in position during the building of the collared coil assembly 427. Initially, tapered keys 433, preferably having a taper thereon of about 1.5°, are held in place on a key inserting mechanism 436 by rare earth magnets 439. Rare earth magnets 439 are desirable because they will maintain their magnetic properties over an extended period of time, and after their use in the construction of numerous collared coils 427. The keys 433 preferably comprise numerous small length key segments which are positioned on the magnets 439 of the key inserting mechanisms 436. Since the overall length of the collared coil 427 is approximately 17 m (55 ft), the manufacture of a full length key would be relatively difficult. The ends of the smaller key segments are preferably staggered along the length of the lower pressing die 424 such that the ends of respective upper and lower keys 433 are not contingent. The staggering of the keys 433 provides for a stronger and more rigid collared coil assembly 427. The keys 433 are installed on both sides of the lower pressing die 424 along the entire length, and the key inserting mechanisms 436 retracted.

As the next step, a plurality of collar packs 415 are installed in the lower pressing die 424 to make up the entire 17 m length of the lower collar assembly 421. Generally about one hundred five (105) of these comb-shaped collar packs 415 are installed, since each collar pack 415 is approximately 15.24 cm (6 in) in length. At both ends of the lower pressing die 424, collar packs 415 not having a keystone-shaped element 442 near its middle portion are installed. This is because, due to the shape of coils 67 as they are wound on the winding mandrel 106 about its centerpost 131 (see FIG. 11), at their ends the keystone-shaped member 442 is not required. However, such a mechanism is needed during most of the length of the coil 67 due its shape during manufacture (see FIG. 2). The tapered keystone-shaped members 442 keep the coils 67 in their proper configuration after the coils 67 are collared 70 and secured in place about the bore tube 73. After the lower collar assembly 421 is in place the placement of lower inner 445 and outer 448 coils and the bore tube 73 is performed.

With the full length lower collar packs 415 installed, the build up of a coil collar preassembly 451 for the superconducting magnet 61 commences. The collared coil assembly 427 may include not only a pair of both inner and outer coils, but also spacers, quench protection resistors, and other materials (all not shown) which are used to protect the magnet, and to ensure that the required magnet field is provided through appropriate magnet configuration. The quench protection resistor is installed to preclude damage to the magnet 61 due to the loss of superconductivity in the coil 67. After these materials are installed, a lower outer coil 448 is positioned in the lower collar pack 421 via an overhead crane (not shown). After the lower outer coil 448 has been installed, if required, another quench protection resistor and spacers may be installed. The lower inner coil 445 is then installed onto the lower outer coil 448 and lower collar assembly 421, such as by the overhead crane (not shown). The operator can then install the bore tube 73 into the assembly in the lower pressing die 424. The bore tube 73 is of a length longer than the overall 17 m of the lower collar assembly 421 so as to provide for proper interaction between adjacent superconducting magnet assemblies of the particle accelerator.

Figure 28:
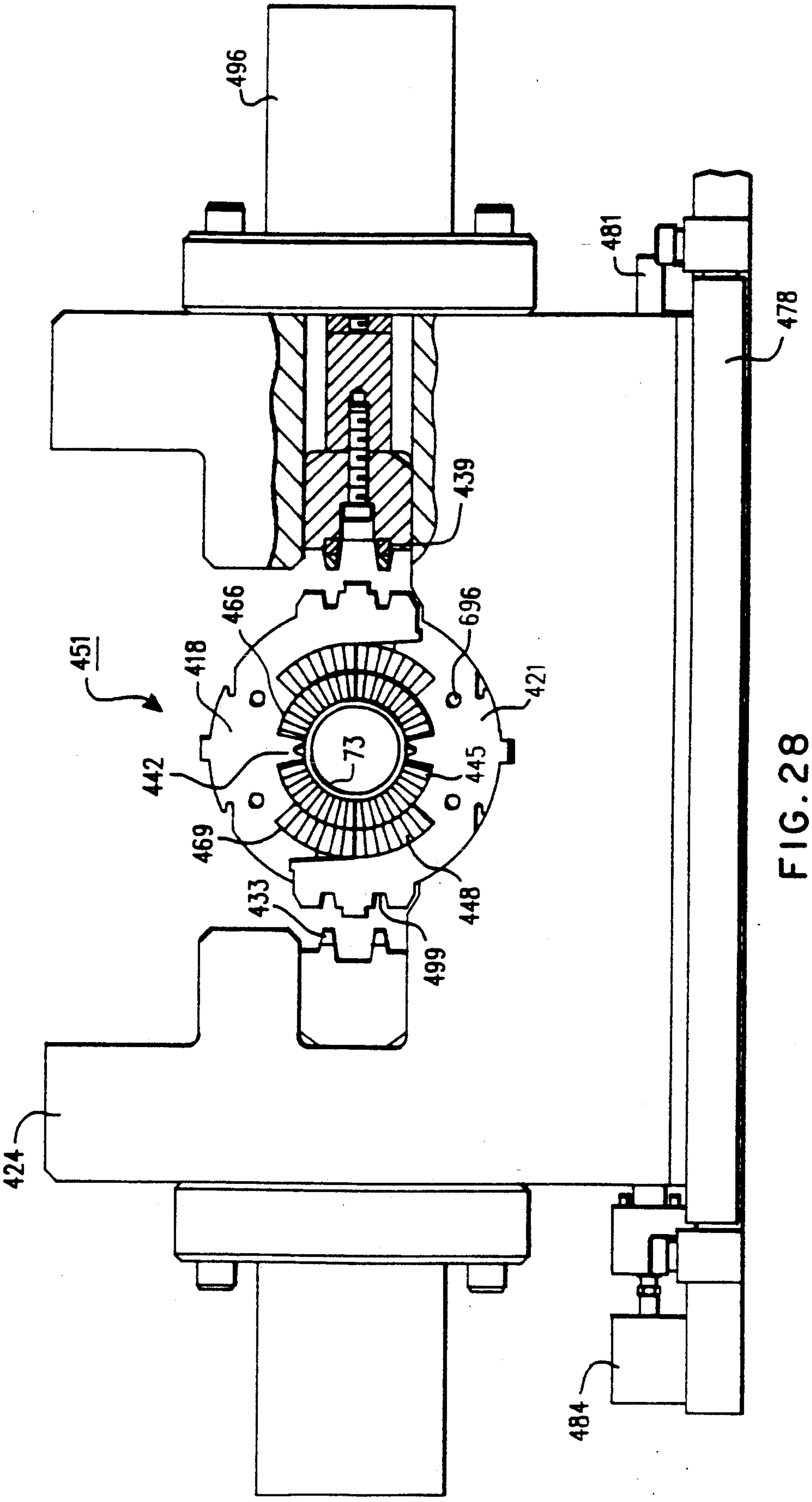
FIG. 28 is an exploded view of a half coil as it is installed in the collaring press.
Figure 29:
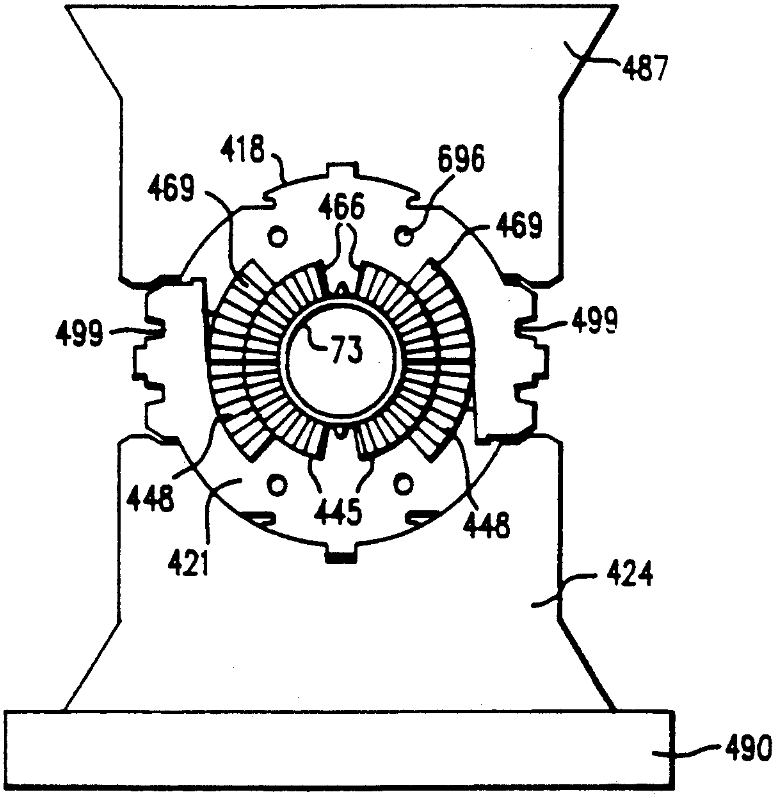
FIG. 29 is a cross-sectional view of a collared coil during pressing.

With the bore tube 73 in place, the upper half of the coil collar preassembly 451 is placed in position. A second, upper inner coil 466 is installed onto the bore be 73 via the overhead crane, and additionally the spacers and quench protection resistors, as required, are installed before an upper outer coil 469 is put into position. Finally, additional collar packs 415 are installed over the coil assembly to form the elongated upper collaring assembly 418, thereby completing a coil collar preassembly 451, as shown in FIG. 28.

With the coil collar preassembly 451 complete, the load conveyor 406 is then advanced bringing the lower pressing die 424 into the coil collaring press 403. The conveyor unit 406 includes a drive carriage 472 having quick disconnect pins 475 which engage the lower pressing die 424. The lower pressing die 424 is kept in alignment with respect to the collaring press 403 by means of the support blocks 430 on the conveyor 406. As the lower pressing die 424 enters the collaring press 403, it in turn engages a plurality of spring loaded load rollers 478 within the collaring press 403. The load rollers 478 support the lower pressing die 424 and the coil collar preassembly 451 therein while it is loaded into the press 403, and are similar to those used in the cure press 306. During this loading procedure, the lower pressing die 424 also contacts a series of stationary cam followers 481 and pneumatic operated yoke cam followers 484. The pneumatic operated yoke cam followers 484 are activated as the lower pressing die 424 passes by, forcing it against the stationary cam followers 481 which keep the die 424 in line with an upper pressing die 487. Once the lower pressing die 424 is fully loaded within the press 403, and resting on a bolster platen 490, as sensed by a proximity sensor (not shown), the conveyor carriage 472 is disconnected from the lower pressing die 424 and is reversed until the carriage 472 is fully clear of the collaring press 403.

Figure 25:
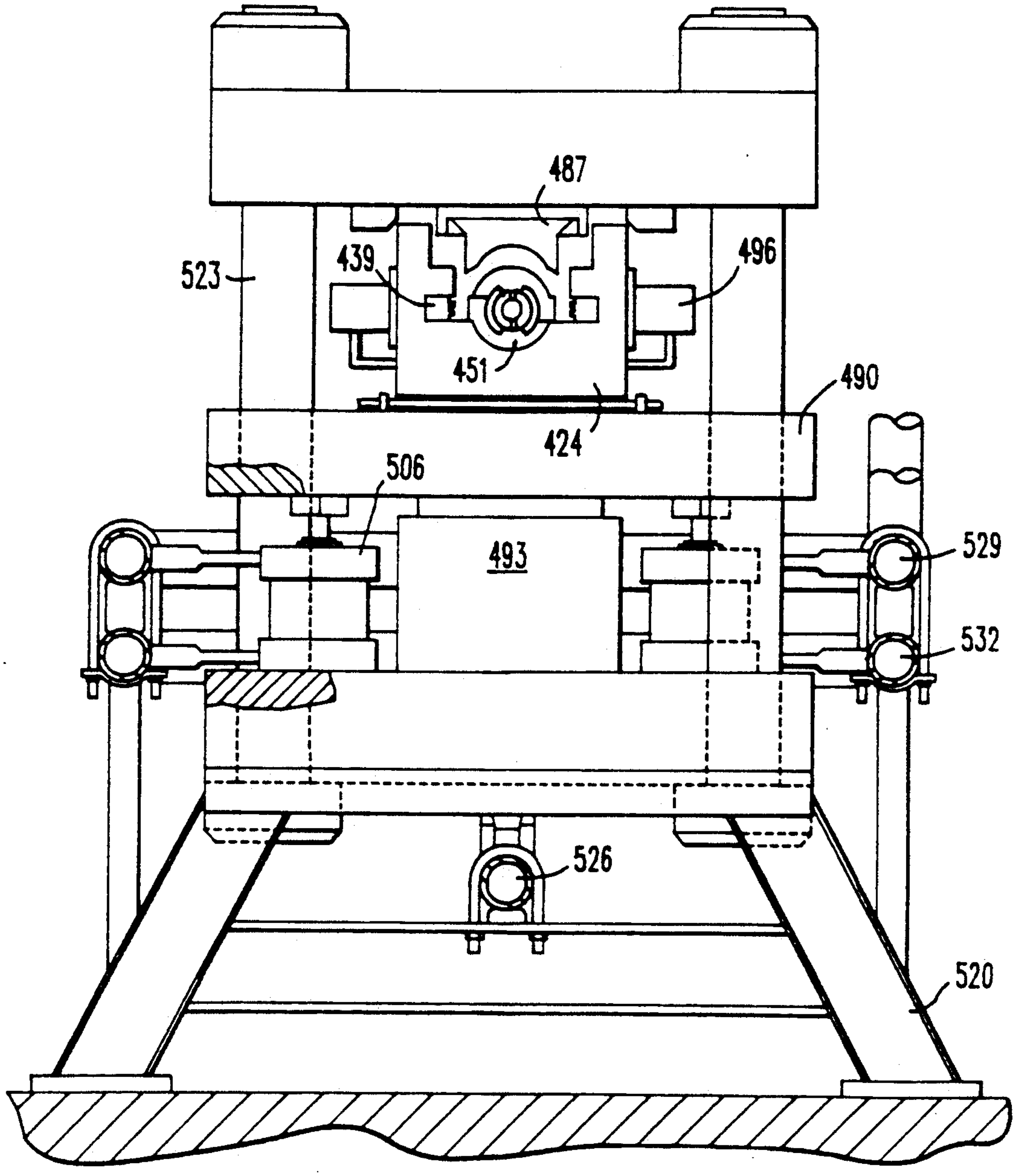
FIG. 25 is a cross-sectional, elevational view of the collaring press.
Figure 26:
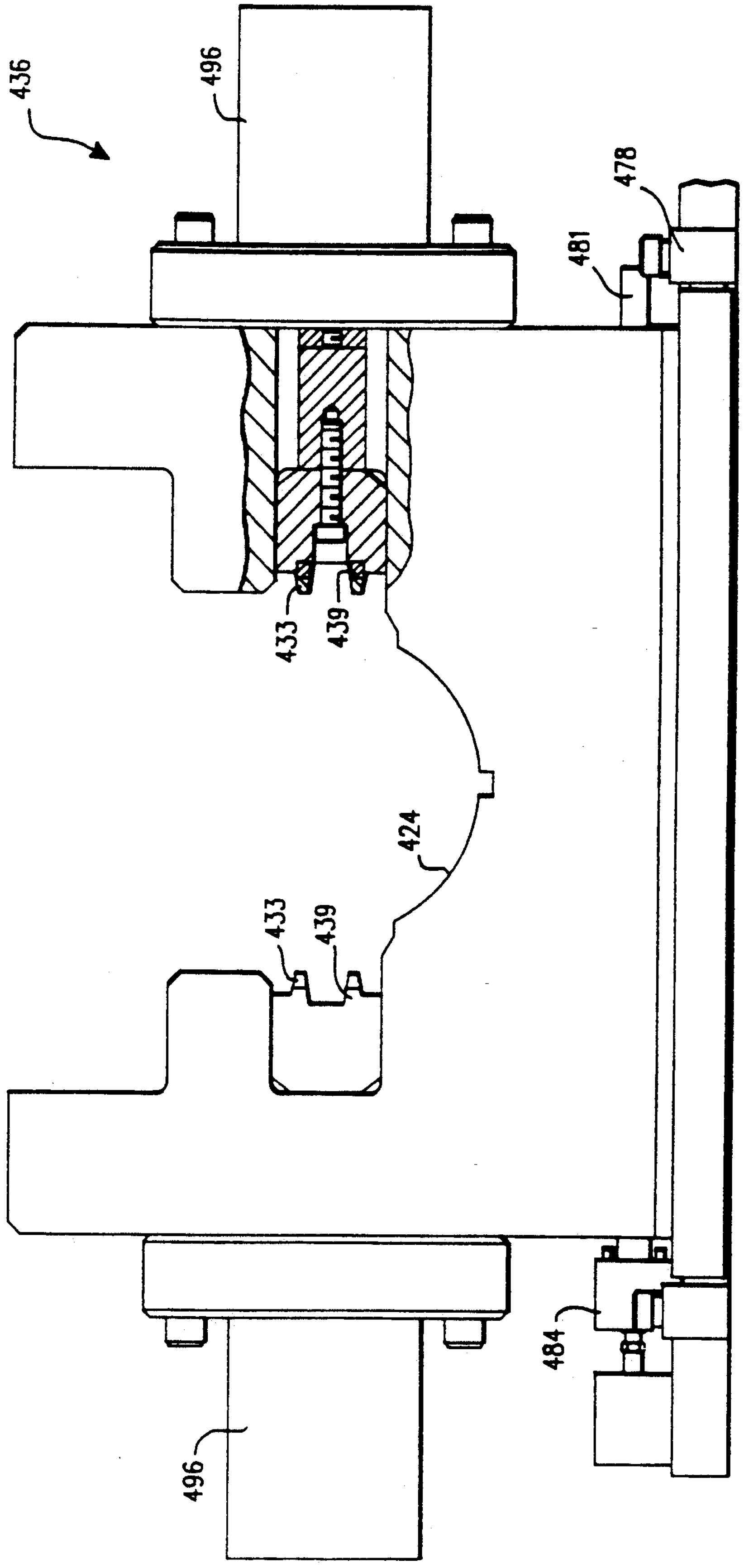
FIG. 26 is a cross-sectional view of a lower pressing die with tapered keys installed.
Figure 27:
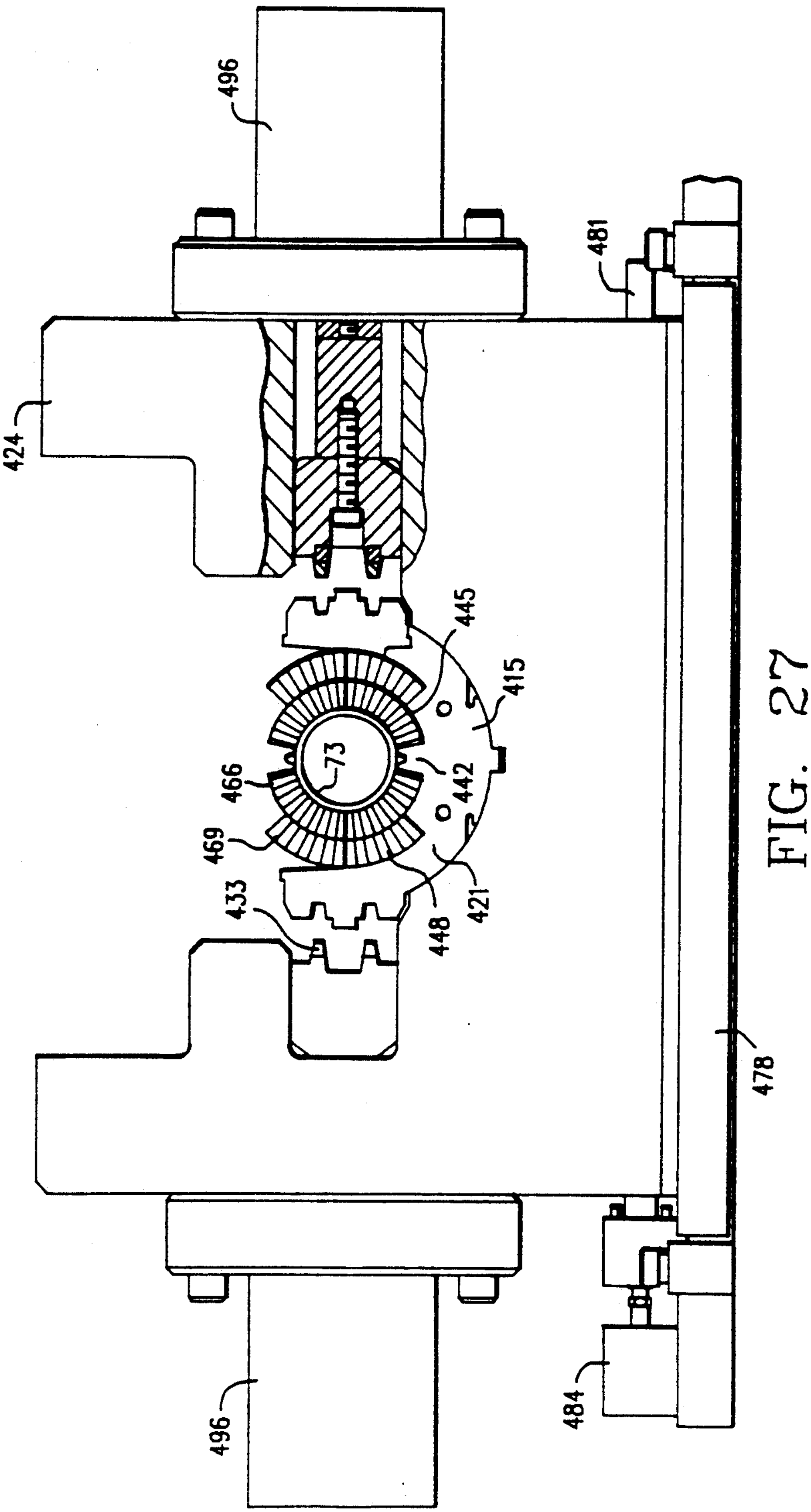
FIG. 27 is a cross-sectional view of the lower pressing die during construction of a collared coil.

With the lower pressing die 424 properly installed in the collaring press 403 and aligned with the upper pressing die 487, the pressing and keying process is commenced. In order to press the coil collar preassembly 451, and to tightly interdigitate the comb-shaped upper 418 and lower 421 collaring assemblies, a series of preferably hydraulic cylinders 493 are activated to a force of about 44.5 MN (5000 tons). These hydraulic cylinders 493, located underneath the bolster platen 490, are activated to bring the bolster platen 490 and lower pressing die 424 upward such that the coil collar preassembly 451 is pressed between the lower pressing die 424 and the upper pressing die 487 (see FIG. 25). When the required preload has thus been imparted on the coil collar preassembly 451 (see FIG. 29), thereby enmeshing the comb-shaped collar assemblies 418, 421, key inserting cylinders 496 of the key inserting mechanism 436 are activated to insert the keys 433 into keyways 499 of the enmeshed collar packs 415. The taper of the keys 433 assures that the keys 433 are easily inserted in the keyways 499 so as to prevent any inadvertent damage to the collar assemblies 418,421. Thus a pressed coil 502 is brought to a fixed dimension.

Preferably, prior to the insertion of the keys 433 thereby locking the coil collar preassembly 451 in place, an electrical check is performed on the coils 67. When the electrical check is satisfactory, the keys 433 are then pressed into the collar assemblies 418,421 to lock the pressed coil 502 into the desired precise dimensional configuration. Therefore the preassembly 451 is pressed and keyed simultaneously. The desired coil pre-stress and dimensional configuration which is locked into the collared coil 427 around the bore tube 73 ensures that the coil position and a uniform magnetic field are maintained along the entire length of the collared coil assembly 427.

Figure 30:
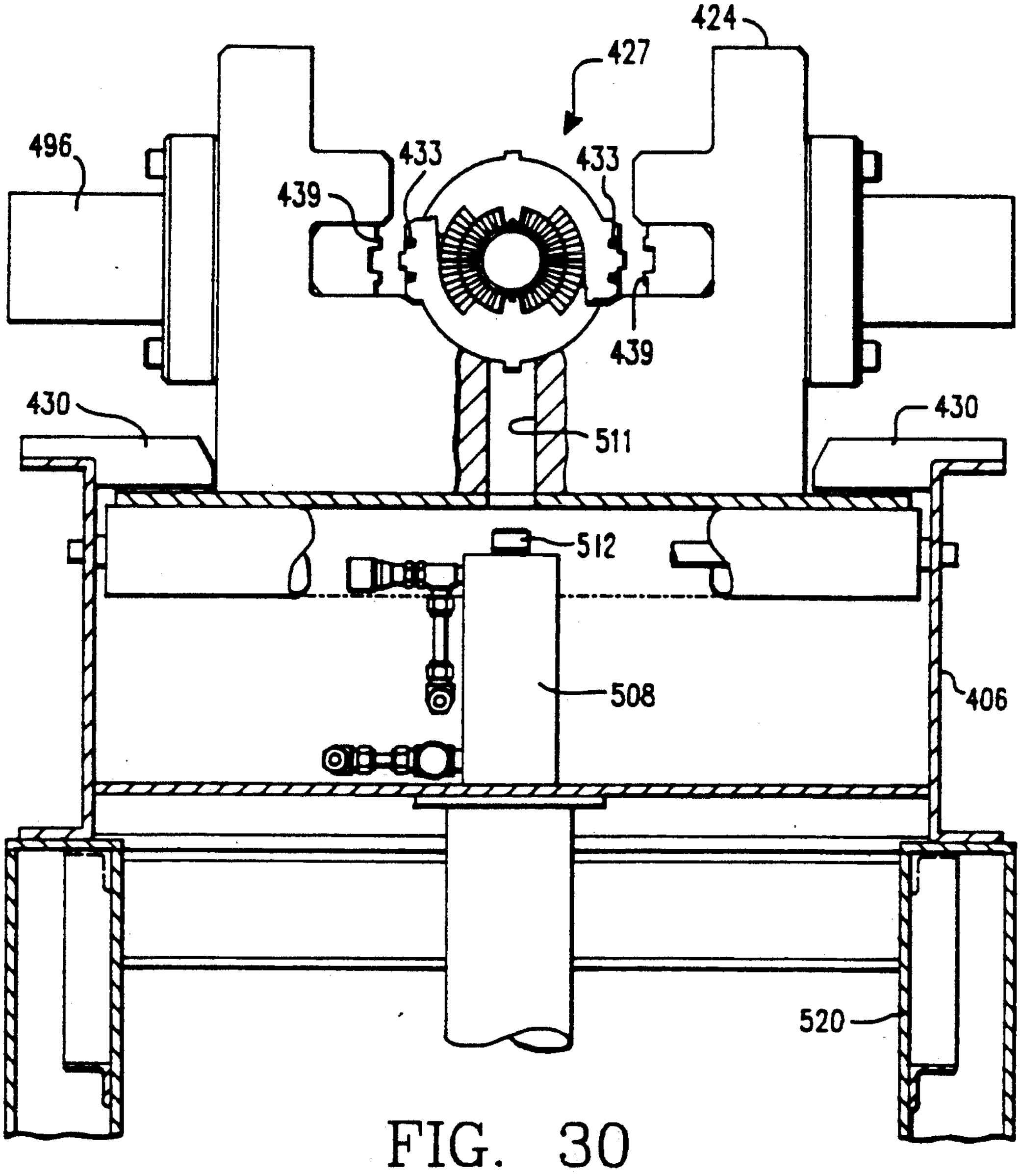
FIG. 30 is a cross-sectional view of a collared coil unloading device.

Once the pressing and keying process is complete, the lower pressing die 424 is lowered by deactivating pressing cylinders 493 to lower the bolster platen 490, and the conveyor 406 is advanced forward again until it contacts the lower pressing die 424. The press 403 also includes a series of hydraulic return cylinders 505 to insure that the lower pressing die 424 is brought down out of engagement with the upper pressing die 487 when pressing and keying is completed. The lower pressing die 424 is then attached to the conveyor carriage 472 by the quick connect pins 475, and the carriage 472 is withdrawn from the collar press 403 to thereby remove the lower pressing die 424 from the press 403. The carriage 472 is stopped at a predetermined position, which aligns the lower pressing die 424 with a series of pneumatic lift cylinders 508 located beneath the conveyor unit 406, as shown in FIG. 30. The lower pressing die 424 includes a series of clearance holes 511 for the lift cylinders 508 below the conveyor unit 406. When the lower pressing die 424 is in the proper position, the pneumatic lift cylinders 508 are activated so as to extend cylinder rod 512 through the conveyor unit 406 and into the clearance holes 511 of the lower pressing die 424. When the lift cylinder rods 512 have been extended, they contact the collared coil assembly 427 to thereby lift it out of the lower pressing die 424. In this position lifting slings (not shown) can be installed underneath the collared coil assembly 427 for removal from the lower pressing die 424 to the next step in the manufacture of the superconducting magnet 61.

As the pressing and keying process is taking place, a second coil collar preassembly is built up on a second conveyor unit (not shown) located on the opposite end of the collaring press 403. This sequence allows one coil collar preassembly 451 to be pressed and keyed while an opposite unit is assembled and allows for optimal utilization of the press and conveyor apparatus 400 of the present invention.

Figure 31:
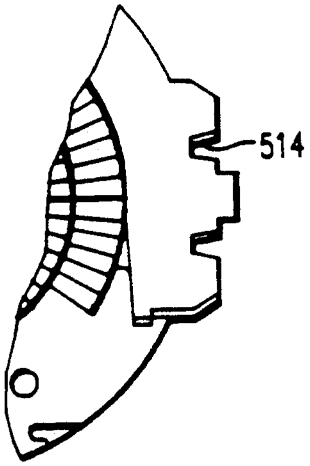
FIGS. 31 and 32 show an alternate embodiment for securing the collar packs about the coils and bore tube.
Figure 32:
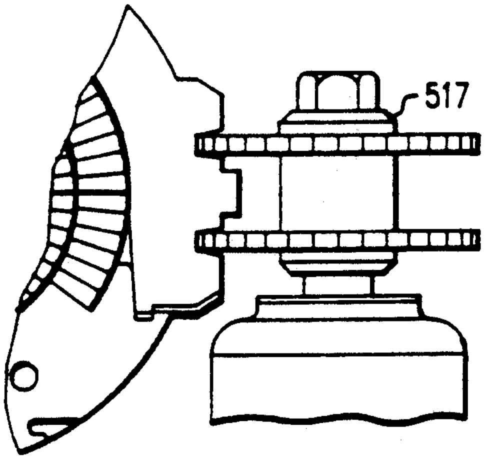

An alternative embodiment of the pressing and keying process is shown in FIGS. 31 and 32. In this embodiment the collar pack assemblies 415 would preferably include undersized keyways 514 which are not necessarily in alignment under the preload position. Thus the collaring press 403 would also include a means 517 for milling the proper size keyways 499 into the collar packs 415. When the proper milling has taken place, the keys 433 are then pressed into the enmeshed collar packs 415 so that the proper preload is maintained.

The coil collaring press apparatus 400 is mounted on a machine base or support stand 520. Positioned between the upper pressing die 487 and the lower pressing die 424 are a plurality of collaring press guide rods 523 for guiding the lower pressing die 424 as it is raised to preload the coil collar preassembly 451. Preferably, the guide rods 523 also act as a support and are secured between the support stand 520 and the upper pressing die 487.

Overall press control is provided by a programmable controller with hydraulic and pneumatic controlling units managing the continuous operation of their respective subsystems. The programmable controller can handle the press sequencing and monitoring of the status of all subsystems. If desired, the control system will also allow manual operation of the subsystems. An operator console may be provided as the main control area for press operation. The console will contain the programmable controller along with various relays, power conditioning, press status displays and sequencing switches for the automated manufacture of a collared coil 427 for a superconducting magnet.

A hydraulic controlling unit as part of the hydraulic system provides the high pressures needed to press the collars 418,421. The unit will contain pump controls and solenoid valves necessary to operate the press cylinders 493 for the desired preload on the coil collar preassembly 451. Hydraulic fluid is simultaneously delivered to each of the pressing cylinders 493 by way of an inlet/outlet manifold 526 located below the bolster platen 490, connected to a hydraulic supply and pumping unit (not shown) via inlet 529 and return line 532, as is well known in the art.

The control system will include all the interlocks required to prevent initiation of the next sequence step in the collaring process unless the completion of the previous step is proven and verified. In this way an automated large scale manufacturing apparatus 400 is provided for the pressing and keying of collared coil assemblies 427.

By providing for the assembly of one coil collar preassembly 451 while the other is being pressed and keyed allows for a through-put that will be commensurate with large scale production requirements. The quality of the collared coil 427 is maintained through controlling and monitoring the mechanical press load to achieve proper keyway 499 alignment to insure that the keys 433 are inserted to maintain the precise dimensional configuration of the assembly. Collaring of the coils 100 about the bore tube 412 provides a restraining mechanical force along the entire length of the coil pair to prevent the coils 100 from changing shape under high electromagnetic forces in operation. The mechanical circumferential preload of the collared coil 427 is predictable and repeatable, in order to assure that a uniform magnetic field is provided for the superconducting supercollider.

METHOD AND APPARATUS FOR ASSEMBLING COLLAR PACKS FOR A SUPERCONDUCTING MAGNET

Figure 34A:
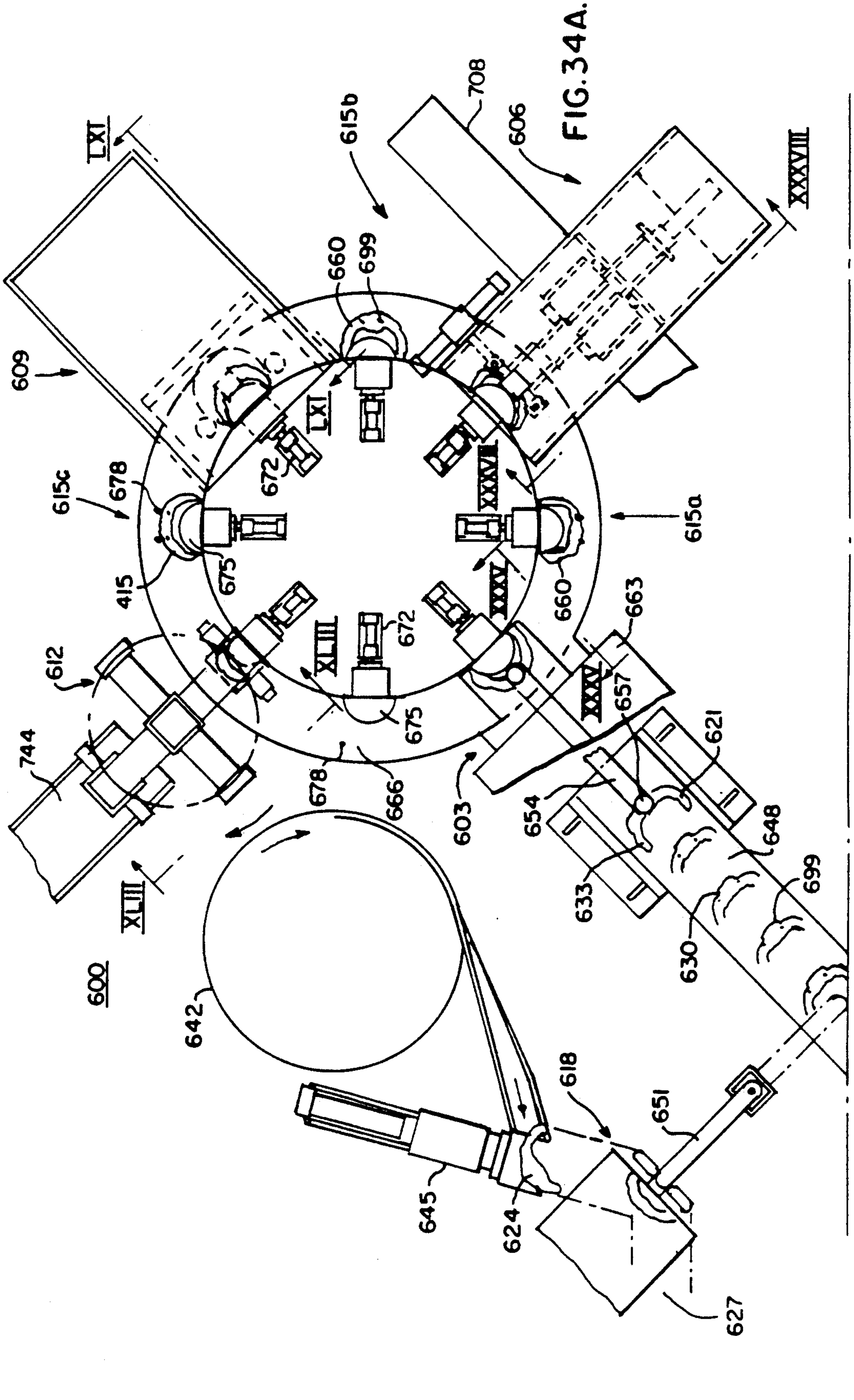
FIG. 34 is a top plan and perspective view of an overall collar pack assembly machine for the SSC dipole magnet.
Figure 34B:
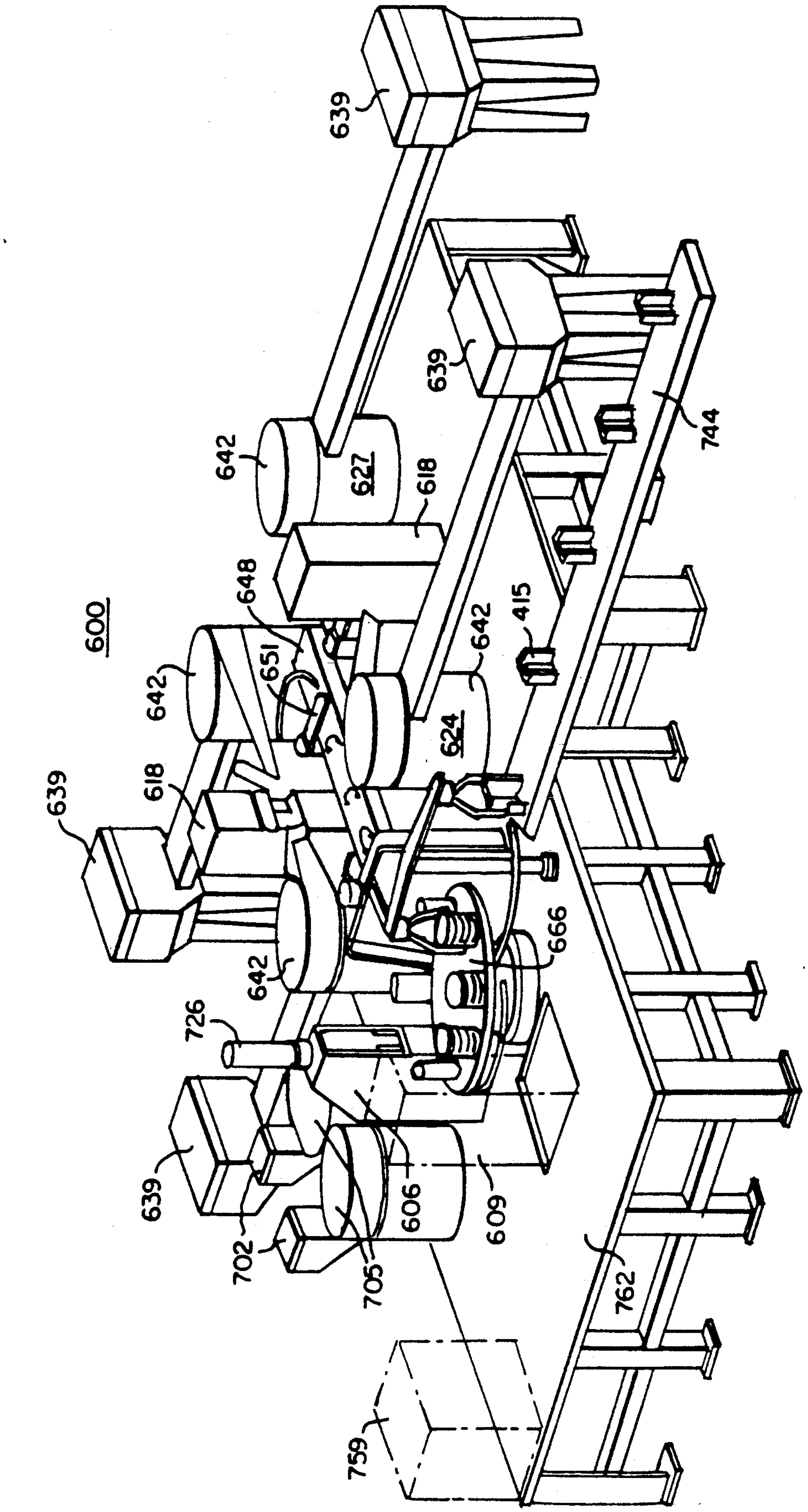

In order to build collaring components 70 for the superconducting magnet 61, a collar pack assembling machine 600 of the present invention is utilized. As shown in FIG. 34, the apparatus 600 comprises four main assembly stations: a collar pack build-up station 603; a pin insertion station 606; a compressing and peening station 609; and a collar pack unload station 612. Moreover, at points between each of the respective stations, an inspection station 615 is provided so that each step can be performed with the required precision. Furthermore, if necessary, prior to the collar pack build station 603 is a lamination welding station 618. This station 618 would be needed if collaring laminations 621 are provided in the form of right- 624 and left- 627 hand collar halves.

The collar laminations 621 are stamped, non-magnetic metal laminations which are generally in a C-shaped form. The laminations 621 are such that they have a greater thickness near middle portion 630 than at end portions 633. Thus when the laminations 621 are stacked, the assembled collar pack 415 is in the form of a comb-shaped configuration (see FIG. 33). This greatly facilitates the collaring of the superconducting magnet. The comb-shaped configuration of the collar packs 415 enables the upper 418 and lower 421 collaring assemblies to be interconnected so as to supply a secure collared coil assembly 427 for the superconducting magnet 61 of the particle accelerator.

There are two collar pack welding stations 618 for the collar pack assembly machine 600. As seen in FIG. 34, right- 624 and left- 627 hand collar lamination halves are inserted into surge hoppers 639, and are fed to vibratory bowl feeders 642 which feed the collar halves 624,627 to the appropriate weld station 618 in the desired orientation. The bowl feeders 642 transfer and position the collar halves 624,627 onto slide feeders 645, which extend and position each collar half 624,627 into the welding station 618. Collar halves 624,627 are then secured together, preferably spot welded to form a single C-shaped lamination 621. The collaring laminations 621 are then transferred from the welding station 618 to a linear transfer conveyor 648 via a multi-actuator gripper 651, pneumatically actuated, to be supplied to the collar pack build-up station 603. By the use of a dual collar half welding station 618 set up, collar pack laminations 621 can be provided on a continuous basis for the economical production of the collar packs 415.

Figure 36:
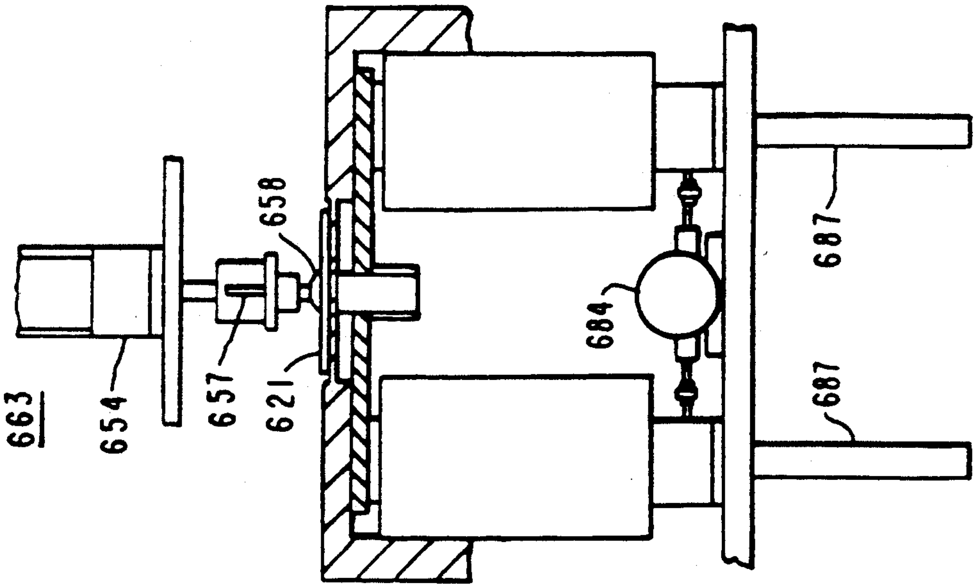
FIG. 36 is a front elevational view taken along the line XXXVI—XXXVI of FIG. 35.
Figure 35:
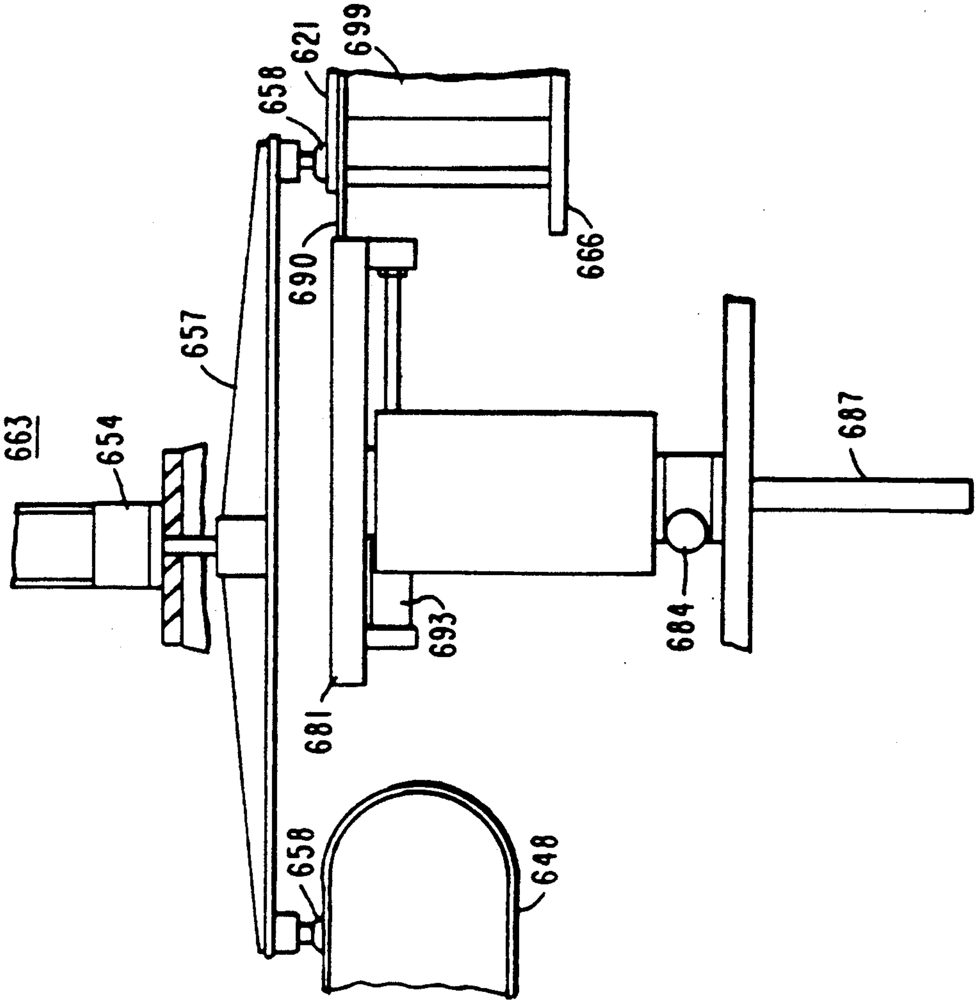
FIG. 35 is a side elevational view of a collar pack build-up station taken along the line XXXV—XXXV of FIG. 34.
Figure 37B:
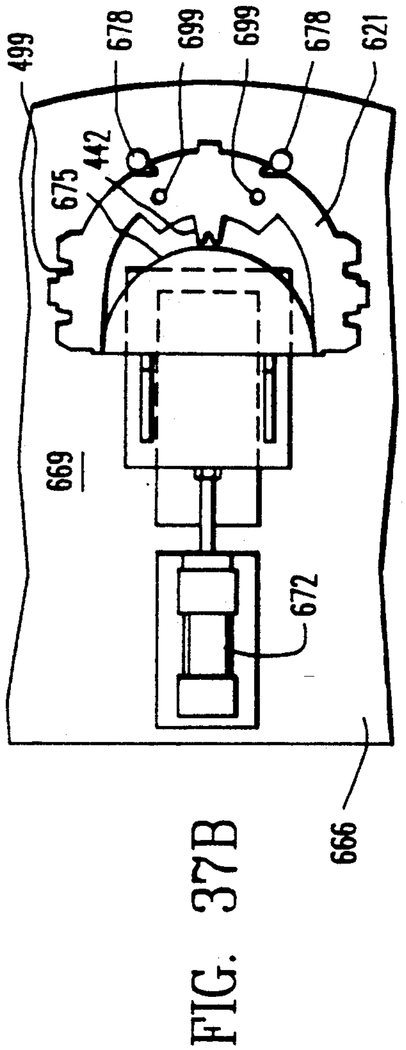
FIG. 37 is a detailed view of a collar pack locating fixture.
Figure 37A:
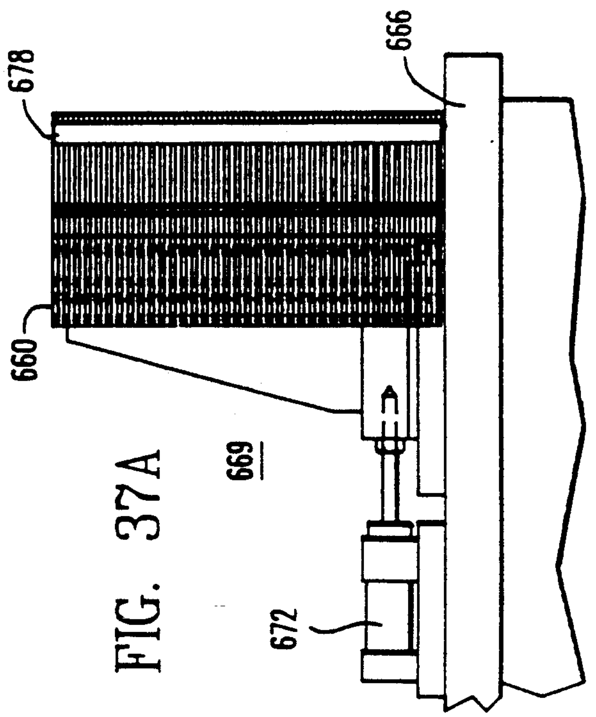
Figure 37C:
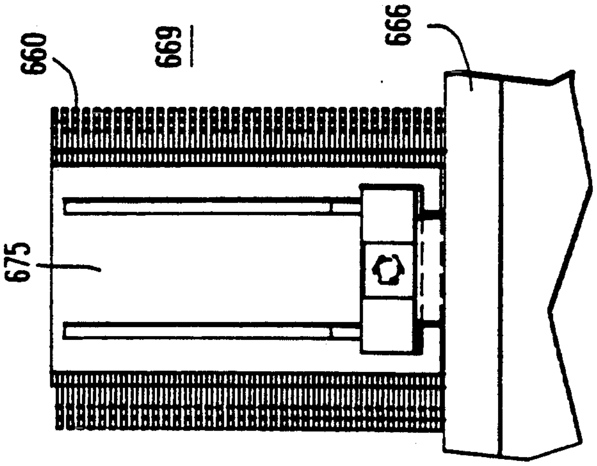

As the collaring laminations 621 are transferred down the linear conveyor 648, they approach the collar pack build station 603 of the collar pack assembly machine 600. The individual collaring laminations 621 are gripped by a second pneumatic actuator 654 With a pick up arm 657 having a vacuum gripper 658 thereon, which is then rotated 180° to the collar pack assembly machine 600. The build station 603 (FIGS. 35–36) will deliver collaring laminations 621 to the assembly machine 600 in a precise manner so as to build a loose stack 660 of laminations 621 to a predetermined height. The build station 603 includes an indexing and stacking mechanism 663 which will provide these individual lamination stacks 660. Moreover, the collar assembly machine 600, which includes a rotary indexing table 666 for delivering the collaring laminations 621 to their respective stations, includes a plurality of collar stacking fixtures 669. As seen in FIG. 37, each lamination stacking fixture 669 includes a pneumatic cylinder 672 having on its end a rounded locating fixture 675 which corresponds generally to the inside diameter of the collaring laminations 621. Opposite the locating fixture 675 is a pair of stacking die pins 678 which, together with the locating fixture 675, will properly align the lamination stacks 660 for the various operations which are to be performed in manufacturing complete collar packs 415. As individual laminations 621 are picked up by the pneumatic actuator 654 at the build station 603, an indexing table 681 of the stacking mechanism 663 will index downward the cross-sectional dimension of an individual lamination 621, which is typically 0.3175 cm (0.125 in). This is accomplished by a gear motor 684 and machine screw actuators 687 which are positioned underneath the indexing table 681, and precisely index the table 681 downward the height of the lamination 621 thickness. The indexing table 681 includes an indexing stacking plate 690 which is the same dimension as the collaring laminations 621, for reasons which will be more fully described hereinafter.

As laminations 621 are continually stacked at the build station 603, the height of the lamination stack 660 increases. The vacuum grippers 658 of the multiactuator 654 at the build station 603 will continually provide the laminations 621, the indexing mechanism 663 assuring that the stack 660 of laminations 621 is at the same height with respect to the grippers 658. When the prescribed stack 660 height is reached, generally about 15.24 cm (6 in), which corresponds to approximately forty-six (46) laminations 621, the indexing stacking plate 690 withdraws by actuation of a cylinder 693, preferably pneumatically operated, located underneath the indexing stacking plate 690, thus providing the desired height of the collar pack 415. At this point the rotary table 666 indexes so as to transfer the loose lamination stack 660 to a first inspect station 615*a* prior to insertion of securing pins 696.

Figure 38:
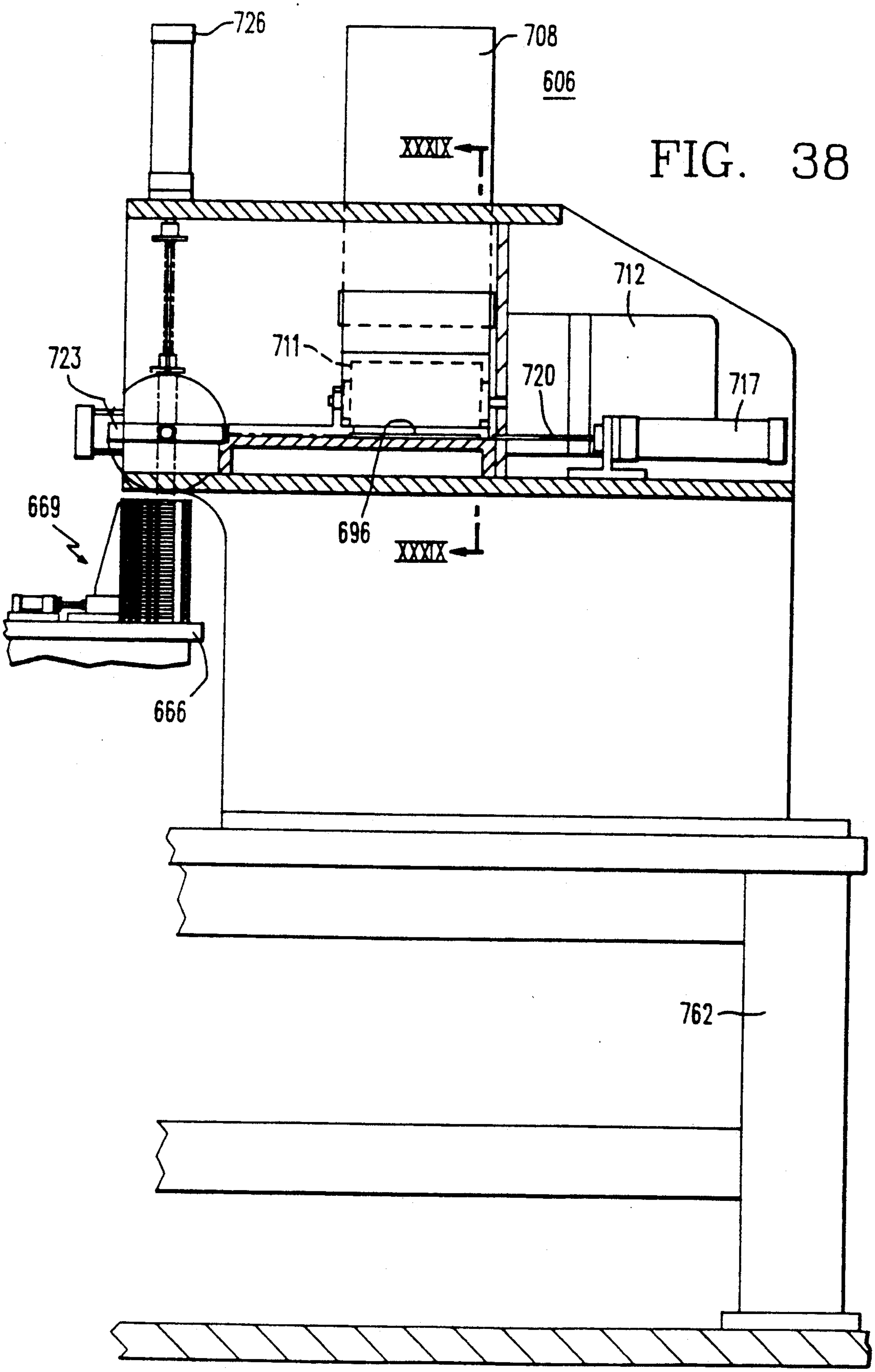
FIG. 38 is a cross-sectional view of a dual pin insertion station of the present invention, taken along the line XXXVIII—XXXVIII of FIG. 34.
Figure 39:
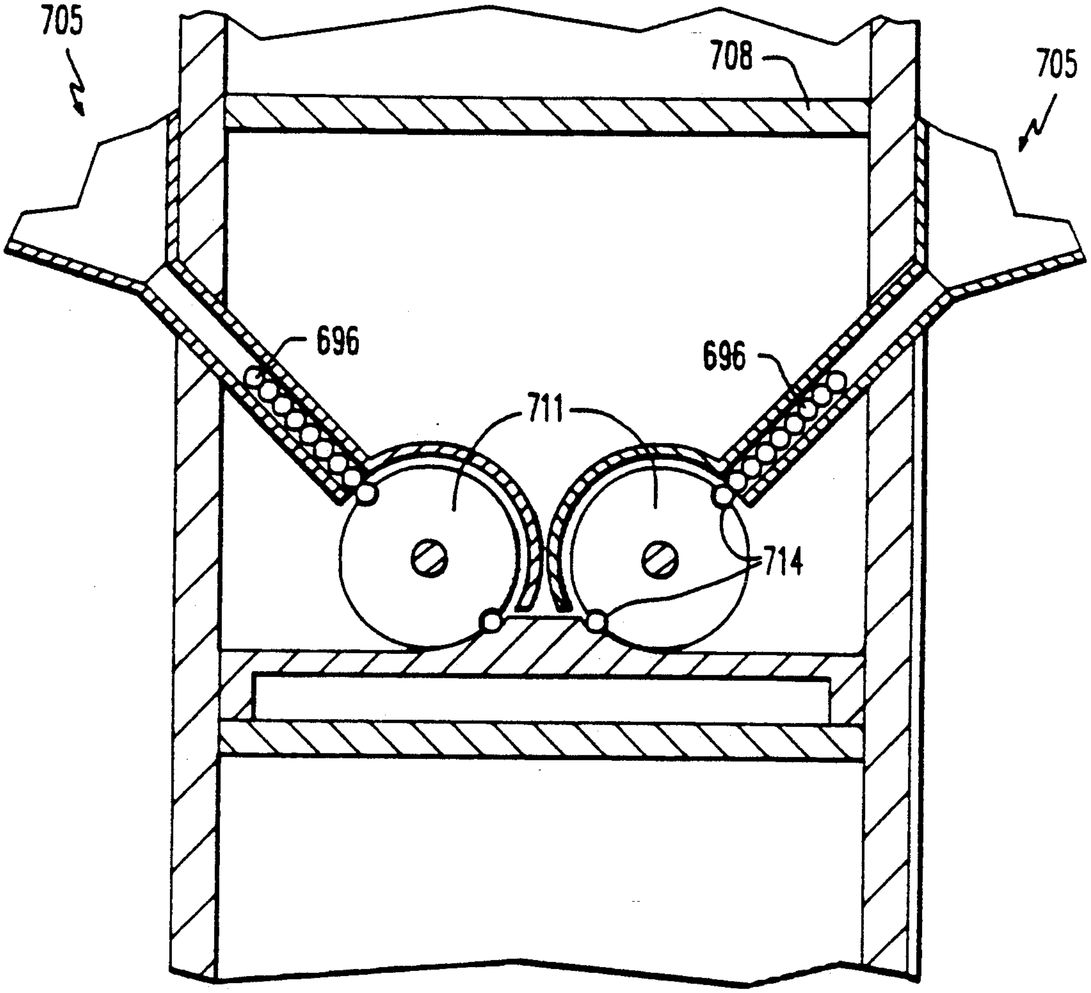
FIG. 39 is a side elevational view, partially in cross-section, of a pin magazine taken along the line XXXIX—XXXIX of FIG. 38.
Figure 40:
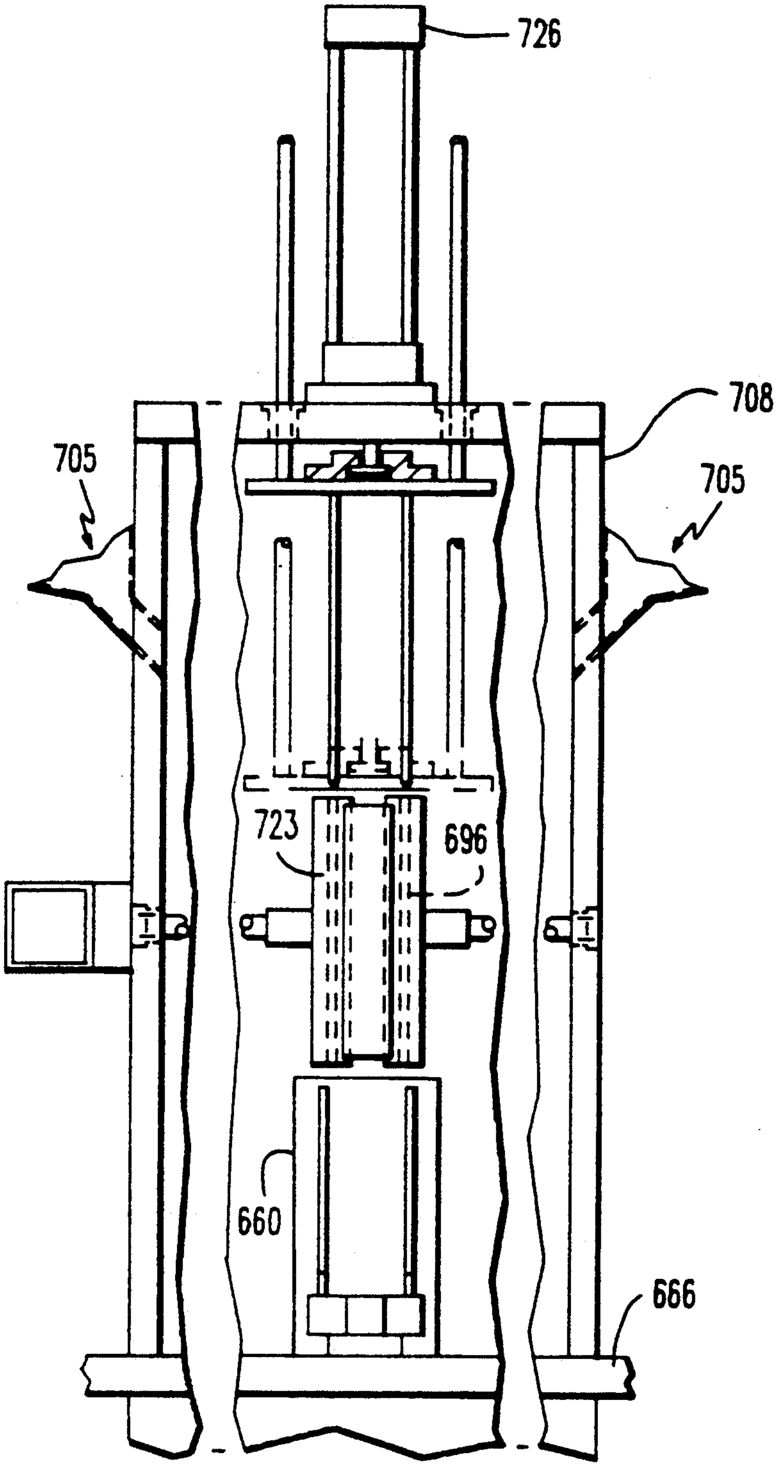
FIG. 40 is a front elevational view taken along the line XL—XL of FIG. 38.

At the next station 606, the securing pins 696, which are used to lock the loose lamination stack 660 into the finished collar pack 415, are inserted through holes 699 within the laminations 621 at the dual pin insertion station 606 (FIGS. 38–40). Preferably two pins 696 are utilized so as to securely hold the comb-shaped collar packs 415 in their precise dimensional configuration. The dual pin insertion station 606 includes a pair of surge hoppers 702 which hold a plurality of pins 696 for insertion into the collar lamination stacks 660. The pin insertion station 606 also includes a pair of vibratory feeders 705 such that a pair of securing pins 696 can be simultaneously delivered to a pin insertion magazine 708. As the securing pins 696 are delivered to the pin insertion magazine 708 from the vibratory feeders 705, they are received in a horizontal position. The pin magazine 708 includes a pair of rotary indexing drums 711, operated by rotary actuators 712, which receive the pins 696 and deliver them to the pin insertion station 606. The rotary indexing drums 711 include a pair of slots 714 to hold the pins 696, as they are rotated 180° to the pin unload position. Furthermore a transfer escapement mechanism 717 includes a dual arm 720 for pushing the pins 696 from each of the rotary indexing drums 711 to be inserted into the collar lamination stacks 660. As pins 696 are being unloaded from the rotary indexing drums 711, a second set of pins 696 is being inserted into the slots 714 on the opposite side of the drums 711 such that pins 696 are continually inserted and unloaded from the pin magazine 708. The horizontally disposed pins 696 next enter a second rotary actuator 723 which is then rotated 90 to orient the pins 696 in a generally vertical position. The pins 696 are then pushed downward, preferably by a pneumatic cylinder 726, into the loose collar lamination stacks 660.

The pins 696 can be easily inserted into the collaring lamination stacks 660 since the holes 699 in the laminations 621 have been correctly aligned by the collar stacking fixture 669. After the pins 696 have been inserted, the rotary indexing table 666 is then indexed again such that the collar packs 415 with the pins 696 inserted can be inspected at a second inspection station 615*b*. After the inspection is complete the table 666 will index again such that the lamination stack 660 with pins 696 inserted is indexed to the compression and peening station 609.

Figure 41:
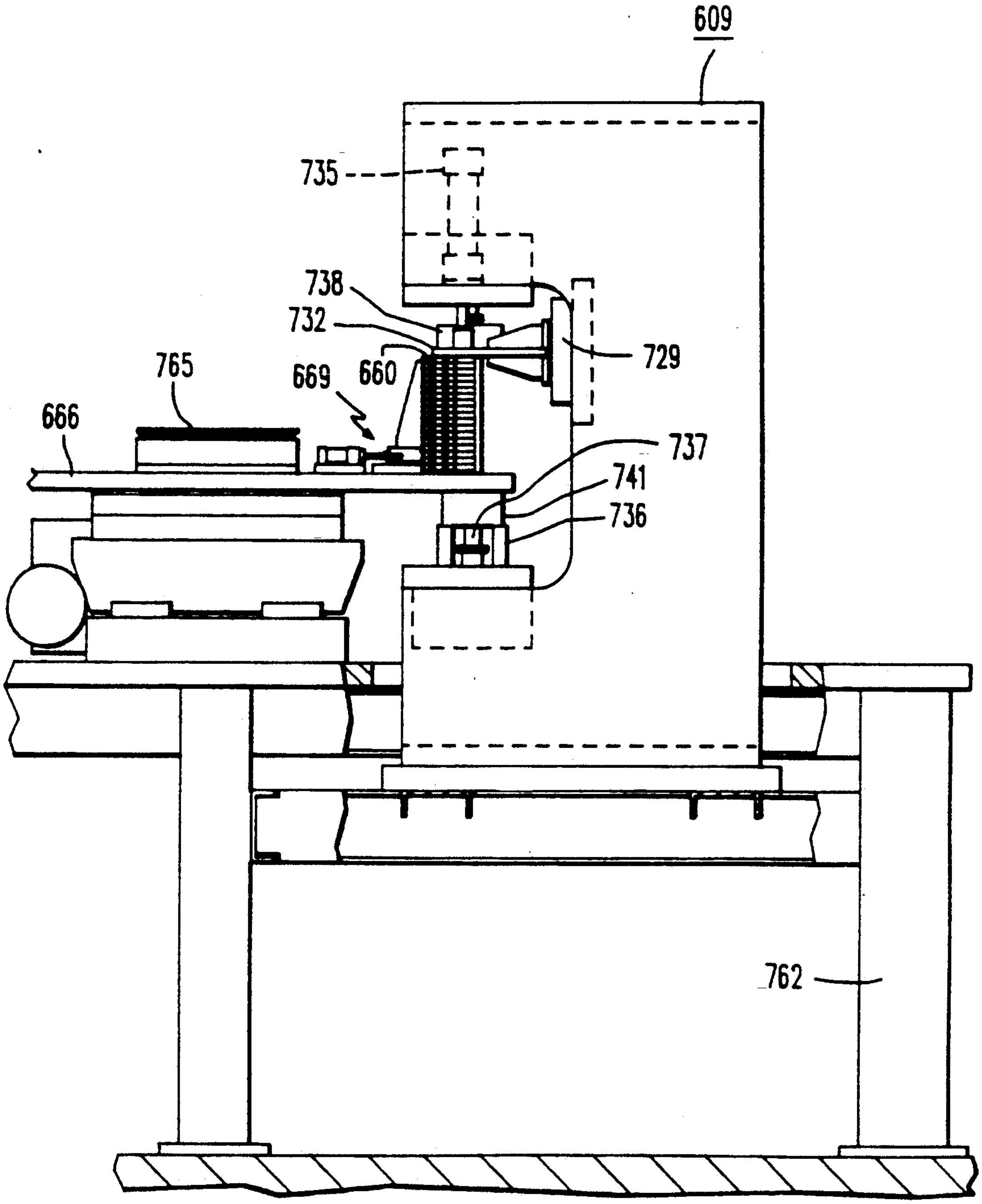
FIG. 41 is a side elevational view of a dual pin insertion and riveting station of the present invention, taken along the line LXI—LXI of FIG. 34.
Figure 42:
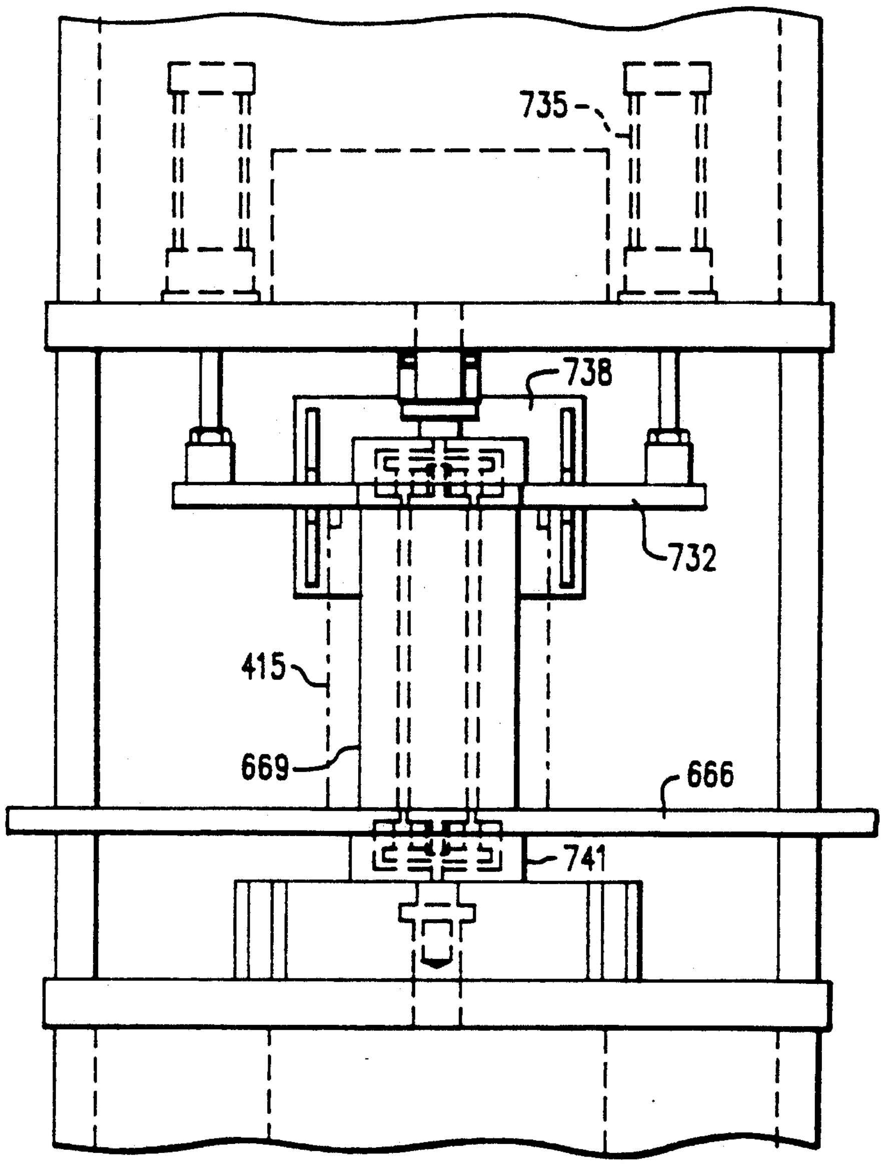
FIG. 42 is a front elevational view of the riveting station, taken along the line XLII—XLII of FIG. 41.

The dual pin compress and peening, or staking, station 609 (FIGS. 41 and 42) will provide finished collar packs 415 for use in the superconducting dipole magnet 61. When the loose collar lamination stack 660 with pins 696 inserted is in the proper position, the stack 660 is compressed by an arm 729 having a collar compressing plate 732 thereon. The pressing plate 732 is forced downward, preferably by a pair of vertically oriented pneumatic cylinders 735, such that the loose lamination stack 660 is brought to the required dimensional configuration. Support is provided from below by a pressure pad 736 and pneumatic cylinder 737. At this point both ends of the pins 696 are staked or peened such that a head is formed thereon so that the pins 696 cannot be removed and the finished collar pack 415 is secured in the precise dimensional configuration. Upper 738 and lower 741 staking units machine both ends of the pins 696 simultaneously (or rivets the pins 696), and insures that the pins 696 cannot be removed since a head is formed at both ends. This can be accomplished, for example, by an orbital forming machine supplied by Taumel and is disclosed in U.S. Pat. No. 3,173,281, which is incorporated herein by reference. When the machining has been completed, the rotary indexing table 666 is indexed so that the collar packs 415 can be inspected at the third inspection station 615*c*.

Figure 43:
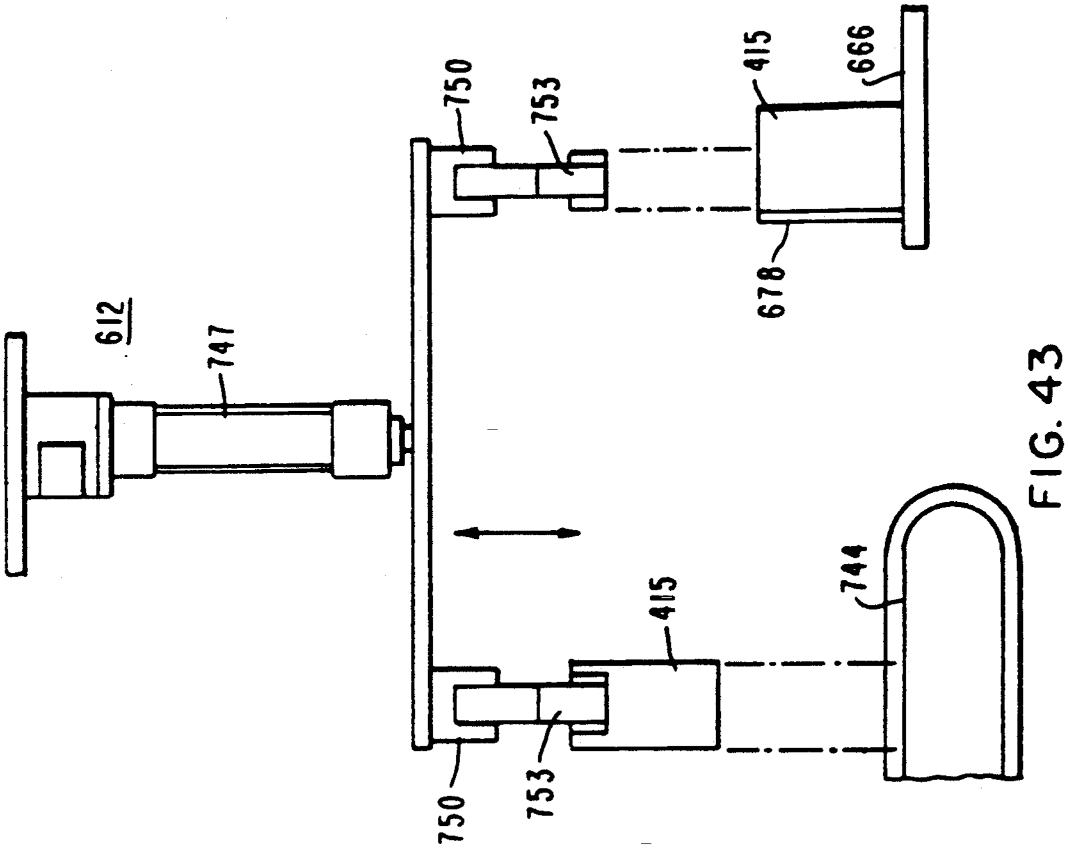
FIG. 43 is a side elevational view of a collar pack unload station taken along the line XLIII—XLIII of FIG. 34.
Figure 44:
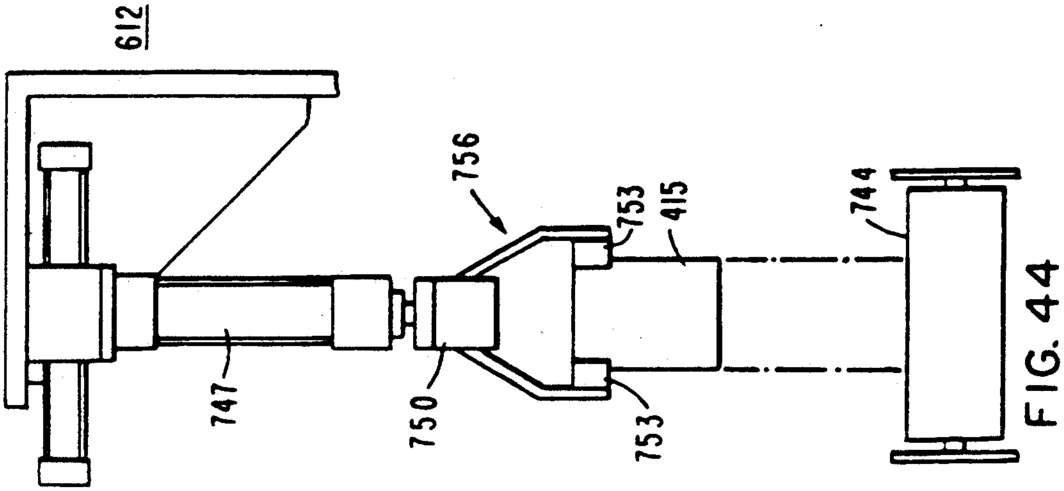
FIG. 44 is a front elevational view of the collar pack unload station.

At the final inspection station 615*c* the collar packs 415 are closely evaluated to insure that they fit the precise dimensional configuration. If a collar pack 415 is deemed to be unacceptable, it is removed from the rotary indexing table 666. Acceptable collar packs 415 remain thereon and the rotary indexing table 666 is rotated to the collar pack unload station 612. The collar pack unload station 612 (FIGS. 43 and 44) will remove the finished collar packs 415 from the rotary indexing table 666 and deliver them to an unloading conveyor 744 which in turn will deliver them for use in the collaring of the superconducting magnet 61. The unload station 612 includes a multi-motion actuator 747 which includes an angular gripper 750 at its lower end. The angular gripper 750 is double ended such that as one collar pack 415 is being unloaded onto the conveyor 744, a second collar pack 415 can be retrieved from the rotary indexing table 666. The gripper 750 is indexed downward into an open position (not shown) and the actuator 747 causes the gripper arms 753 to move together into a gripping position 756 to grasp the finished collar pack 415. The angular gripper 750 is then translated upward to remove the collar pack 415 from the rotary indexing table 666 and out of engagement with the collar stacking fixture 669. The multi-motion actuator 747 is then rotated 180°. to place the finished collar pack 415 onto the unloading conveyor 744. The actuator 747 is translated downward and the gripper arms 753 opened to release the collar pack 415. As was mentioned previously, simultaneous with the release of a finished collar pack 415, a second collar pack is being gripped from the rotary indexing table 666. The angular grippers 750 are then translated upward and the device rotated 180° to remove another finished collar pack 415.

Preferably all of the components of the collar pack assembly machine 600 are under the control of a Numalogic machine controller 759, manufactured by Westinghouse. Such automated operation will insure that precision collar packs 415 are supplied for the superconductor magnet 61, requiring conventional operator skills only. As is readily apparent, all four operations are to be performed simultaneously. That is, as laminations 621 are being stacked at the build station 603, pins 696 are being inserted into a completed stack 660 at the pin insertion station 606, a lamination stack 660 is being pressed and pins 696 being peened at the compression and stake station 609, and finally a completed collar pack 415 is being removed from the rotary indexing table 666 and placed on the unload conveyor 744 at the unloading station 612. Further, the three inspection stations 615*a*, 615*b*, 615*c* can be operated simultaneously and are provided to ensure that each of the stations of the collar pack assembly machine 600 are performing correctly. Should a nonconforming stack 660 be discovered at any of the stations, on a consistent basis, the assembly machine 600 can be shut down so as to realign any of the components which may be causing unacceptable collar packs 415.

The collar pack assembly machine 600 is installed on a modular machine base 762, as is commonly done in conventional machining apparatus. The rotary indexing table 666 is installed above the machine base 762 with an indexing drive 765 located therebetween. The rotary indexer 765 will deliver the lamination stacks 660 to the separate machining stations in their proper position so that the various operations can be performed to the necessary dimensional requirements. Also, preferably at the final inspection station 615*c*, the collar packs 415 are weighed. Since the collar packs 415 are constructed from materials having known dimensions, i.e., the stamped metal laminations 621 are of a certain thickness and weight as are the pins 696, the finished collar packs 415 can be checked for dimensional accuracy in both height and weight. Should the collar packs 415 not conform to both of these dimensional requirements, the collar pack 415 can be removed. With this type of automated lamination 621 dispensing, transport, positioning, stacking and compressing mechanism, completed collar packs 415 can be provided on the order of about once every two minutes. Since a typical superconducting coil 67 is to be approximately 16.5 m (54 ft) long, and an individual collar pack 415 is 15.24 cm (6 in) in height, approximately one hundred ten (110) collar packs 415 are needed for both the upper 418 and lower 421 collar assemblies of a coil 67; that is, approximately two hundred twenty (220) individual comb-shaped collar packs 415 for each superconducting magnet 61. Therefore, enough individual collar packs 415 can be assembled in one day, that is in a typical eight hour shift, to provide enough collar packs 415 for a completed superconducting magnet 61. By use of this device the collar packs 415 are then ready to be utilized in the coil collaring press 400 as described above. Thus, a precise collared coil 427 can be manufactured by use of precision collar packs 415 economically manufactured by use of the automated collar pack assembly machine 600 of the present invention.

YOKE STACKING APPARATUS FOR SUPERCONDUCTING MAGNETS

The collared coil 427 is then to be enclosed within the yoke assembly 94, through which coolant is conveyed through holes 91 so as to maintain the dipole magnet 61 at the optimum temperature for super-conductivity. It is first necessary to provide the yoke assembly 94 for this purpose.

Yoke Half Stacking Machine

In order to provide for a full-length yoke half, a yoke half stacking machine 800 of the present invention can be utilized. As shown in FIGS. 45–48, the yoke half stacking machine 800 provides an automatic lamination feeding, stacking, pressing and weighing assembly with a fixed stacking station in a shuttle-type bed. The main elements of the machine 800 are a yoke lamination pallet table 803; a down-end loading mechanism 806; a vertical lamination inserting mechanism 809; a transfer escapement mechanism 812; a vertical lamination stack inserting mechanism 815; and dual machine beds 818 and support stands 821 for horizontally stacking a full-length yoke half 824. Preferably the apparatus 800 is a dual machine such that a pair of yoke halves 824 can be simultaneously assembled.

Typically, yoke laminations 827 are stamped magnet steel laminations which are loaded into shipping pallets 830 after they are individually stamped, as is well known in the art. Generally, each pallet 830 contains about two thousand seven hundred (2700) individual laminations 827, which are arranged in a predetermined stacking arrangement within the pallet 830 for unloading purposes. Normally each pallet 830 will contain sufficient laminations 827 to provide for approximately a two hour and fifteen minute machine supply. The pallets 830 are loaded onto the yoke lamination pallet table 803, which is preferably a rotary indexing table, two (2) pallets 830 per table 803, and two (2) tables 803 per yoke half stacking machine 800. The rotary indexing pallet table 803 indexes 180° for a load/unload sequence. As one pallet 830 is being unloaded (typically by rows) an empty pallet can be removed from the opposite side and a new, full pallet loaded thereon. Once a fully loaded pallet 830 is placed on the table 803, it indexes the pallet 830 to a lamination stack unload position 833: and a lamination stack transfer mechanism 836 indexes to its start position via an overhead (x-y) servo-driven bridge crane-type positioning/robot pickup and place system 839. As shown in detail in FIGS. 46 and 47, the lamination stack pickup mechanism 836 is then indexed downward to a predetermined height. On its end a parallel gripper 845 is positioned to grip a lamination stack 848 and withdraw it from the pallet 830. Typically each stack 848 has approximately one hundred fifty (150) laminations 827 and is 72.39 cm (28.5 in) high, and weighs approximately 115 kg (253.5 lbs). Since each yoke half 824 is of a predetermined dimension, typically about 17 m (55 ft) long, the dimensions of each individual lamination 827 can be used as a control parameter whereby a predetermined number of laminations 827 can be arranged to form the complete, full-length yoke half 824.

Figure 45:
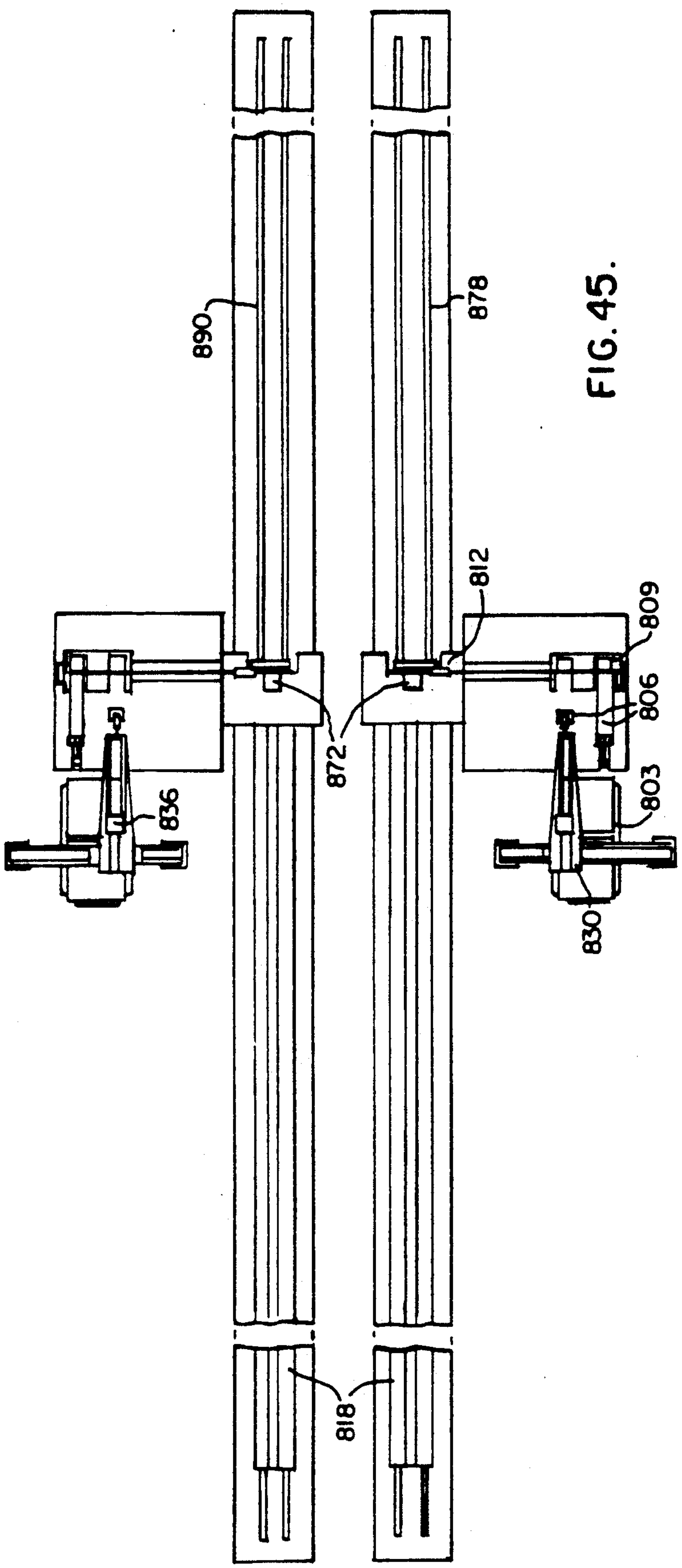
FIG. 45 is a top plan view of a yoke half stacking machine of the present invention.
Figure 46A:
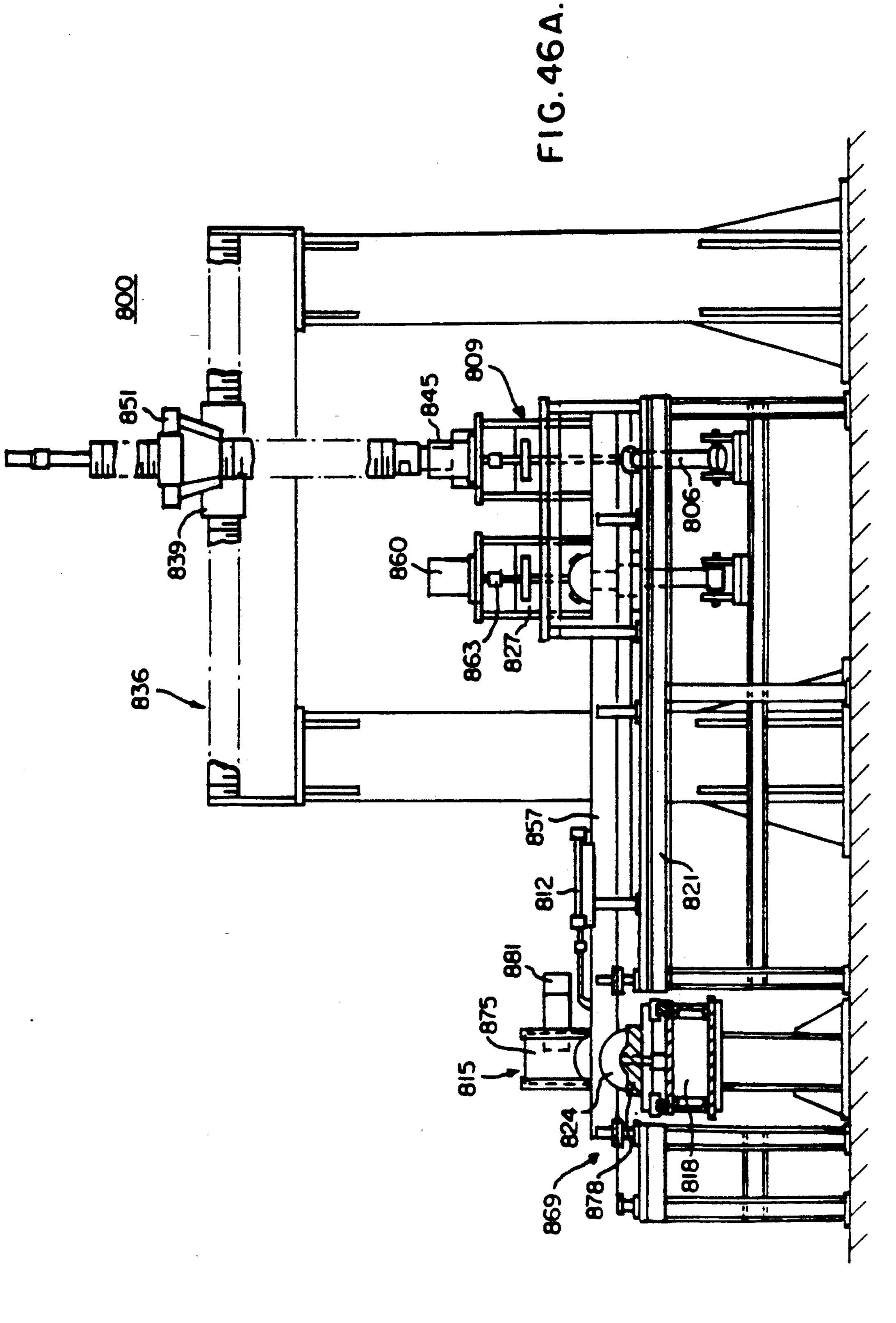
FIG. 46 is a side elevational view of the yoke half stacking machine taken along the line XLVI—XLVI of FIG. 45.
Figure 46B:
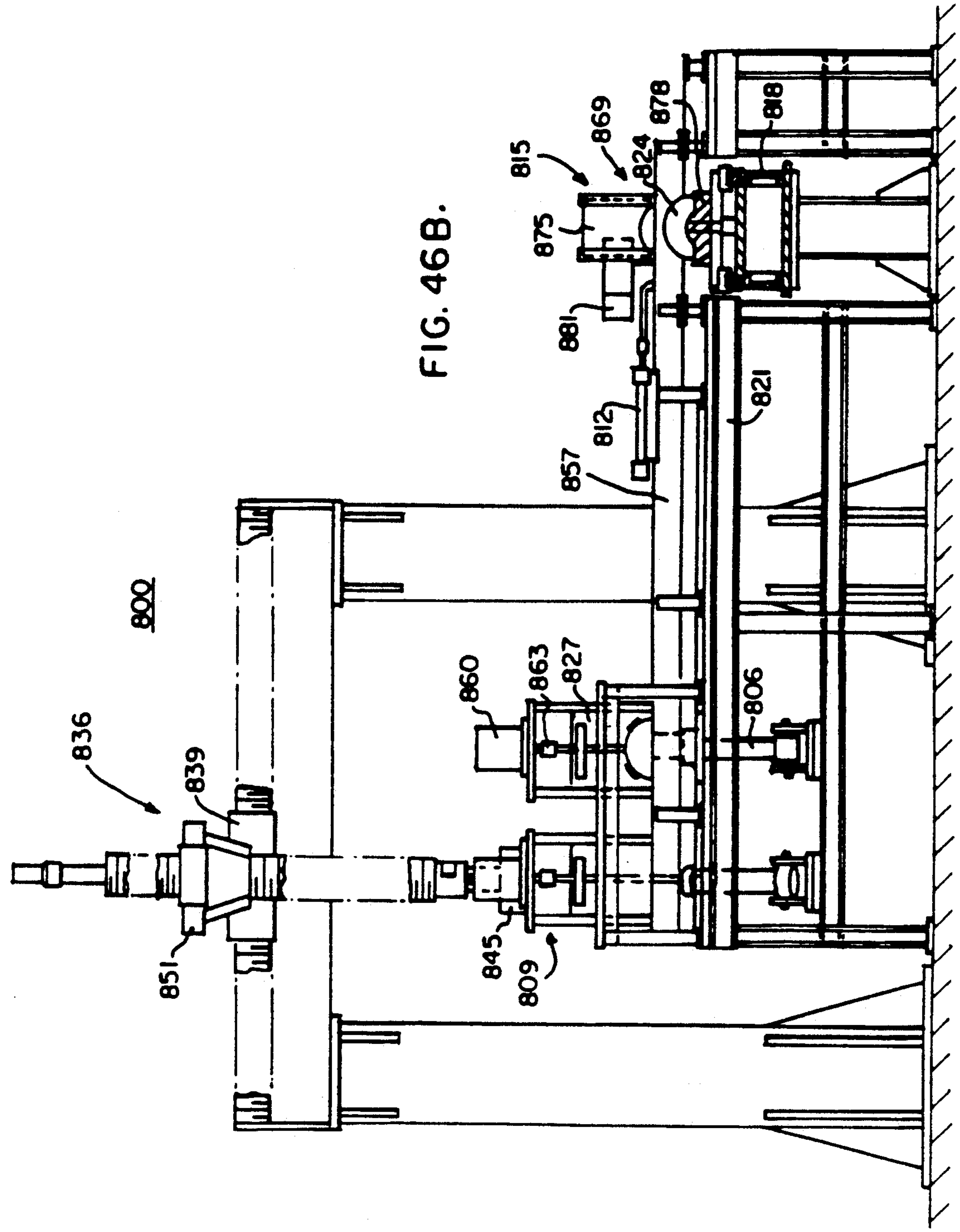
Figure 47:
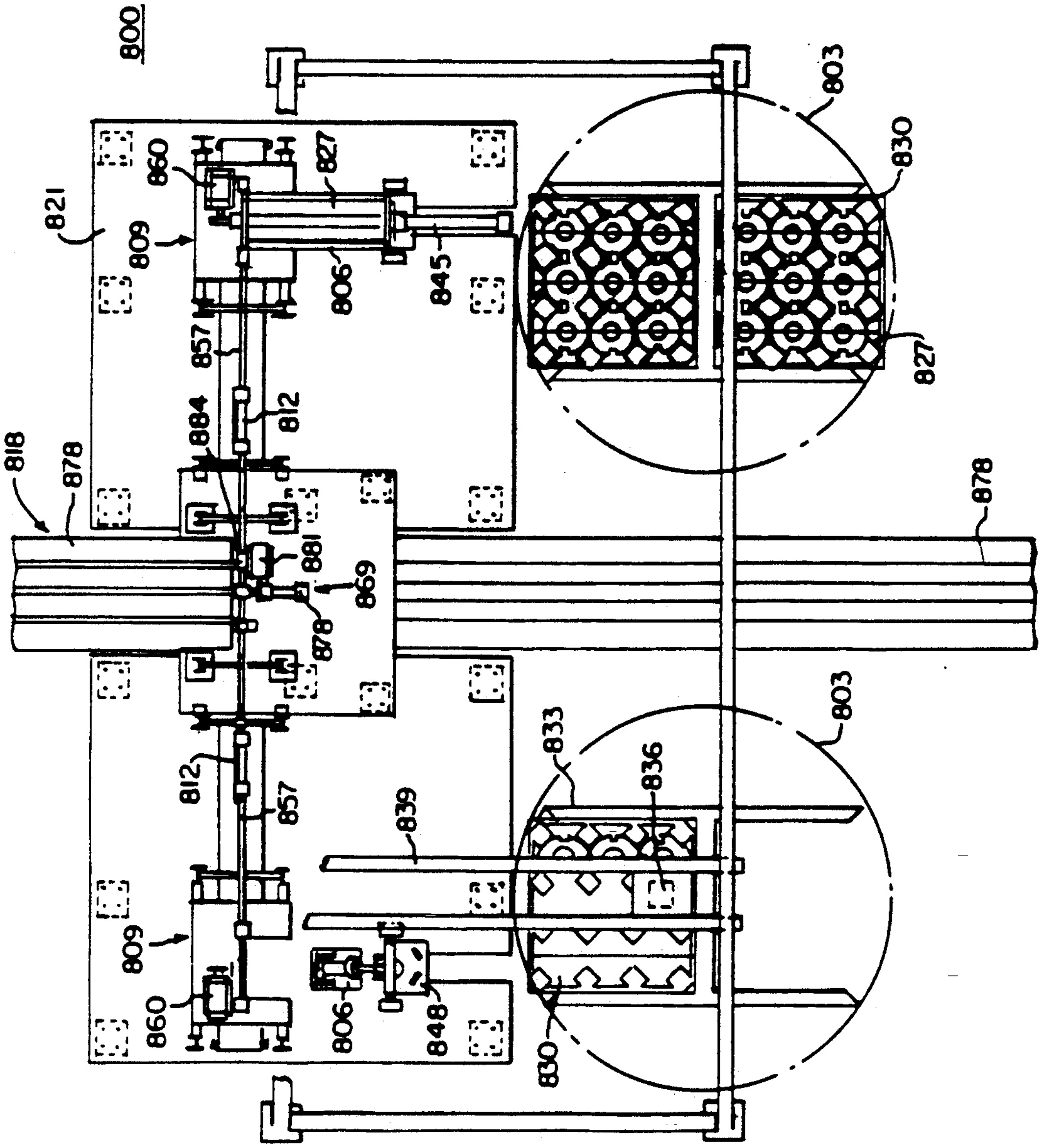
FIG. 47 is a top plan view of a yoke lamination infeed mechanism.
Figure 48:
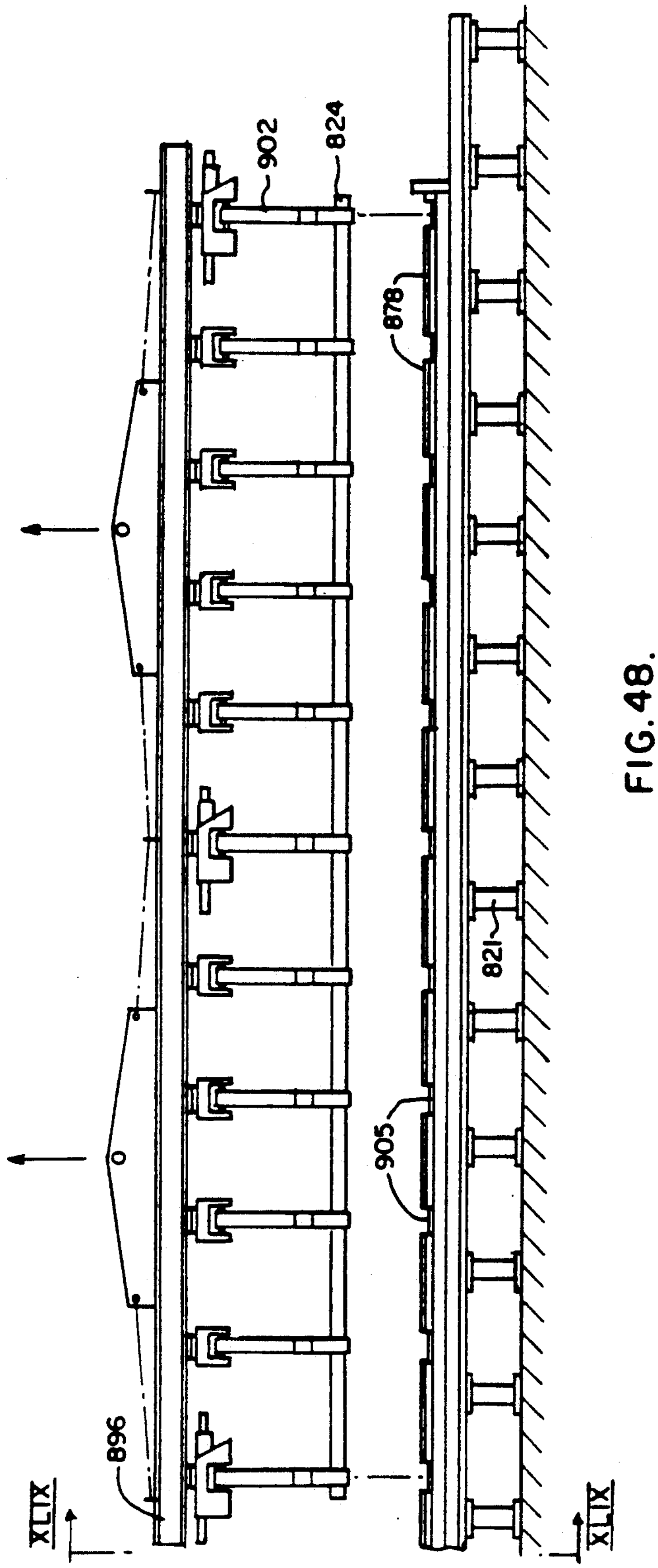
FIG. 48 is a side elevational view of a strong back lifting fixture for lifting a full-length yoke half.

The lamination stack pickup mechanism 836 is then positioned to a preprogrammed (x-y) coordinate so as to place the stack 848 on the vertical-to-horizontal down-end loader 806. As the pickup mechanism 836 lowers the stack 848, the parallel grippers 845 are rotated plus or minus 90° by means of a rotary actuator 851 in order to properly orient the lamination stack 848 for positioning on the down-end loader 806. As seen in FIG. 45, yoke laminations 827 are typically stacked in the pallets 830 in two (2) different positions, commonly referred to as right-hand and left-hand. This allows an optimum number of yoke laminations 827, which are typically C-shaped, to be placed within a square pallet 830. (One stack 848 equals approximately 7.5 minutes of machine running time.) The C-shaped laminations 827 are placed on the down-end loader 806 which is then lowered from the vertical to a horizontal unloading position. The horizontal down-end loader 806 includes a horizontal pushing cylinder 854 which will index approximately 4.83 cm (1.90 in), the typical lamination 827 thickness, at a time, sending the laminations 827 to the vertical lamination inserting mechanism 809.

Laminations 827 are thus transferred, one by one, out of the vertical lamination inserting mechanism 809 that forces laminations 827 out of the holding area onto a transfer conveyor 857, such as by a servo-motor 860 with a rack and pinion 863 and transfer gate 866. The gate 866 is then returned upward to the load position and another lamination 827 inserted. The individual C-shaped laminations 827 travel on the transfer conveyor 857 to a stacking area 869 and are then transferred to the vertical lamination stack inserting mechanism 815 via the transfer escapement mechanism 812, loading one (1) lamination 827 and returning to pre-load another.

With the lamination 827 loaded in the vertical lamination stack inserting mechanism 815, a second lamination inserting gate 875 forces the single yoke lamination 827 out of the holding area onto the machine bed 818, having a magnetic stacking fixture 878. Preferably, this is accomplished via a servo-motor 881 with a rack and pinion 884. The inserting gate 875 is then returned to the load position and another lamination 827 is inserted at a rate of approximately one thousand two hundred (1200) laminations 827 per hour. Once the yoke lamination 827 is inserted onto the stacking fixture 878, a positioning mechanism 887 engages and lightly taps the lamination 827 and seats it, initially against a stop (not shown) and then against each lamination 827 thereafter. The machine bed 818 is then indexed forward the thickness of a lamination 827, such as via a servo-driven motor with a rack and pinion arrangement (not shown). The machine bed 818 is allowed to index freely due to the use of linear motion slides and rails 890 installed underneath. Moreover, the weight of the yoke half 824, as each lamination 827 is individually, horizontally stacked on the fixture 878, may be constantly displayed at an operator station.

Figure 49:
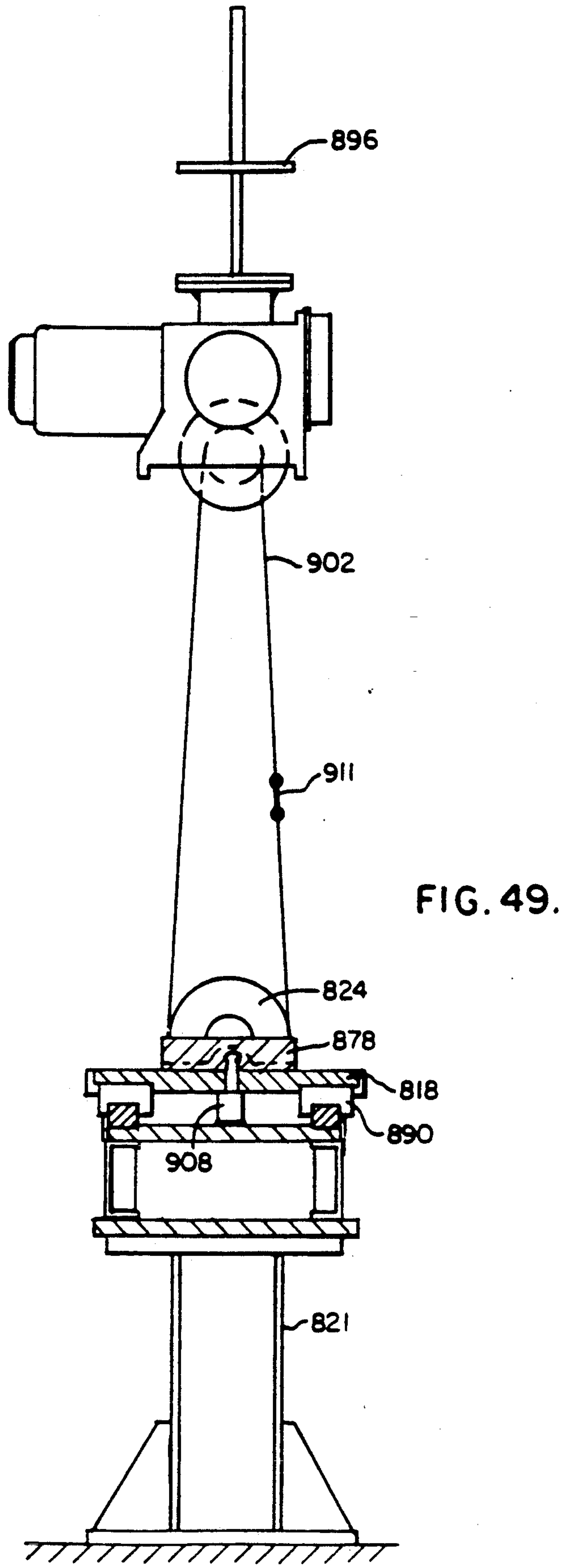
FIG. 49 is a view taken along the line XLIX—XLIX of FIG. 48.
Figure 50:
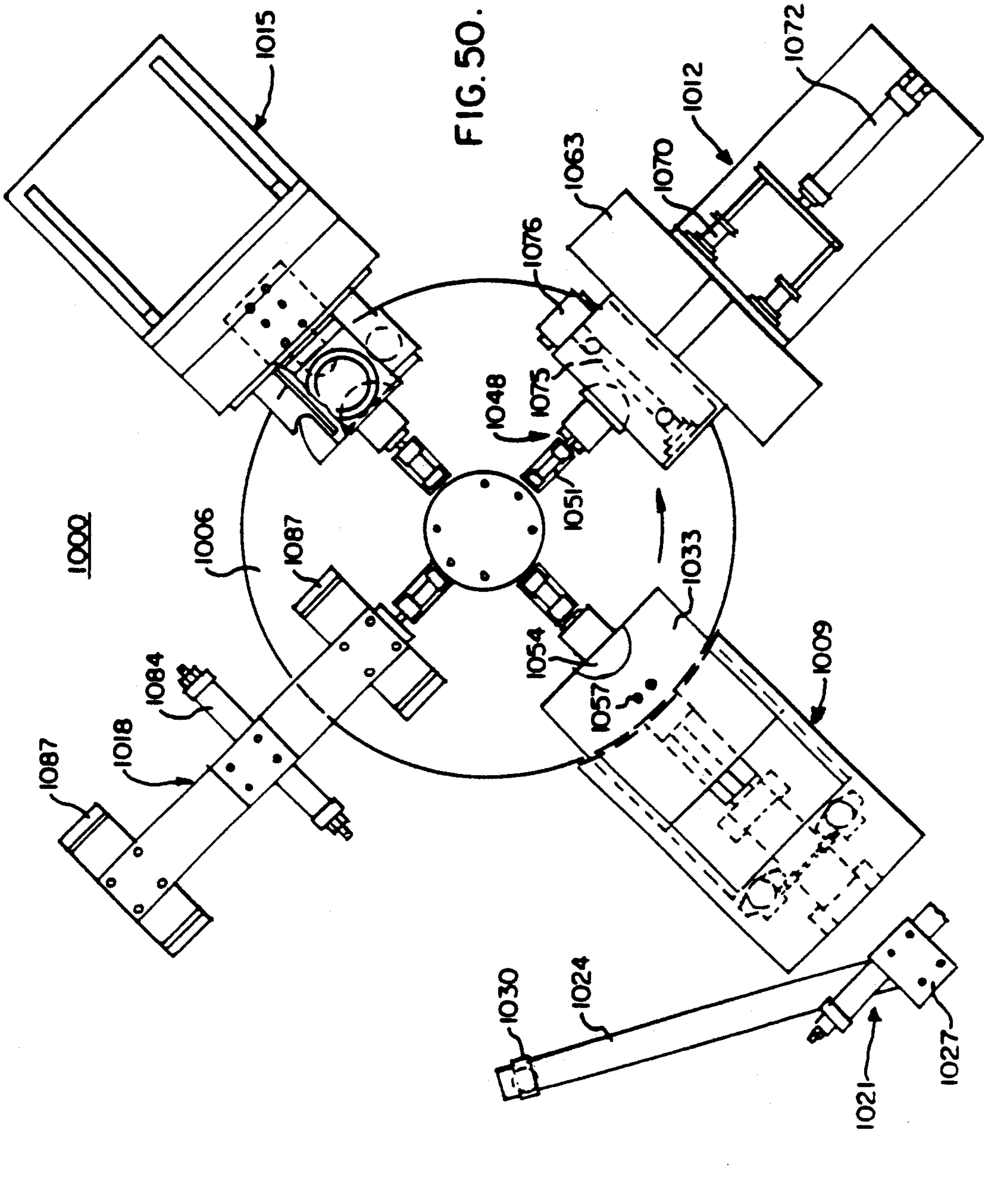
FIG. 50 is a top plan view of an alternate embodiment of the yoke stacking apparatus, a yoke pack assembly machine.
Figure 52:
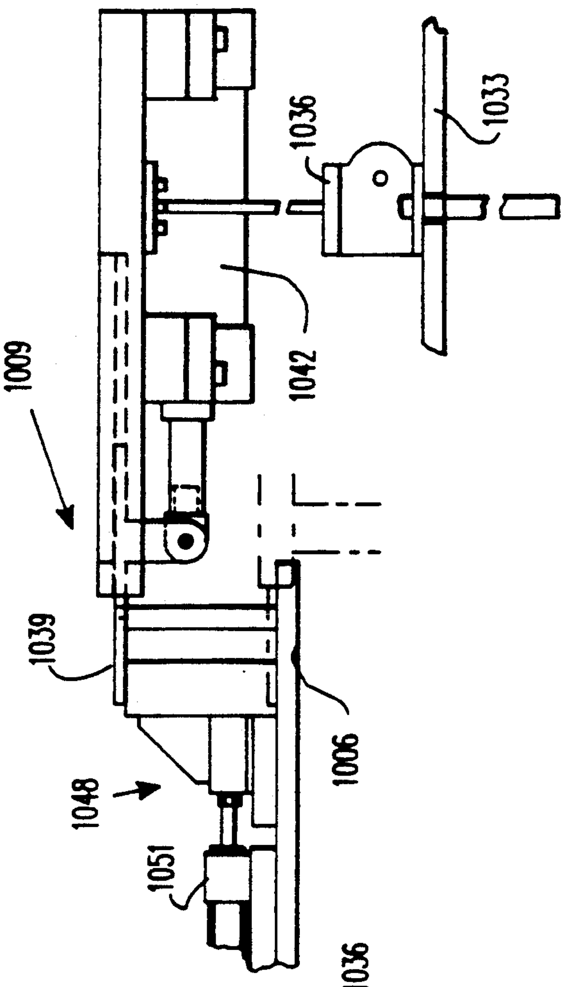
FIGS. 51 and 52 are detailed views of a yoke pack build station.
Figure 51:
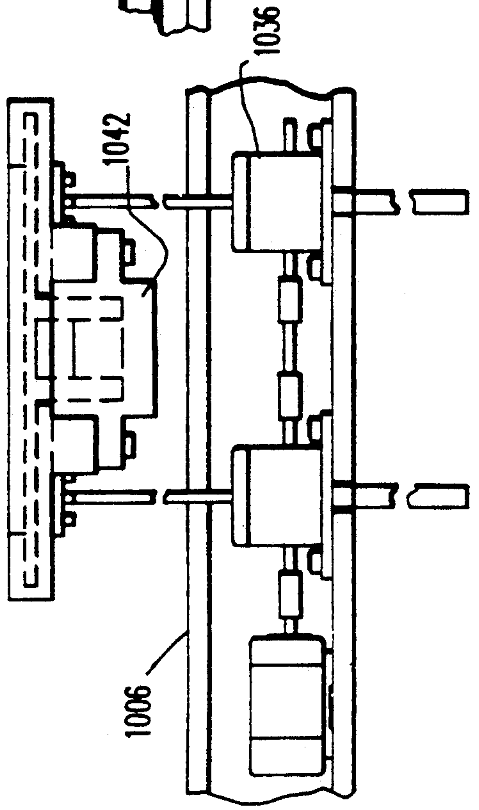

Operation continues until a full-length yoke half assembly 824 is completed (generally comprising about 3337 lamination), at which time tie rods (not shown) are inserted through the individual holes 91 within the laminations 827 and temporarily held in place by nuts threaded thereon at their ends. The holes 91 within the yoke laminations 827, when incorporated into the superconducting magnet 61, are utilized to permit the passage of coolant therethrough. Typically the holes 91 are about 0.95 cm (0.375 in) in diameter. The tie rods and nuts are used as a temporary securing means until the yoke half 824 is transferred to an assembly station for the superconducting magnet 61, as disclosed hereinafter. After the tie rods have been secured the full-length yoke half assembly 824 is removed utilizing a strongback lifting and handling fixture 896 (see FIGS. 48–49), and the machine bed 818 reverses and travels back to the start position. By following the above steps complete, full-length yoke halves 824 can be constructed on a large-scale manufacturing basis.

At predetermined points along the machine bed 818, indentations 899 are provided therein such that when the full-length yoke half 824 is constructed, the strong back lifting fixture 896 having a plurality of lifting slings 902 thereon can be used to completely lift the full-length yoke half 824 from the machine bed 818. The lifting slings 902 are slipped under the yoke half 824 and above the machine bed 818 at the indentations 899, and secured to the strongback lifting fixture 896. The full-length yoke half 824 can then be lifted from the machine bed 818 without placing undue stress on the yoke half 824.

The indentations 899 are provided by splice/spacer bars 905 on the underside of the machine bed 818, preferably these bars 905 being activated or retracted by compact air cylinders 908, typically eleven (11), associated therewith. The lifting slings 902 have metal disconnect links 911 thereon so as to provide for ease of removal and insertion underneath the yoke half 824.

By use of the yoke half stacking machine 800, an automated, large-scale assembly apparatus is provided for the economical production of full-length yoke halves 824. Robotic unloading of pelletized laminations, along with the automation of all yoke lamination handling and transporting mechanisms, provides for full-length yoke halves 824 which can be constructed to the desired tolerances needed for the superconducting magnet 61 of the particle accelerator. Since the dimensions of each lamination 827 are known, stacking density is controlled through counting of laminations and automatic weighing. The special lifting device 896 for the yoke half 824 unloading and manipulating provides the full-length yoke half 824 and positions it at further assembly stations. Each function is mechanized and automated and can be placed under the control of a programmable, microprocessor based controller such that conventional operator skills only are required. It should be noted that this type of manufacturing procedure may also be utilized in the building of full-length collaring members 70. If desired, this process may be utilized in place of building individual collar packs 415 as disclosed above. In this manner, the collaring laminations 621 can be stacked to form a full- length collaring member 70 and through-bolts inserted through the holes 699 in which the pins 696 would otherwise be inserted in constructing the collar packs 415. Pressing and keying 433 of the full-length collaring members would again be used to secure the collared coil 427, as discussed above.

Yoke Pack Assembly Machine

As an alternative method of providing the yoke assembly 94 for the superconducting magnet 61, a yoke pack assembly machine 1000 of the present invention can be utilized. As shown in FIGS. 50-61, the yoke pack assembly machine 1000 provides an automated machine system to produce individual yoke packs 1003 from the stamped magnet steel laminations 827, stacked to a prescribed height and density which are then made an entity with the automatic insertion and peening of longitudinal through-tubes. This system is similar to the collar pack assembly machine 600 discussed above.

The yoke pack assembly machine 1000 comprises as its main elements a rotary indexing table 1006, a yoke pack build station 1009, a dual pin inserting station 1012, an orbital head forming station 1015, and a yoke pack unload station 1018. As with the yoke half assembly machine 800, prior to the yoke pack build station 1009, a yoke lamination pallet table 803 is provided. As before, the individual laminations 827 are stacked within the pallet 830 which is placed on the rotary pallet table 803. However, the lamination stack 848 does not have to be transferred to a horizontal orientation as before. As the lamination stack 848 is raised by the stack pickup mechanism 836, a stacking mechanism 1021, preferably having six (6) arms 1024, sequentially lifts a single lamination 827 from the ascending stack 848, and transfers it to the yoke pack build station 1009. Preferably, the stacking mechanism 1021 comprises a multi-motion actuator 1027 having a vacuum cup or parallel gripper 1030 on the end of each arm 1024 so as to retrieve a single lamination 827 from the stack 848 and place it at a stacking platform 1033 on the rotary indexing table 1006. As shown in detail in FIG. 51, the yoke pack build station 1009 stacking platform 1033 includes a machine screw actuator 1036 which vertically orients an indexing stacking plate 1039. As each individual lamination 827 is stacked on the stacking plate 1039, the machine screw actuator 1036 causes the stacking plate 1039 to be indexed downward the thickness of an individual lamination 827, which is typically 4.83 cm (1.90 in). After a predetermined number of laminations 827 are stacked on the rotary index table 1006, a pneumatic cylinder 1042 is actuated to retract the indexing stacking plate 1039 out of engagement with a loose lamination stack 1045.

Figure 53:
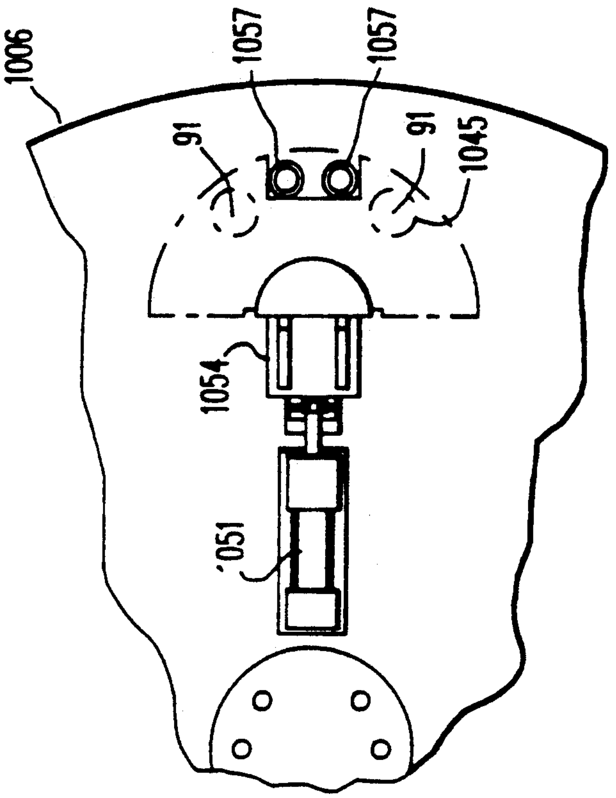
FIG. 53 is a top plan view of a yoke pack locating fixture.

Preferably, the rotary indexing table 1006 includes a plurality, preferably four (i.e., equal to the number of manufacturing stations), of yoke pack locating fixtures 1048 (FIG. 53). Each yoke pack locating fixture 1048 includes a pneumatic cylinder 1051 having on its end an arcuate stacking member 1054 which conforms to the inside diameter of the C-shaped laminations 827. Projecting upward from the rotary indexing table 1006, opposite the arcuate stacking member 1054, is a pair of yoke stacking guide pins 1057, such that the individual laminations 827 are stacked on the rotary indexing table 1006 between the adjustable locating member 1054 and the stacking guide pins 1057. When the predetermined number of laminations 827 are thus loosely stacked 1045 on the rotary indexing table 1006 and the indexing stacking plate 1039 is withdrawn, the lamination locating fixture 1048 pneumatic cylinder 1051 is extended, thereby seating the yoke laminations 827 between the adjustable locating member 1048 and the guide pins 1057.

Figure 54:
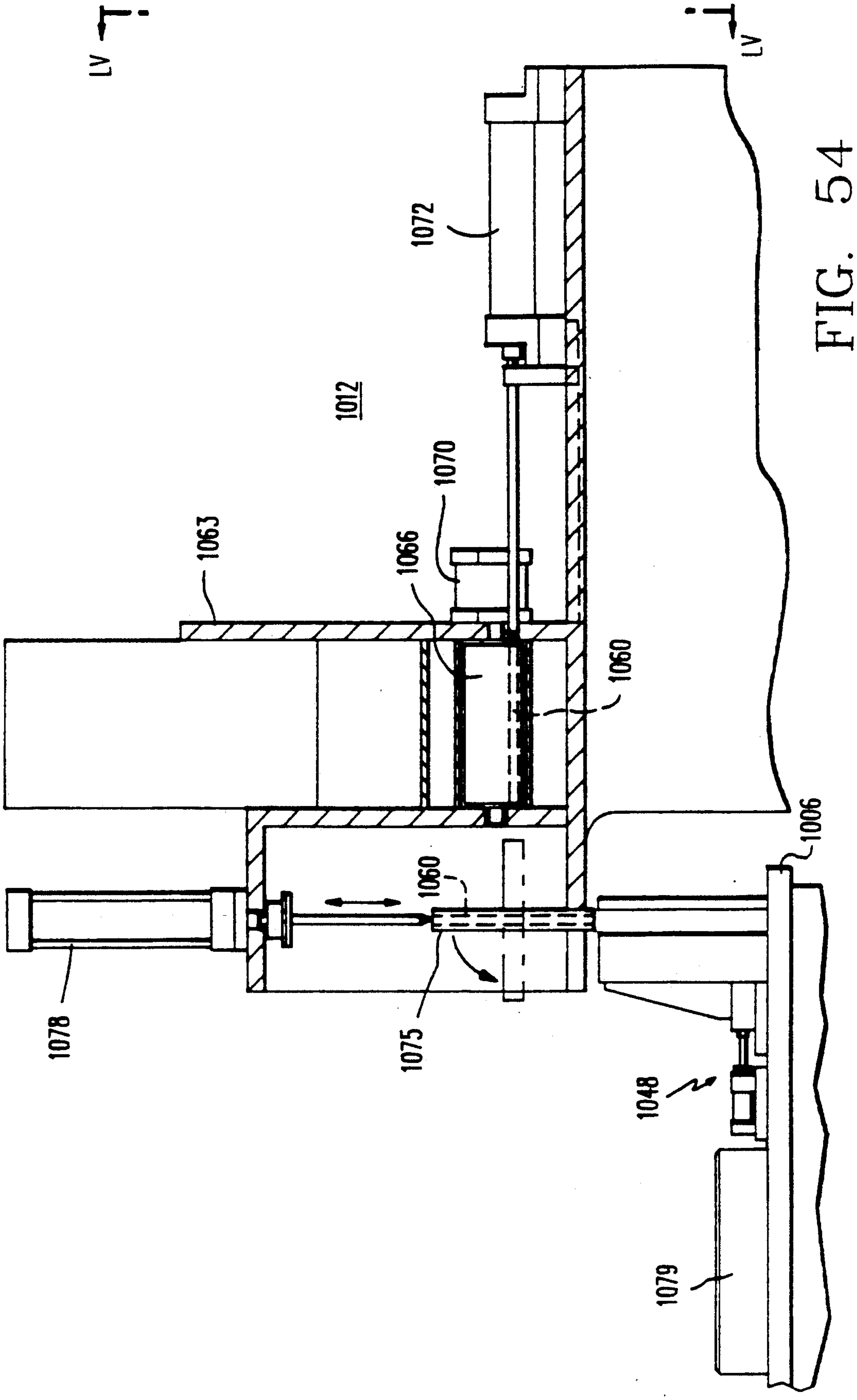
FIG. 54 is a detailed view of a dual pin insert station.
Figure 55:
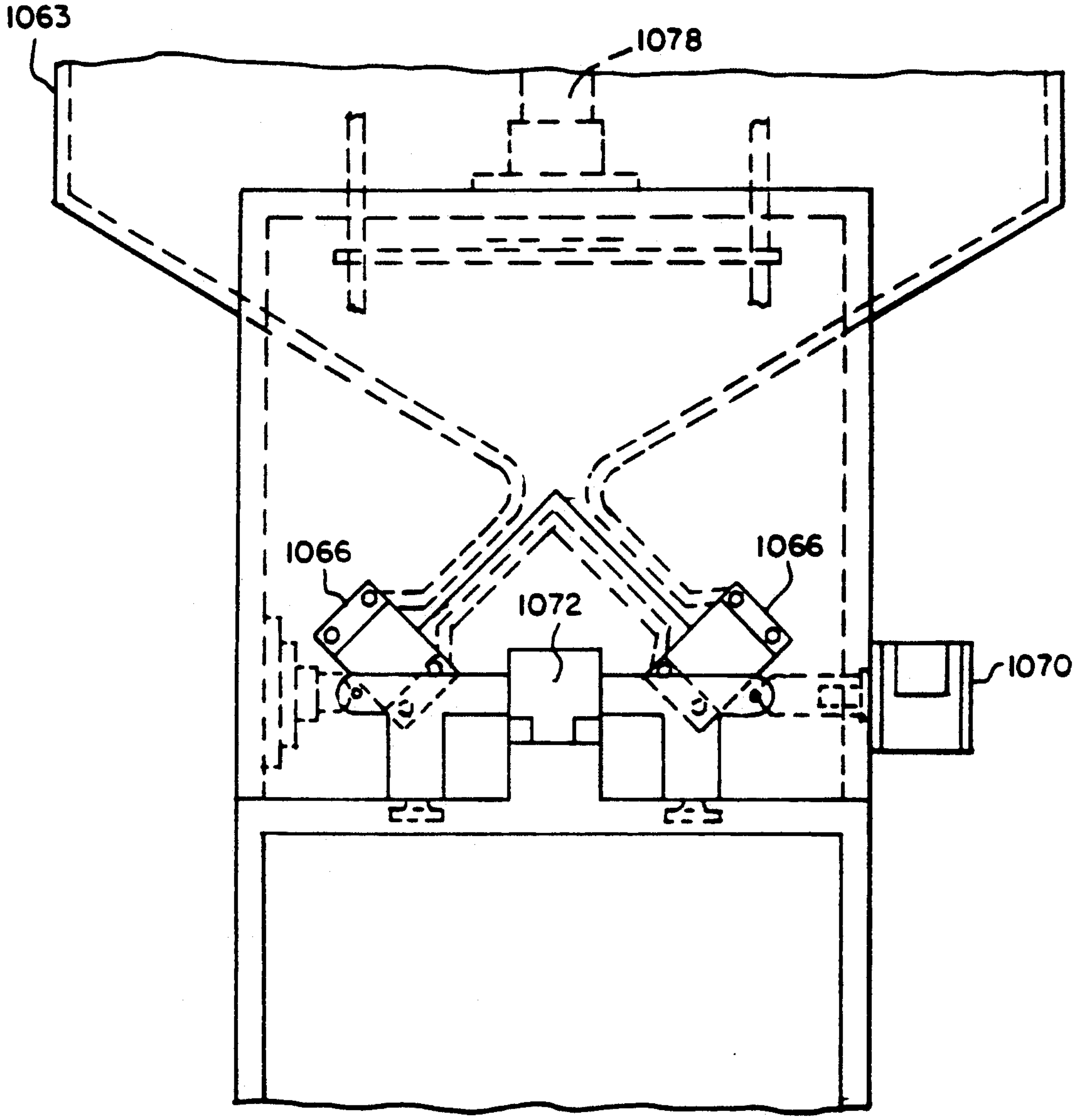
FIG. 55 is a cross-sectional view of a pin magazine taken along the line LV—LV of FIG. 54.

When the desired number of laminations 827 are thus stacked on the rotary indexing table 1006, it is then indexed to position the loose stack 1045 of yoke laminations 827 at the dual pin inserting station 1012 (see FIG. 54). The securing pins for the yoke stack 1045 comprise hollow tubular elements 1060 which are inserted into the holes 91 within the yoke laminations 827. A pin magazine 1063 holding a plurality of tubular elements 1060 will place a pair of pins 1060 within a pair of rotary drums 1066 so as to position the tubes 1060 for insertion into the loose lamination stack 1045. Rotary drums 1066 have slots 1069 therein separated at 180 such that as a pair of pins 1060 are being unloaded therefrom, another set can be loaded into the slot 1069 on the opposite end. The rotary drums 1066 with pins 1060 therein is rotated 180° by rotary actuator 1070 and pneumatic cylinder 1072 is operated to push the horizontally-disposed pins 1060 into a second rotary drum 1075. This second rotary drum 1075 is then rotated 90° by a second rotary actuator 1076 to place the tubular elements 1060 in a vertical orientation. Then a second pneumatic cylinder 1078 is operated to insert the tubular pins 1060 into the loose stack 1045 of laminations 827. It is important that tubular pins 1060 are utilized so that the finished yoke packs 1003 will still include the holes 91 therein such that, when finished yoke packs 1003 are assembled so as to form a full-length yoke assembly 94, a full-length passageway for coolant is provided therein. After the pins 1060 have been inserted into the lamination stack 1045, the rotary indexing table 1006 is then activated by drive mechanism 1079 to place the loose stack 1045 with tubular pins 1060 inserted at the orbital head forming station 1015.

Figure 56:
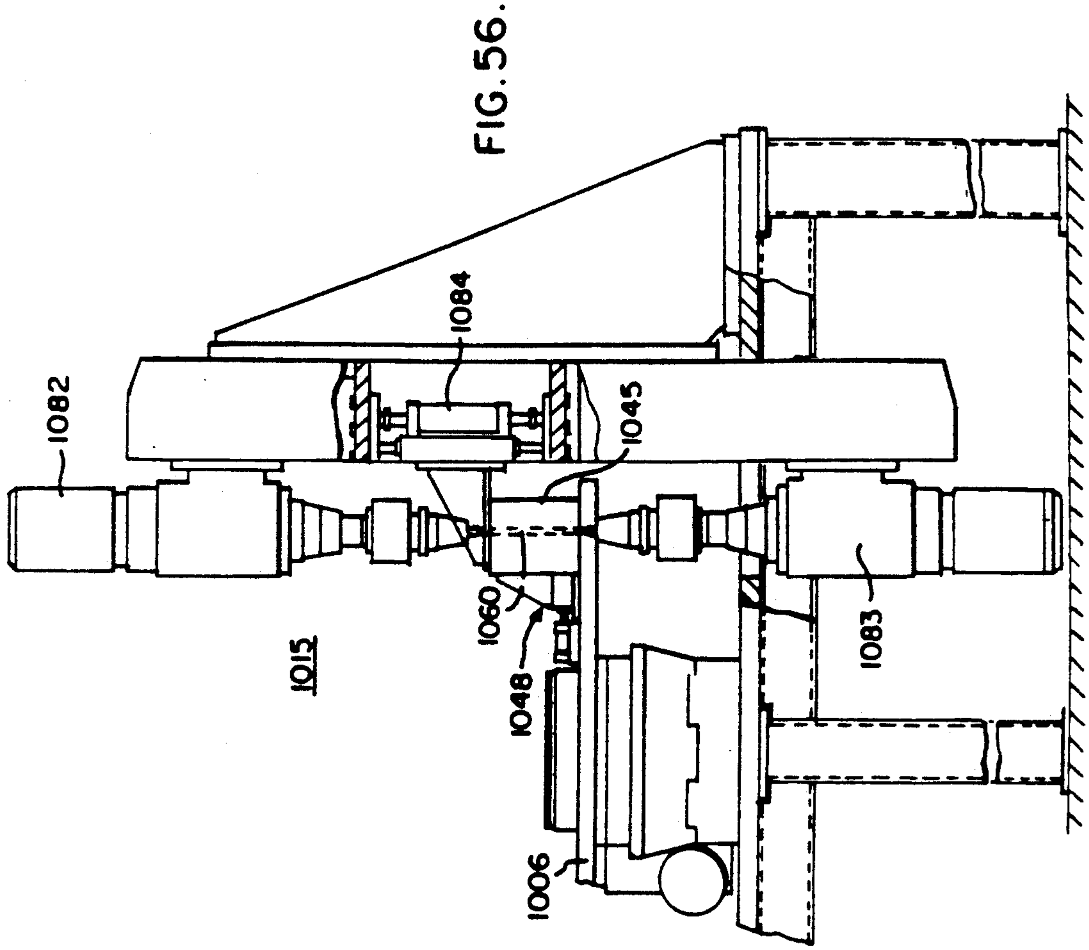
FIGS. 56–57 are detailed views of a dual pin head forming station.
Figure 57:
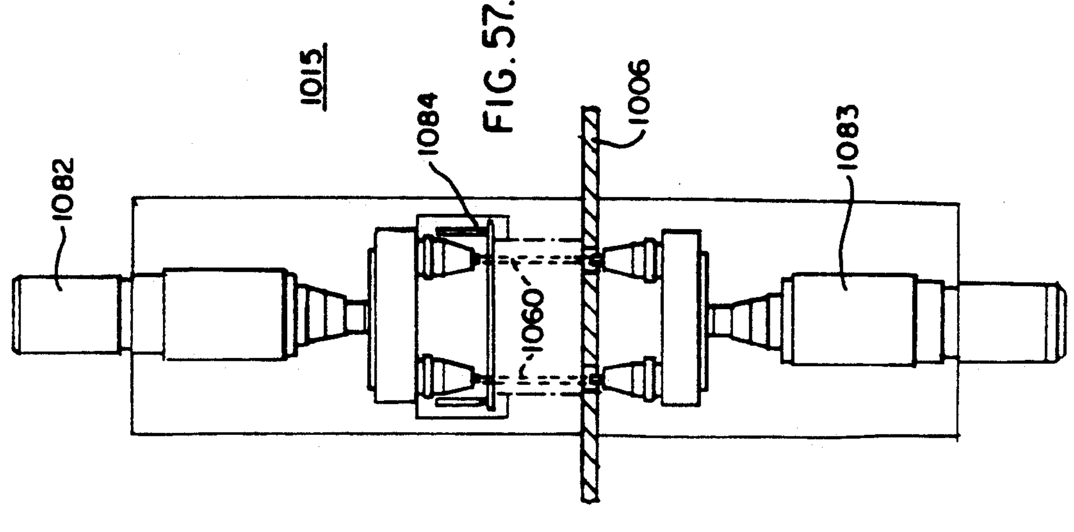
Figure 59:
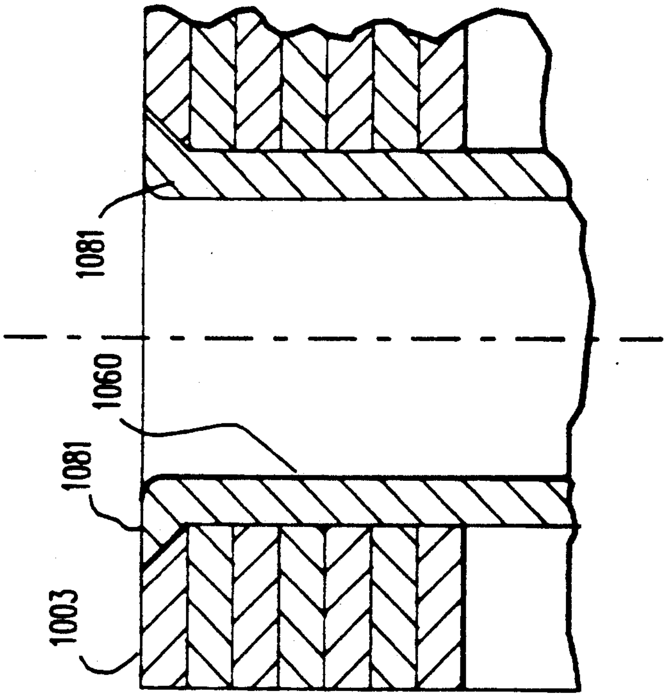
FIGS. 58–59 are detailed views of pin ends before and after forming.
Figure 58:
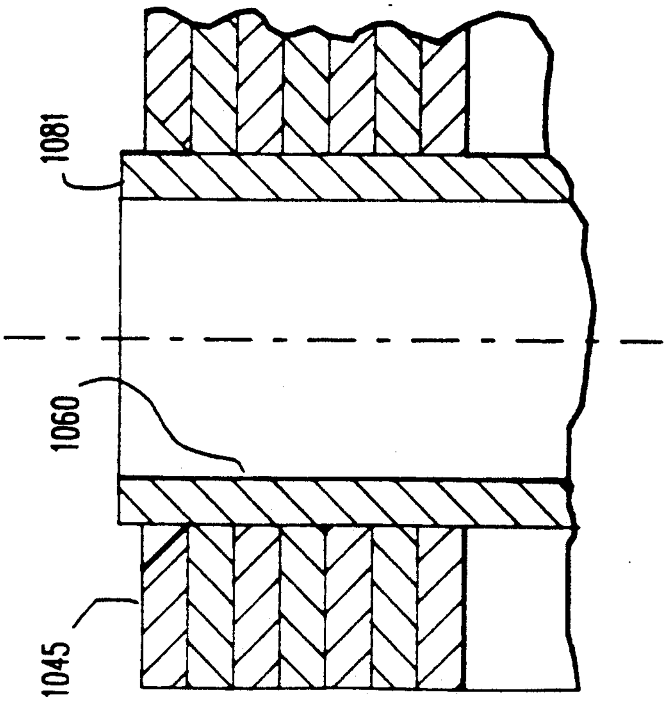

At the head forming station 1015 shown in FIGS. 56 and 57, each end or head 1081 of the tubular pins 1060 is orbitally machined (riveted) by upper 1082 and lower 1083 orbital head forming units such that the pins 1060, which are slightly larger than the lamination stack 1045, are mechanically deformed at their ends 1081 so as to be secured between the ends of the lamination stack 1045. Also, the ends 1081 of the pins 1060 are made flush with the lamination stack 1045. See FIGS. 58 and 59. Prior to the orbital forming, the lamination stack 1045 is compressed to the desired height by a slide unit 1084. In this manner, after the forming of the heads 1081 so as to capture the laminations 827 therebetween, the stack 1045 of laminations 827 is prevented from loosening. A typical lamination stack 1045 is approximately 15.24 cm (6 in) in height.

Figure 61:
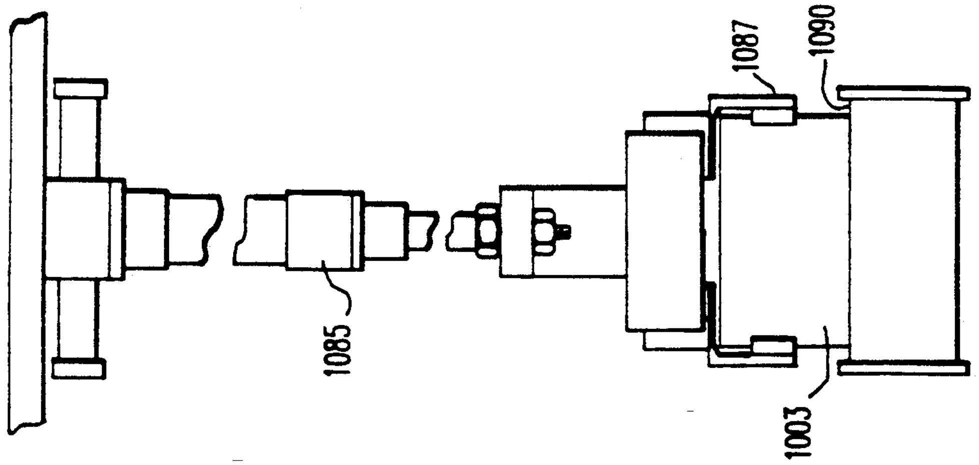
FIGS. 60 and 61 are detailed views of a yoke pack unloading station.
Figure 60:
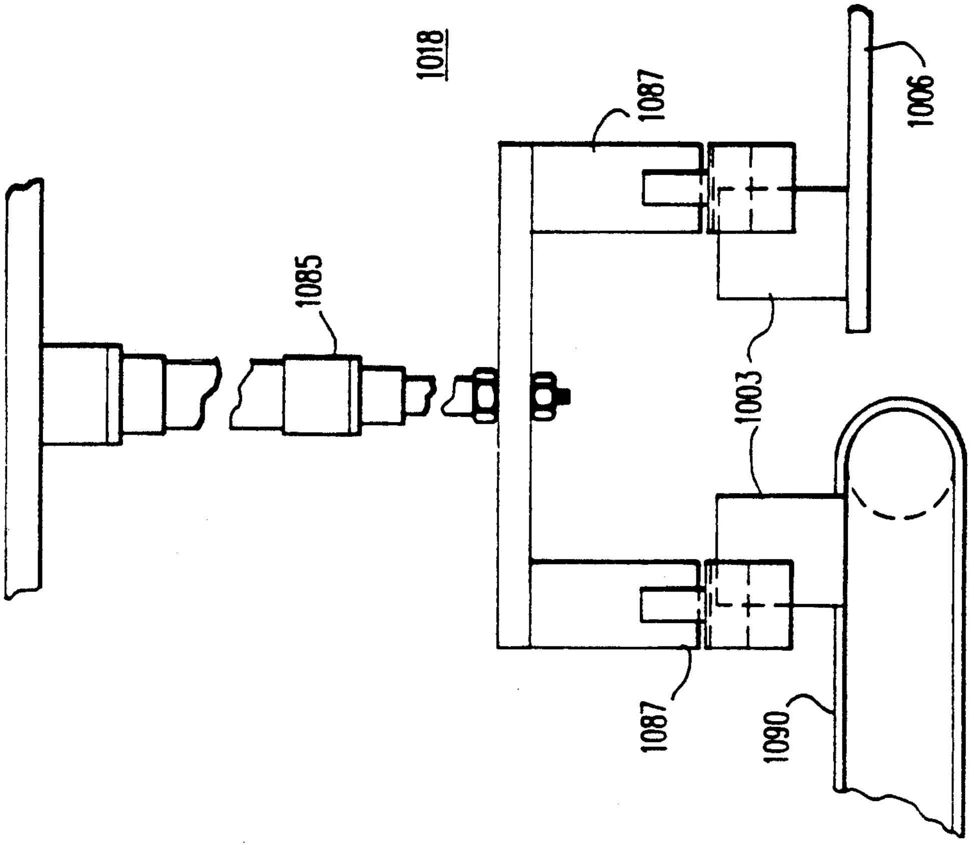

After the forming or peening of the tube ends 1081, a completed yoke pack 1003 is thereby provided. The rotary indexing table 1006 is then indexed to place the completed yoke pack 1003 at the yoke pack unloading station 1018 (FIGS. 60-61). A multi-motion actuator 1085 having dual grippers 1087 thereon is used to remove the yoke pack 1003 from the rotary indexing table 1006. Preferably a pair of pneumatically-operated parallel grippers 1087 is positioned over the yoke pack 1003, and activated to grip the yoke pack 1003. At this point the yoke stack locating fixture 1048 has been retracted. The multi-motion actuator 1085 is then activated to lift the yoke pack 1003 from the rotary indexing table 1006, and is then caused to rotate 180° to place the yoke pack 1003 on an unload conveyor 1090. Simultaneously therewith, a second yoke pack 1003 can be removed from the rotary indexing table 1006 by the twin gripper 1087 on the opposite end of the multi-motion actuator 1085.

After the individual yoke packs 1003 have been assembled, they can be configured into a full-length yoke half 824. Since each yoke pack 1003 is typically about 15.24 cm (6 in) long and a yoke half is approximately 17 m (55 ft) long, approximately one hundred ten (110) individual yoke packs 1003 will be utilized in the construction of a full-length yoke half 824. As with the collar pack assembly machine 600, the yoke packs 1003 can be inspected during the various stages of construction. The individual yoke packs 1003 can then be assembled onto a collared superconducting coil, as will be more fully described hereinafter. Similar to the collar pack 415 stacking therein, the yoke packs 1003 can be stacked onto the superconducting coil to form the full-length yoke half 824. As the yoke halves are utilized in the construction of the cold mass 64, the yoke packs 1003 can be stacked in order to form the full-length yoke half 824. Since the cold mass 64 represents a fully longitudinally welded assembly, there is no need to additionally secure the individual yoke packs 1003 into an elongated yoke half.

With the yoke stacking apparatuses 800, 1000 of the present invention, utilizing either or both embodiments, dimensionally accurate yoke assemblies 94 can be supplied for use in the superconducting dipole magnet 61 of a particle accelerator. With either embodiment, yoke assemblies 94 having coolant holes 91 therein are supplied so as to provide, on a large-scale manufacturing basis, dimensionally precise yoke assemblies produced in an economical manner. Since each apparatus 800,1000 is preferably under the control of a programmable controller, the individual yoke packs 1003 and full-length yoke halves 824 can be provided which are of the desired dimensions. Since the dimensions as to height and weight of each of the individual magnet steel yoke laminations 827 are known, yoke packs 1003 and full-length yoke halves 824 of the prescribed height and weight can be provided on a production basis, for the economical manufacture of the superconducting magnet 61 for the particle accelerator.

COLD MASS ASSEMBLY STATION FOR SUPERCONDUCTING MAGNETS

The next step to performed in the construction of the superconducting dipole magnet 61 is that of assembling the cold mass 64, which in essence comprises the magnet 61 used in the particle accelerator. The assembly is referred to as the "cold mass" due to the fact that it is the coldest part of the magnet, to be maintained at cryogenic temperatures of approximately 4.3 K. (Kelvin) so as to maintain the magnet 61 in the optimum superconductive state. As with the other steps in the manufacture of the superconducting magnet, the assembly of the cold mass 64 requires precision operation as well as careful handling.

Figure 62:
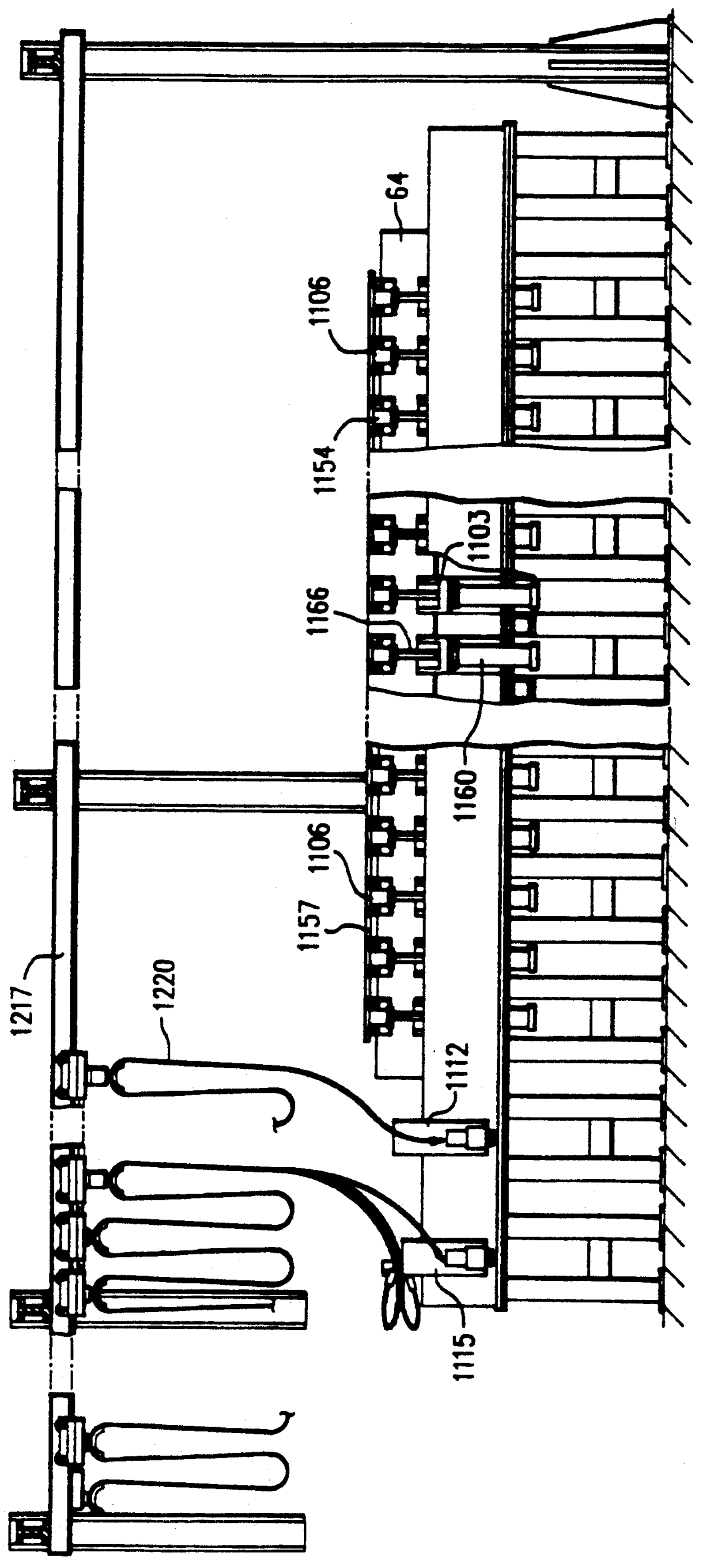
FIG. 62 is a side elevational view of a cold mass assembly station of the present invention.
Figure 63:
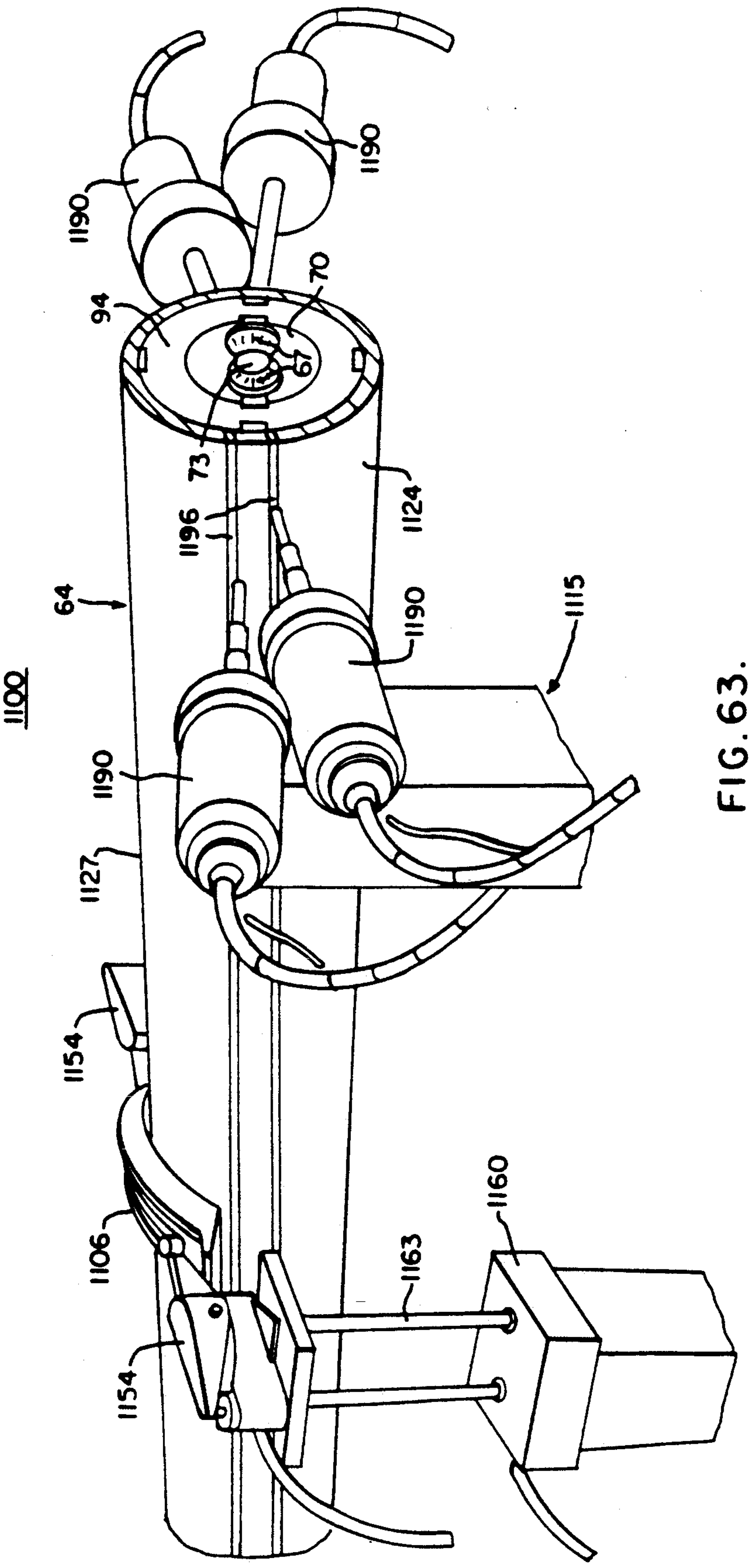
FIG. 63 is a perspective view of a half shelf clamping and welding assembly.

Referring to the drawings, FIGS. 62 and 63 show an automated cold mass assembly station 1100 for constructing superconducting magnets 61. The cold mass assembly station 1100 comprises a lower cradle support fixture 1103, upper cradle hold down clamps 1106, a linear motion rail system 1109, a laser alignment unit 1112, and a compact welding unit 1115. The cold mass assembly station 1100 also includes a component assembly work area 1118 where the various components of the cold mass 64 are pre-assembled prior to their being aligned and welded. The main component of the cold mass assembly station 1100 is a cold mass alignment-/welding machine 1121 whereby the components of the cold mass 64 are aligned along the longitudinal axis prior to, and during, welding such that the cold mass 64 is assembled to precise dimensional specifications so as to provide for a uniform magnetic field throughout the length of the superconducting dipole magnet 61, and for the SSC. An overhead material handling apparatus (not shown) is also provided for the transport of various components and the preassembled cold mass 64 to and from the alignment/welding machine 1121.

After a pair of inner and outer coils 67 made of superconducting material are wound, pressed and cured, they are arranged around the bore tube 73, within which the supercharged particles are to travel. The coils 67 and bore tube 73 are held within the collar assembly 70 so as to hold the coils 67 about the bore tube 73 in a precise configuration for a uniform magnetic field. The collared coil 427 is then assembled in the cold mass assembly station 1100 with the preassembled yoke packs 1003 or full length yoke halves 824 and elongated half shell assemblies 1124, 1127 which are then welded to form the cold mass assembly 64.

The construction of the cold mass assembly 64 for the superconducting dipole magnet 61 for the particle accelerator is performed according to the following steps:

At the assembly area 1118 the lower half shell 1124 is positioned within the cold mass assembly station 1100 lower cradle 1103, via the overhead lifting device. Each half shell 1124,1127 is an elongated, arcuately-shaped member which is approximately 17 m (55.5 ft) in length. With the lower half shell 1124 in place the lower yoke assembly is assembled into the half shell 1124. As disclosed above the yoke assembly 94 can be in the form of individual yoke packs 1003 of approximately 15.24 cm (6 in) in length assembled to form the yoke assembly 94 within the half shell 1124; alternatively the yoke assembly 94 can be in the form of elongated single half yoke assembly 824 comprised of the individual yoke laminations 827. In either case after the yoke assembly 94 has been positioned within the half shell 1124 it is temporarily locked in placed longitudinally within the lower half shell 1124, in a manner which is well known in the art. With the lower half shell 1124 and yoke assembly 94 in position, the collared coil subassembly 427 is lowered into the lower U-shaped half yoke assembly. Preferably these three components are positioned within the cold mass assembly station 1100 by a strongback, overhead lifting device such as discussed for the coil collaring press 400 above.

Figure 68:
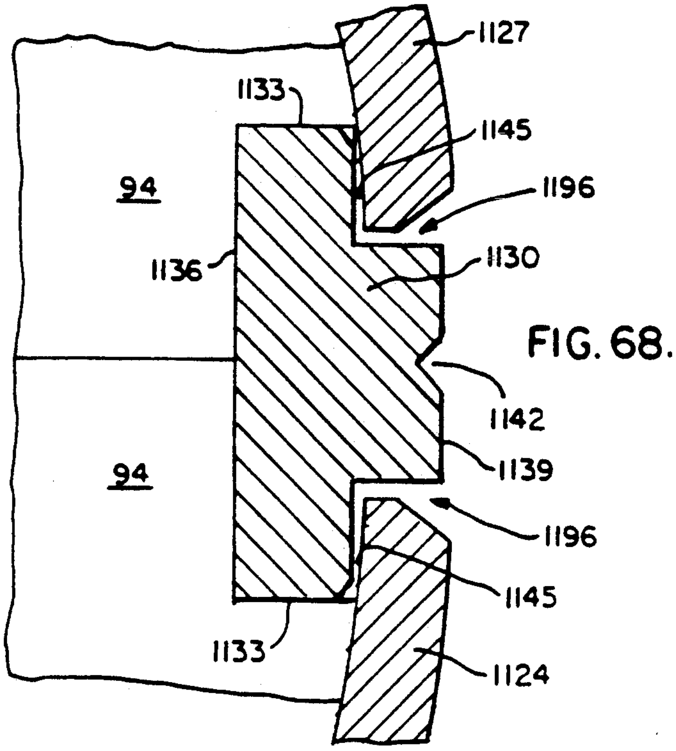
FIG. 68 is a view taken along the line LXVIII—LXVIII of FIG. 67.

After the collared coil subassembly 427 is installed within the lower yoke half 824 and half shell 1124, backing/alignment strips 1130 are lowered into lower yoke half notches 1133 at edges of the lower half shell 1124. As shown in FIG. 68, the alignment strips 1130 are generally T-shaped and are inserted on either side of the first half yoke assembly 94 and rotated 90° so that a cross member 1136 of each "T" is disposed between the first half yoke assembly 94 and the first half shell 1124 such that a base 1139 of each "T" is oriented radially outward. Moreover, the base 1139 of the alignment strip 1130 has a groove 1142 therein so as to be disposed on the outer surface of the cold mass assembly 64, the groove 1142 being used as an alignment mechanism during welding of the pre-assembly, as will be more fully described hereinafter. With the alignment strips 1130 in place, a second U-shaped half yoke assembly 94 is positioned onto the collared coil subassembly 427 and is longitudinally aligned with respect to the lower yoke half assembly.

The lower yoke half assembly is then unlocked and a second temporary yoke band lock is placed around the end collars 415 at each end of the pre-assembly. Finally the upper half shell 1127 is placed into position over the upper yoke half assembly such that the half shell edges 1145 engage the upper half or cross member 1136 of the alignment strips 1130, as shown in FIG. 68. Preferably, the half shell assemblies 1124,1127 are made of stainless steel, from one-piece rolled stock. Shell extension rings 1148 are then installed over the yoke assemblies 1124,1127 and are moved longitudinally into engagement with the half shell ends. The pre-assembled cold mass 64 is then removed from the assembly area 1118 by the overhead lifting device and transferred to the alignment/welding machine 1121.

Placement and Clamping of the Cold Mass

Figure 64A:
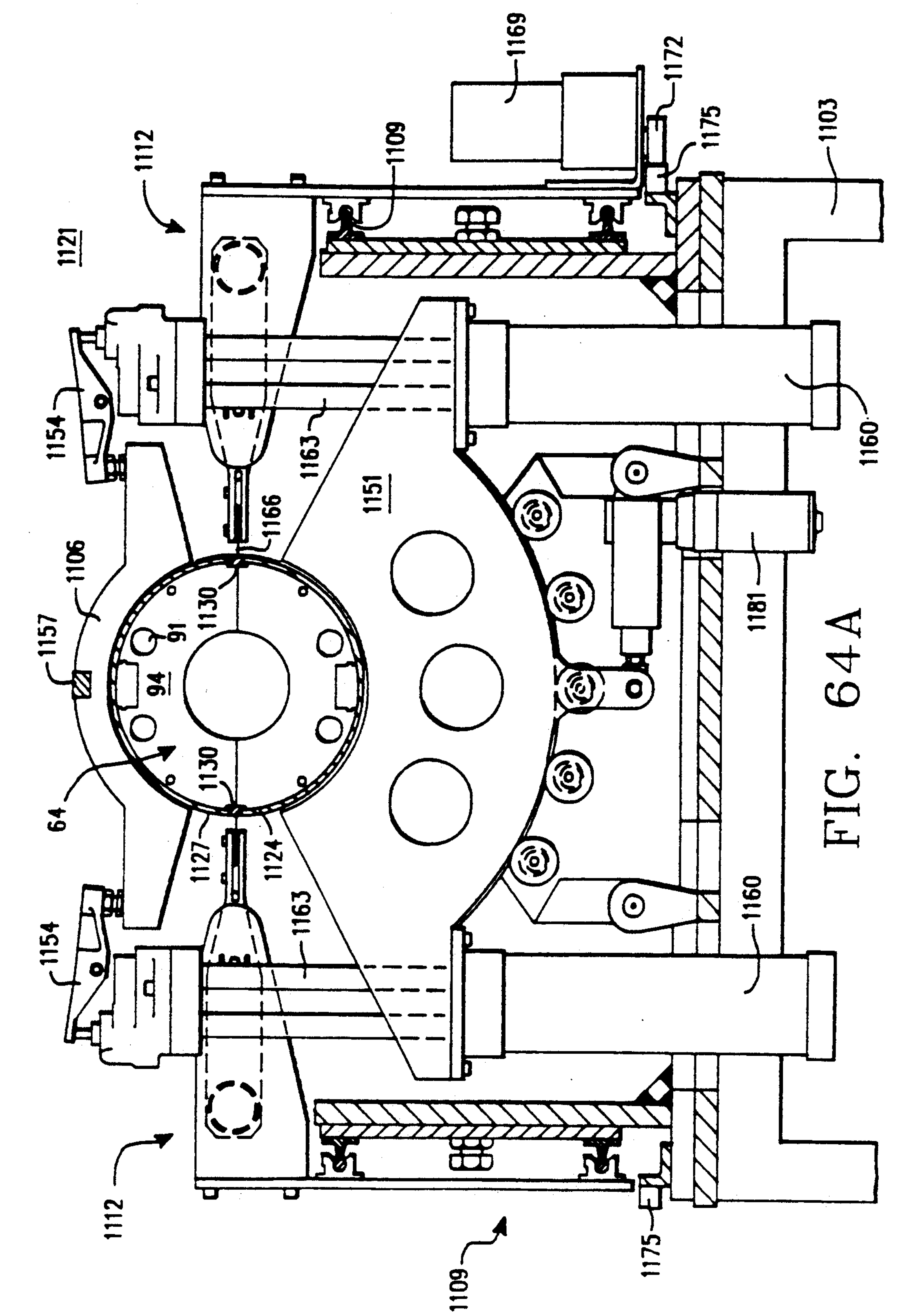
FIGS. 64A and 64B are detailed views of the clamped mode of an align/weld machine of the present invention.
Figure 64B:
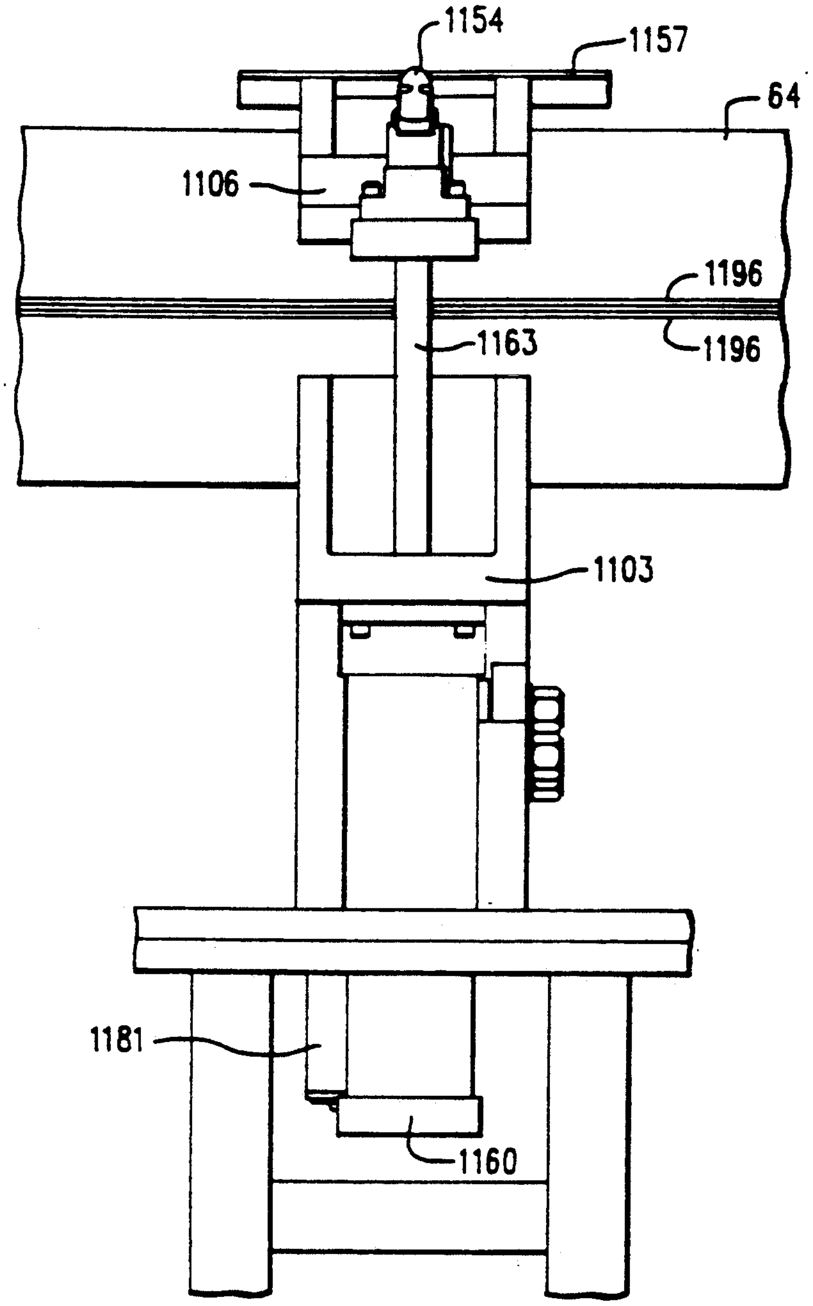
Figure 65A:
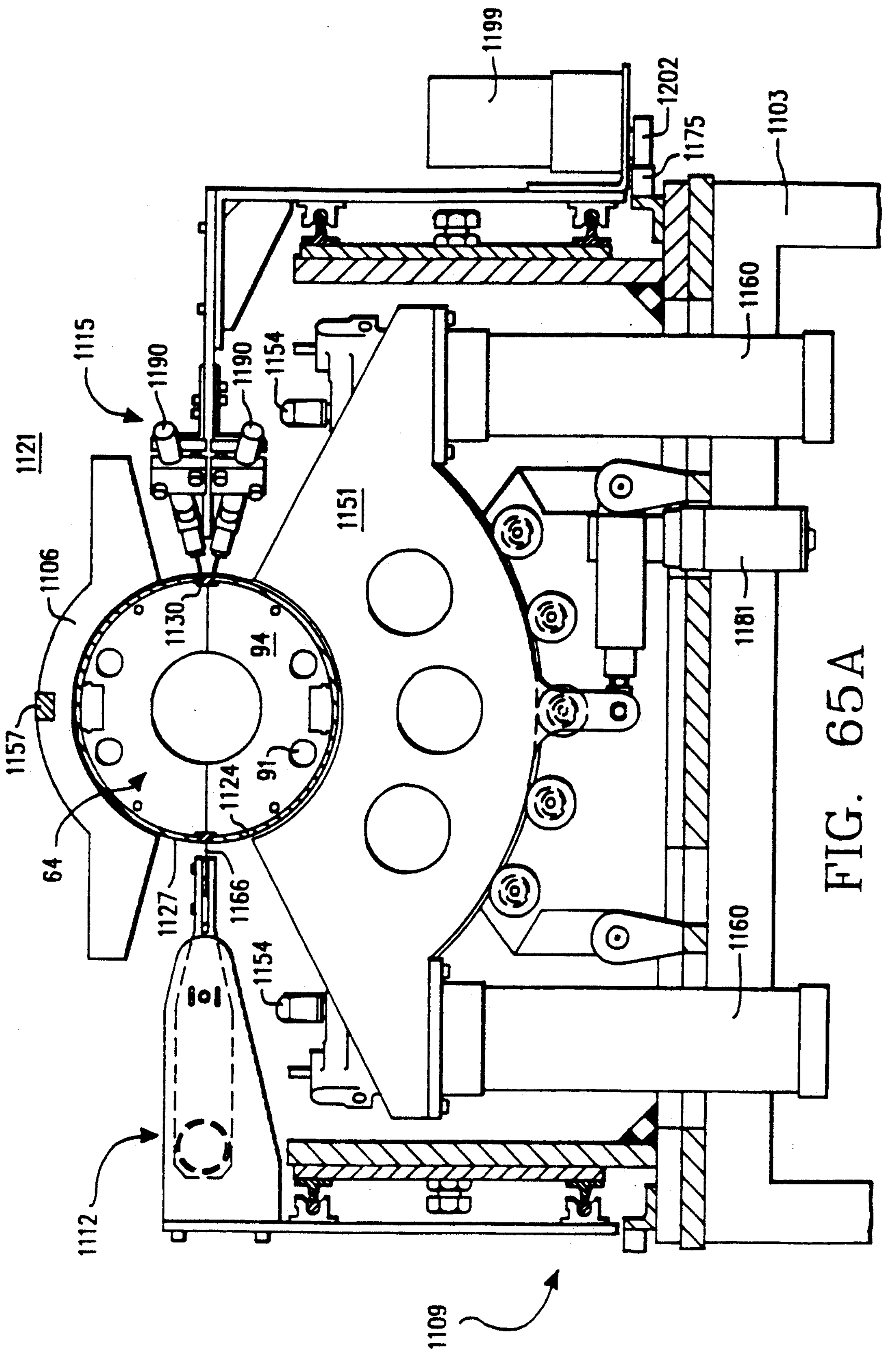
FIG. 65A and 65B are detailed views of the weld/gage mode of the present invention.
Figure 65B:
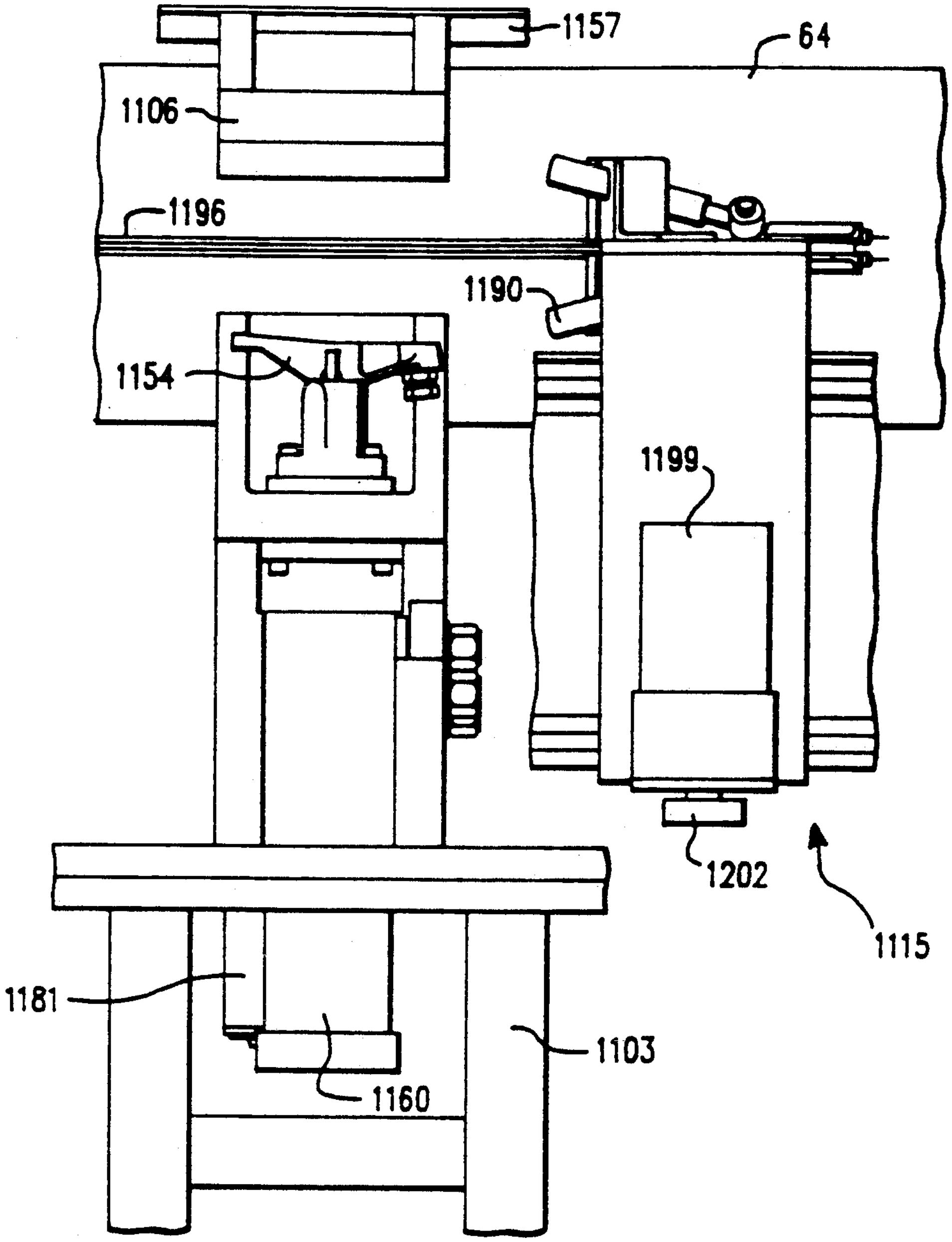

As shown in FIGS. 64 and 65, the cold mass pre-assembly is now ready to be aligned and welded so as to provide for the assembled cold mass 64 for the superconducting magnet 61.

The cold mass pre-assembly is positioned in a lower cradle 1151 of the align/weld machine 1121 and placed within the machine in a prescribed longitudinal location. Upper cradle hold down clamp beams 1106 are placed onto the upper half shell 1127 of the cold mass 64 pre-assembly, and positioned in-line with respect to swing clamps 1154 supported from the lower cradle support fixture 1103. Alignment bars 1157 are installed over the hold down clamps 1106, which automatically and accurately space the clamp beams 1106 longitudinally along the cold mass 64 pre-assembly. The clamping of the cold mass 64 is then commenced.

Figure 66:
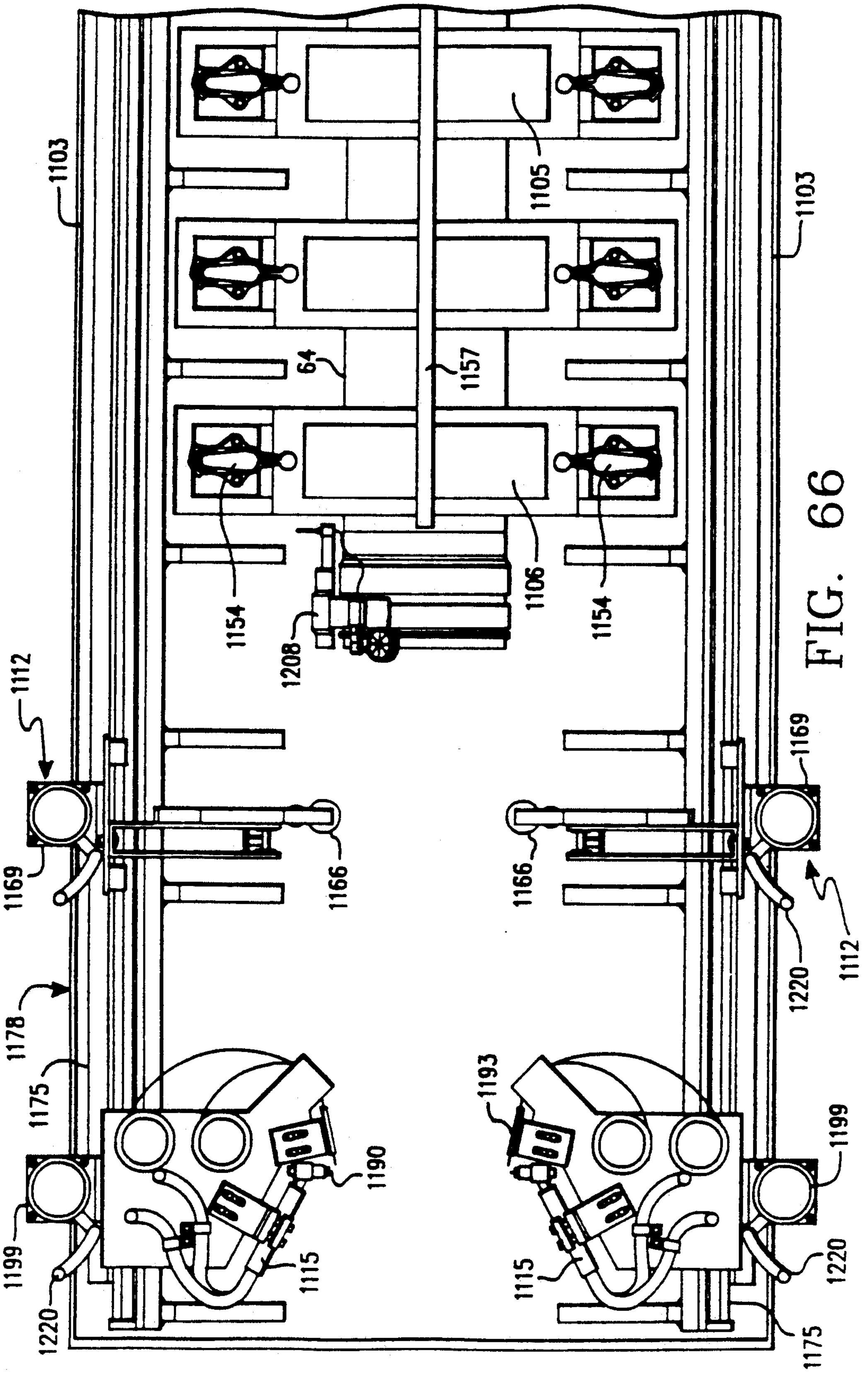
FIG. 66 is a plan view of the storage end of the align and weld fixture of the present invention taken along the line LXVI—LXVI of FIG. 62.

Preferably the cold mass 64 pre-assembly clamping sequence is under the control of a programmable controller (not shown) so as to clamp the upper half shell 1127 securely within the align/weld machine 1121. The cold mass pre-assembly clamp cycle is activated by an operator, and the automated sequence begins. Non-rotating cylinders 1160, mounted on the lower cradle support fixture 1103 on either side of the cold mass 64 preassembly, are fully extended upward. The swing clamps 1154, which are mounted to non-rotating cylinder rods 1163, are swung 90° and actuated downward to engage the ends of the hold down clamp beams 1106 (see FIG. 64). Preferably each swing clamp 1154 is capable of providing the 10.7 kN (2400 lbs.) of clamping force required When the cold mass 64 pre-assembly is fully clamped, the alignment of the cold mass pre-assembly is then performed. This sequence is also under the control of an automatic controller. Accordingly, the operator activates an initial alignment cycle. Laser alignment devices 1112, mounted on either side of the lower cradle support fixture 1103, are used to longitudinally align the cold mass 64 pre-assembly along the alignment strip grooves 1142. Both alignment units 1112 include alignment targets 1166 which ride along the linear motion guide rail system 1109 mounted on the lower cradle support 1103. The laser targets 1166 travel along the lower cradle support 1103 by means of a gear motor 1169 having a spur gear 1172 on the lower end thereof which cooperates with a rack 1175 mounted on the lower cradle support 1103. The laser alignment target 1166 is positioned at a start or home position 1178 on the lower cradle support 1103, as shown in FIG. 66. A laser (not shown) is mounted on either side of the lower cradle support 1103 and is directed along the length of the cold mass 64 pre-assembly. The laser beams, which are precisely positioned with respect to the proper cold mass 64 assembly alignment, are directed longitudinally along the cold mass 64 preassembly. The laser alignment targets 1166 are positioned on either side of the cold mass 64 such that when the cold mass 64 is in proper alignment the laser beam will impinge on the target 1166. The laser alignment targets 1166 include tracking wheels which are engaged in the backing alignment strip grooves 1142 on either side of the cold mass 64 pre-assembly.

The laser beam impinging on the traveling, pivotable laser target 1166 will activate appropriate electro-mechanical actuators 1181 on the underside of the cold mass 64 pre-assembly by means of a microprocessor. Since the laser alignment targets 1166 travel along the linear motion guide system 1109 in a known and controlled manner, the longitudinal position of the target 1166 is always known by the microprocessor. Thus those longitudinal positions which may be out of alignment with respect to the cold mass 64 can therefore be corrected as the laser alignment target 1166 moves along the cold mass preassembly. Electro-mechanical actuators 1181 cause corrective rotation of the lower cradle 1151 and, hence, the clamped cold mass 64 pre-assembly to achieve the prescribed mid-plane planar accuracy, so that the alignment grooves 1142 on either side of the cold mass 64 preassembly are generally parallel. This precise accuracy is required such that the cold mass 64 assembly, since it is to be a fully enclosed system for the superconducting dipole magnet 61, will be fixed to the dimensional characteristics required for the particle accelerator.

As the laser alignment targets 1166 move along the lower cradle support 1103, the non-rotating cylinders 1160 with the swing clamps 1154 thereon must be activated and removed prior to the laser alignment unit 1112 reaching that longitudinal position. To accommodate the alignment unit 1112 as it travels the length of the cold mass 64 pre-assembly, the clamping mechanisms 1106 are actuated by limit switches, or other proximity devices, (not shown) which sense the position of the traveling alignment unit 1112. As the laser alignment target 1166 approaches the limit switches and activates them, the motion of the particular non-rotating cylinder 1160 is reversed from the clamp position. The non-rotating cylinders 1154 1160 are fully extended upward, swing clamps 1154 rotated 90° to the unclamped position, and the nonrotating cylinders 1160 retracted such that the laser alignmet units 1112 can freely move past. The reclamping of the cold mass 64 pre-assembly is actuated once the alignment unit 1112 passes the limit switch or proximity device.

Figure 69:
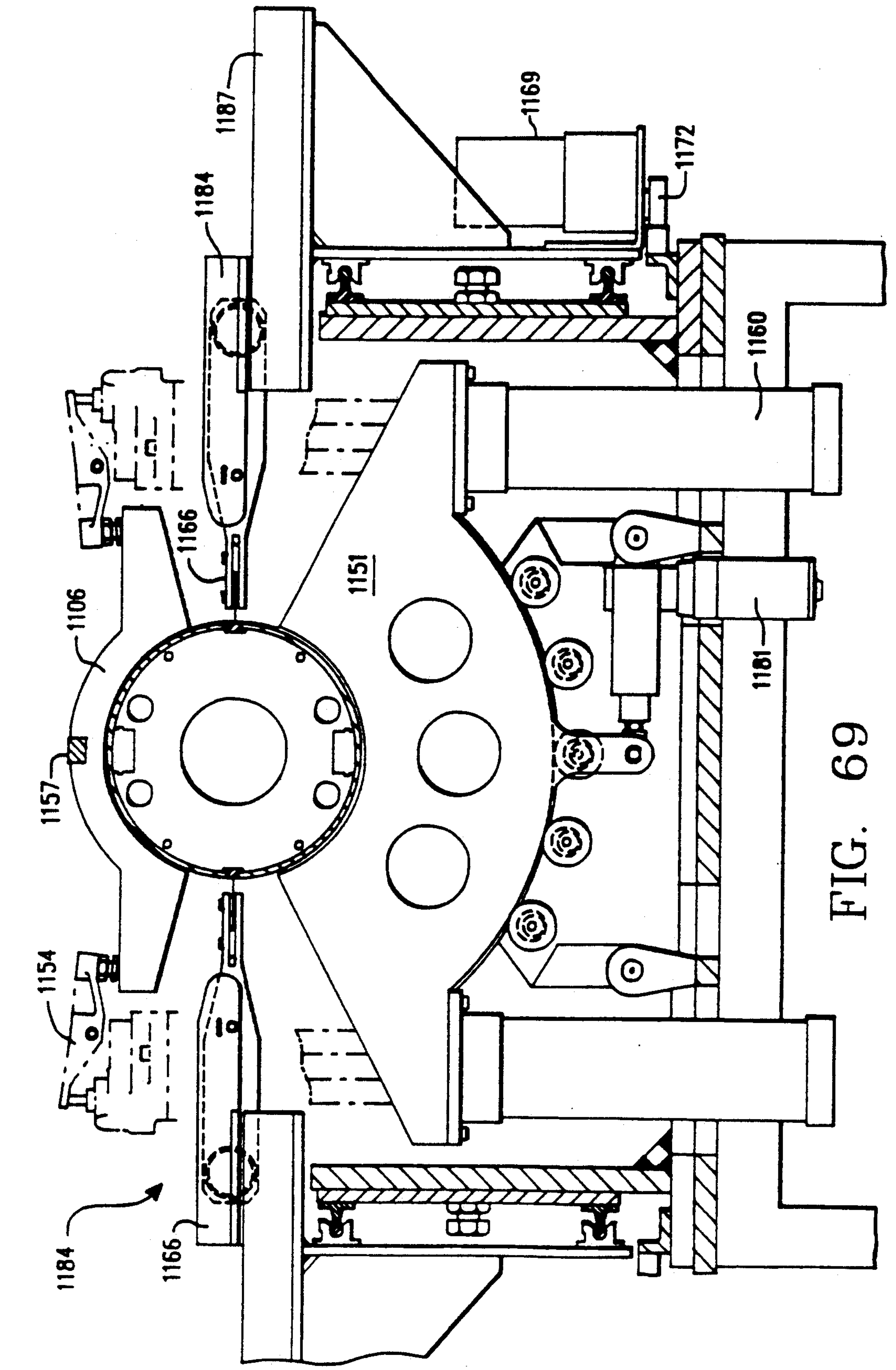
FIG. 69 shows an optional retractable alignment target for the cold mass assembly station of the present invention.

At the completion of the alignment sequence the alignment unit 1112 is then powered back to the home position 1178 preparatory to welding of the cold mass 64 pre-assembly. This step may be expedited by retraction of the target 1166 from engagement with the backing strip groove 1142 by means of an optional alignment fixture 1184 as shown in FIG. 69. This obviates the need for clamp 1106 retraction as the alignment unit 1112 is moved back to the home position 1178. In this configuration, the laser alignment target 1166 is movably mounted on a positioning table 1187 such that as the laser alignment unit 1112 nears the clamping cylinder 1160 the target 1166 is pulled back from the cold mass pre-assembly, obviating the need to unclamp the cold mass 64. The cold mass 64 pre-assembly is thus ready to be longitudinally welded.

Operation Sequence for Longitudinal Seam Welds

When the cold mass 64 pre-assembly alignment has been performed to a satisfactory condition, the operator then activates the longitudinal welding cycle, which is also under the control of the programmable controller. Four compact tungsten inert gas (TIG) welding torches 1190 and wire feed mechanisms 1193 are mounted on two (2) power transport welding units 1115 on either side of the lower cradle support 1103, similar to the laser alignment unit 1112. Each torch 1190 is oriented to weld a longitudinal seam 1196 between the upper half shell 1127 and the alignment key 1130, as well as the lower half shell 1124 and the alignment strip 1130 (see FIG. 68). The weld torch unit 1115 is also mounted on the guide rail system 1109 which runs along the longitudinal length of the lower cradle support 1103. It is driven by gear motor 1199 with a spur gear 1202 mounted thereon which engages the same rack 1175 mounted on the lower cradle support 1103 as the laser alignment unit 1112. The welding unit 1115 and laser alignment unit 1112 are then powered along the longitudinal axis of the cold mass 64 pre-assembly at a prescribed velocity. Welding is performed simultaneously on the four seams 1196 as the laser alignment target 1166, engaged in the alignment strip groove 1142, is at a predetermined distance in advance of the weld torches 1190, assuring that alignment is maintained during the weld cycle. Any deviation of the cold mass 64 pre-assembly is thus detected by the laser alignment device 1112 and real time re-alignment of the cold mass 64 pre-assembly is performed in advance of the welding torches 1190. Retraction of the clamping mechanisms, to accommodate the alignment 1112 and welding 1115 mechanisms as they travel the length of the cold mass 64 pre-assembly, is performed and activated by the same limit switches or proximity devices previously described in the alignment sequence above (see FIG. 65). At the completion of the longitudinal welds, the alignment 1112 and weld torch 1115 transport units are powered back to the home position 1178.

Optionally, this move may be made by retracting both laser target 1166 and torches 1190 to eliminate the unclamping routine. By simultaneously performing all four welds, the seam 1196 location is accurately maintained to provide the prescribed leak-tight weld joints 1196. It is important that the welds be leak-tight since coolant is to be transported through the cold mass 64 assembly in order to maintain the magnet 61 at the optimum temperature for superconductivity. Moreover, simultaneous welding assures that essentially no stresses are imparted on the upper 1124 and lower 1127 half shells or the alignment strips 1130.

Figure 67:
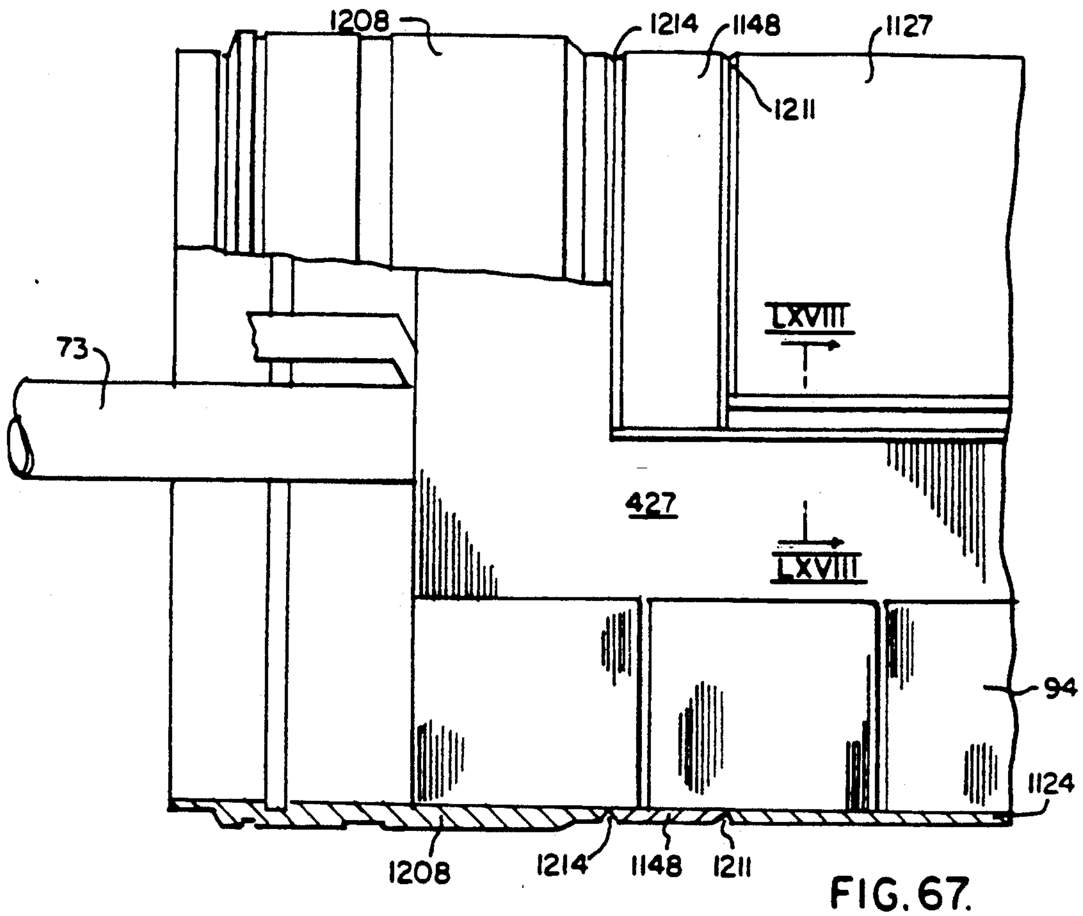
FIG. 67 is a detailed view, partially in cross-section, of one end of the cold mass assembly showing the elements thereof.

With the longitudinal welds completed, welding of extension ring 1148 and bonnets 1205 to the ends of the half shells 1124, 1127 may begin. As shown in FIGS. 66 and 67, shell extension ring 1148 is moved against the shells 1124,1127 and its upper and lower halves are longitudinally welded in place. The bonnets 1205 are then manually placed over the ends of the yoke assembly 94 and brought into engagement with the extension rings 1148 and clamped in position. Pipe welding subsystems 1208 for girth welding are also provided in the alignment/weld machine 1121 and are deployed from the home position 1178 (see FIG. 66). The welding torches 1208 are then moved into position at a shell/extension ring girth joint 1211. Automatic girth welding is then performed and the extension ring 1148 is welded to the shells 1124,1127, preferably concurrently at both ends. When shell to extension ring 1148 welding is completed, the welding torches 1208 are then moved into position at the extension ring/bonnet joint 1214. Automatic girth welding cycle is then initiated again and the bonnet 1205 is welded to the extension ring 1148, again preferably concurrently at both ends. With welding completed, the welding equipment 1208 is again returned to the home position 1178. With the cold mass 64 now finally assembled into a welded, rigid structure, all clamps 1106 are released by the operator to release the cold mass 64 assembly from the lower cradle support 1103. The overhead lifting device is then moved into position to transfer the completed cold mass 64 assembly for transfer from the alignment/weld machine 1121 to the subsequent station. The cold mass 64 assembly, essentially the superconducting dipole magnet 61, is then completed and ready for utilization within the particle accelerator.

Power and welding material for the alignment 1112 and weld units, along with longitudinal maneuverability, is provided by way of an overhead festoon rail system 1217, cables 1220 providing power to the units 1112, 1115 as they move longitudinally along the cold mass 64. As the alignment 1112 and Welding 1115 units are translated longitudinally, the festooned cables 1220, supported overhead via I-beam 1223, freely move therewith.

Figure 70:
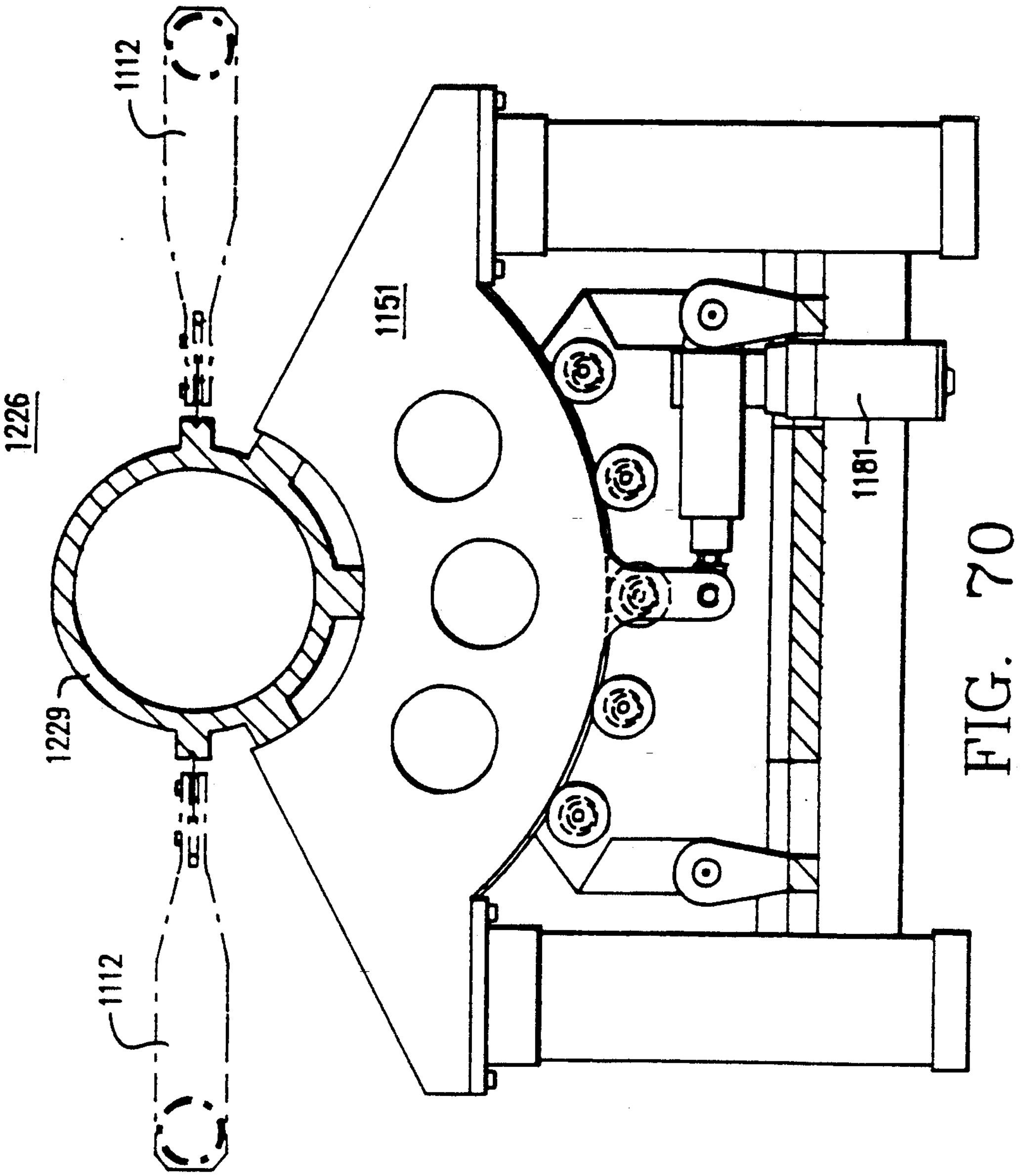
FIG. 70 shows a method of initially aligning a cradle support fixture for the cold mass assembly station.

Referring now to FIG. 70, there is shown an 1151. A master cold mass gage 1229, having essentially the same dimensions as a properly aligned cold mass assembly 64, is placed within the lower cradle 1151, and the laser alignment units 1112 transported down its longitudinal length. In this manner, the lower cradle 1151 alignment is calibrated with respect to the laser alignment units 1112, so that when an actual cold mass assembly 64 is placed therein, it can be brought into proper alignment as discussed above.

Thus the cold mass assembly station 1100 for superconducting magnets 61 offers a unique arrangement of material handling, positioning, accurate alignment/adjustment, and welding and assembly equipment to facilitate the efficient and precise assembly of the superconducting cold mass 64. An array of these stations 1100 integrated into a cold mass assembly work cell can provide magnets at a rate commensurate with large-scale production requirements. Since the operations are under the control of a programmable controller, utilizing proven technologies, conventional operator skills only are required. Precisely located longitudinal welds and simultaneous welding thereof can readily supply the completed cold mass 64 assemblies. Moreover the alignment strips 1130 insure that the superconducting magnet mid-plane occupies a known position with respect to the superconducting coils 67 incorporated therein. Thus a uniform magnetic field can be provided within the bore tube 73 for accurate use within the particle accelerator. Pre-alignment and real time alignment is provided in a programmed sequence to ascertain the specified mid-plane alignment before commitment to welding. All clamping and unclamping prior to welding passes sequence procedures are automatically monitored and maintained by the programmable controller. Automatic welding seam 1196 location accurately maintains and provides the prescribed leak-tight weld joints necessary for the superconducting magnets.

DIPOLE MAGNET MASTER ASSEMBLY STATION FOR A PARTICLE ACCELERATOR

Figure 71:
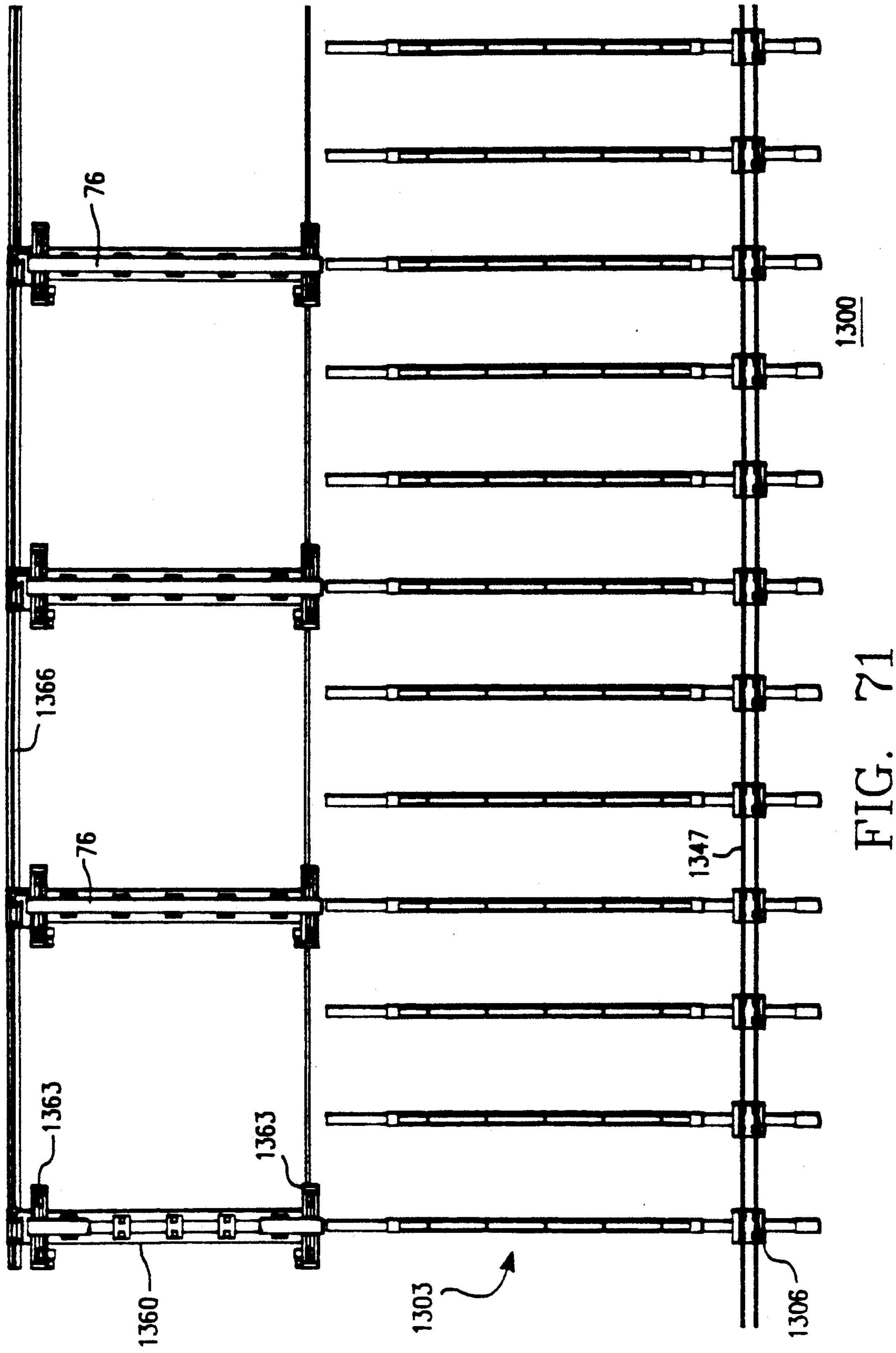
FIG. 71 is a top plan view of a loading station for installing the cold mass into a vacuum vessel.
Figure 72:
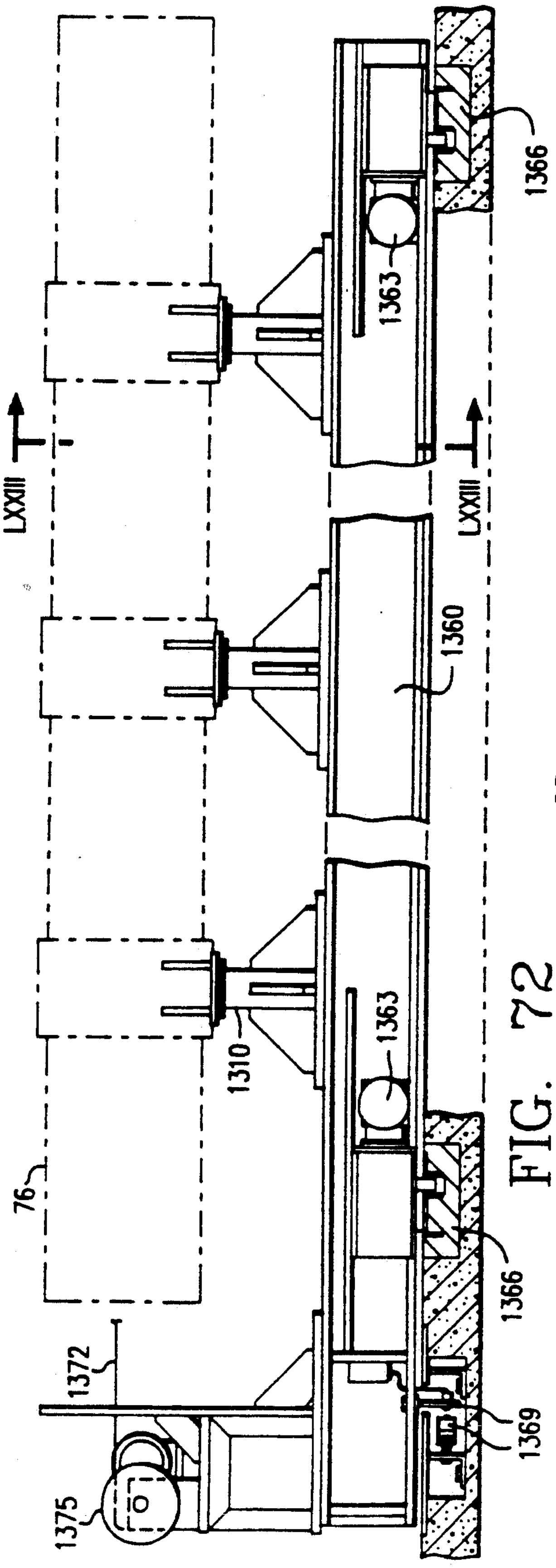
FIGS. 72 and 73 are side and cross-sectional views, respectively, of the vacuum vessel and its support stand.
Figure 73:
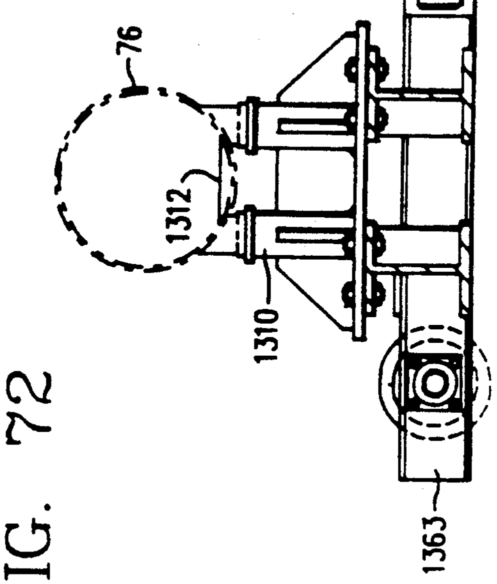

The dipole magnet final or master assembly 61 (FIG. 1) is preferably constructed according to the following steps by means of a magnet master assembly station 1300, shown in FIGS. 71–73, of the present invention. The final assembly station 1300 has as its main components a pair of preliminary assembly stations 1303, a seam track welding station 1306, and a support station 1309 having support stands 1310 for the vessel 76. Preferably there are fifteen (15) such pre-assembly stations 1303 where the heat shields 82,85 are assembled around the cold mass 64 and welded by the seam track welding station 1306. Also, five vessel support stations 1309 are provided, one each for three pre-assembly stations 1303. The method of construction for the dipole magnet assembly 61 is preferably preformed according to the following steps.

Figure 76:
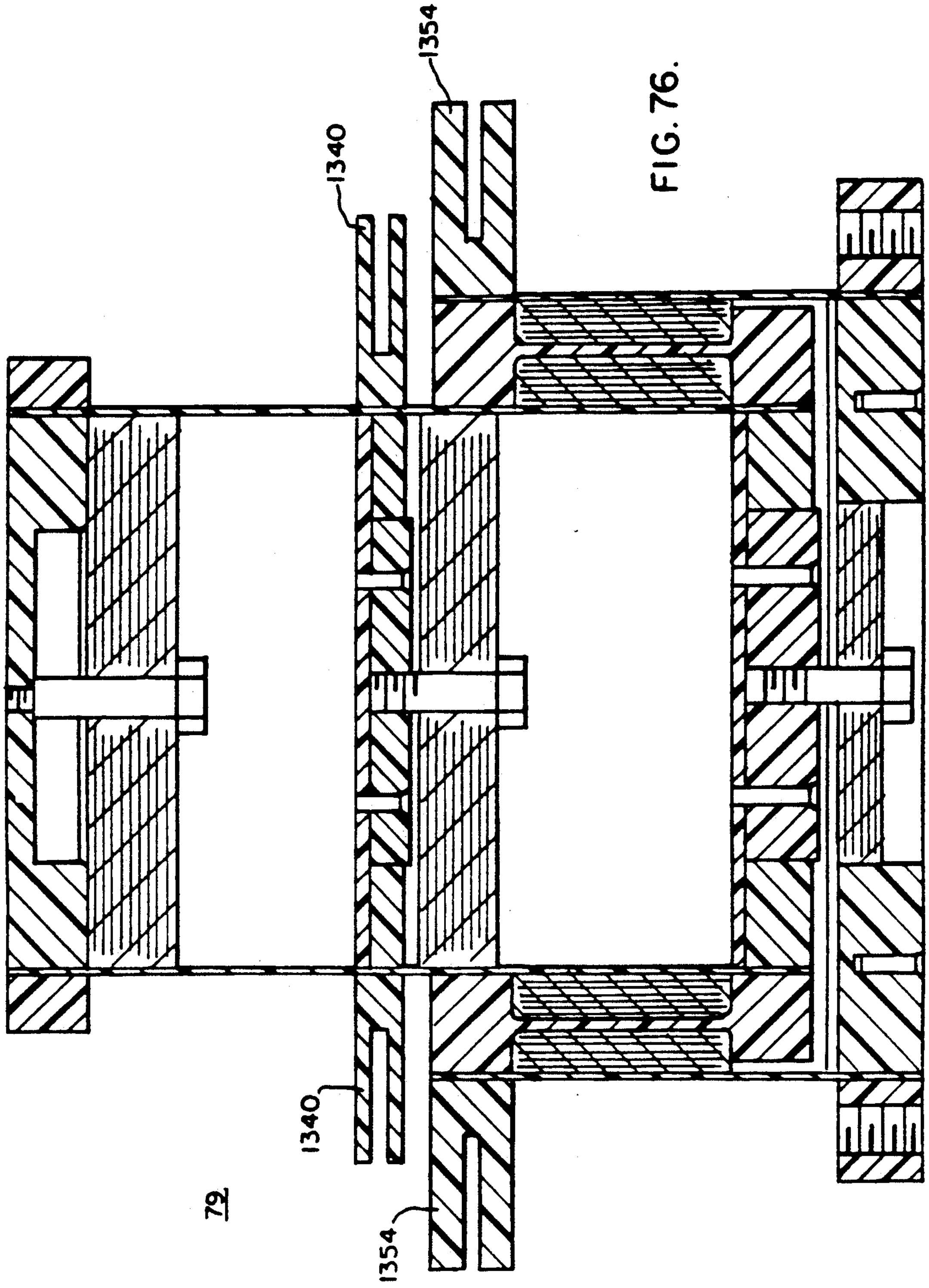
FIG. 76 is a cross-sectional detail view of a re-entrant post utilized in the present invention.

At the point intermediate between the seam track welding station 1306 and the pressure vessel support station 1309, the initial assembly steps are performed. A tow plate 1312, or positioning plate, is placed onto one of the machine beds 1315 slidably mounted on base 1316 at the preliminary assembly station 1303 between the weld station 1306 and the vessel support station 1309, and reentrant posts 79 and slide cradles 1310 are installed thereon. Preferably five re-entrant posts 79 are located and secured to the tow plate 1312; such as by bolting. The re-entrant posts 79 (FIG. 76) are insulated, and support the cold mass 64 within the vacuum vessel 76, while minimizing any transfer of heat therein. The side cradles 1310 act as a bearing support for the cold mass, while the re-entrant posts 79 allow the cold mass 64 to linearly expand and contract, as needed. After the operator has securely attached the re-entrant posts 79, the tow plate 1312 is positioned onto a machine bed 1315 and located between a series of guide blocks 1318 that are attached to the machine bed 1315. The guide blocks 1318 help assure that the assembly, prior to welding, is aligned with the welding station 1306. With the reentrant posts 79 in place on the tow plate 1312, a preassembled cold mass 64 is lowered onto the re-entrant posts 79, preferably by an overhead bridge crane (not shown).

With the cold mass 64 in place on the reentrant posts 79, coolant return line locating clamps 1321 are temporarily locked into place, with swing clamps, about the cold mass 64. The return line clamps 1321 have locating rods thereon (not shown), and are for positioning coolant return lines 1324,1327 within the assembly 64, to be described in detail hereinafter. When the return locating clamps 1321 are properly aligned, the temporary clamps are removed and return pipes 1324,1327 installed. Anchor posts 1330 then are pre-assembled and connected to the five re-entrant posts 79.

Figure 74:
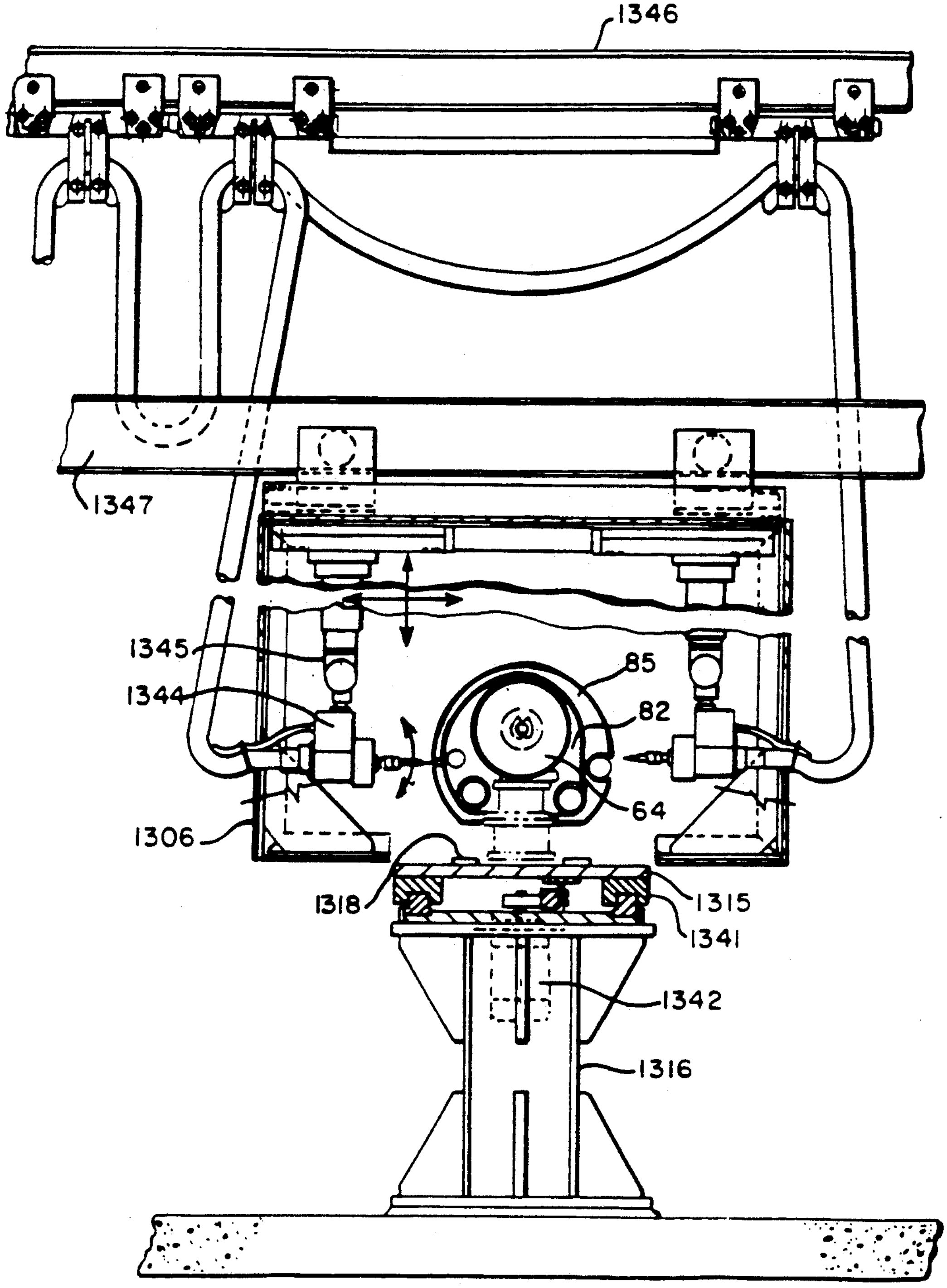
FIGS. 74 and 75 are cross-sectional and side elevational views, respectively, of a weld station.
Figure 75:
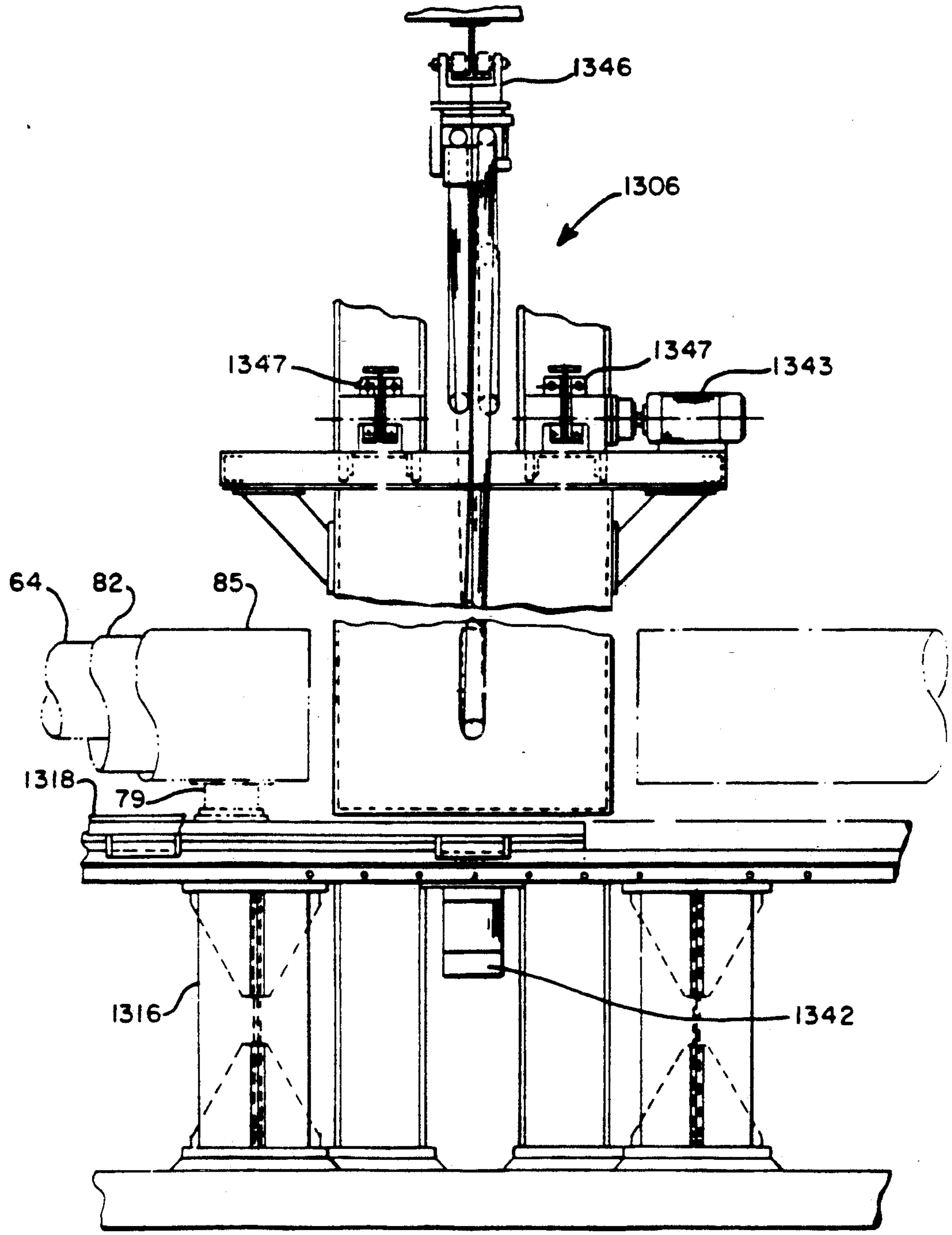
Figure 77:
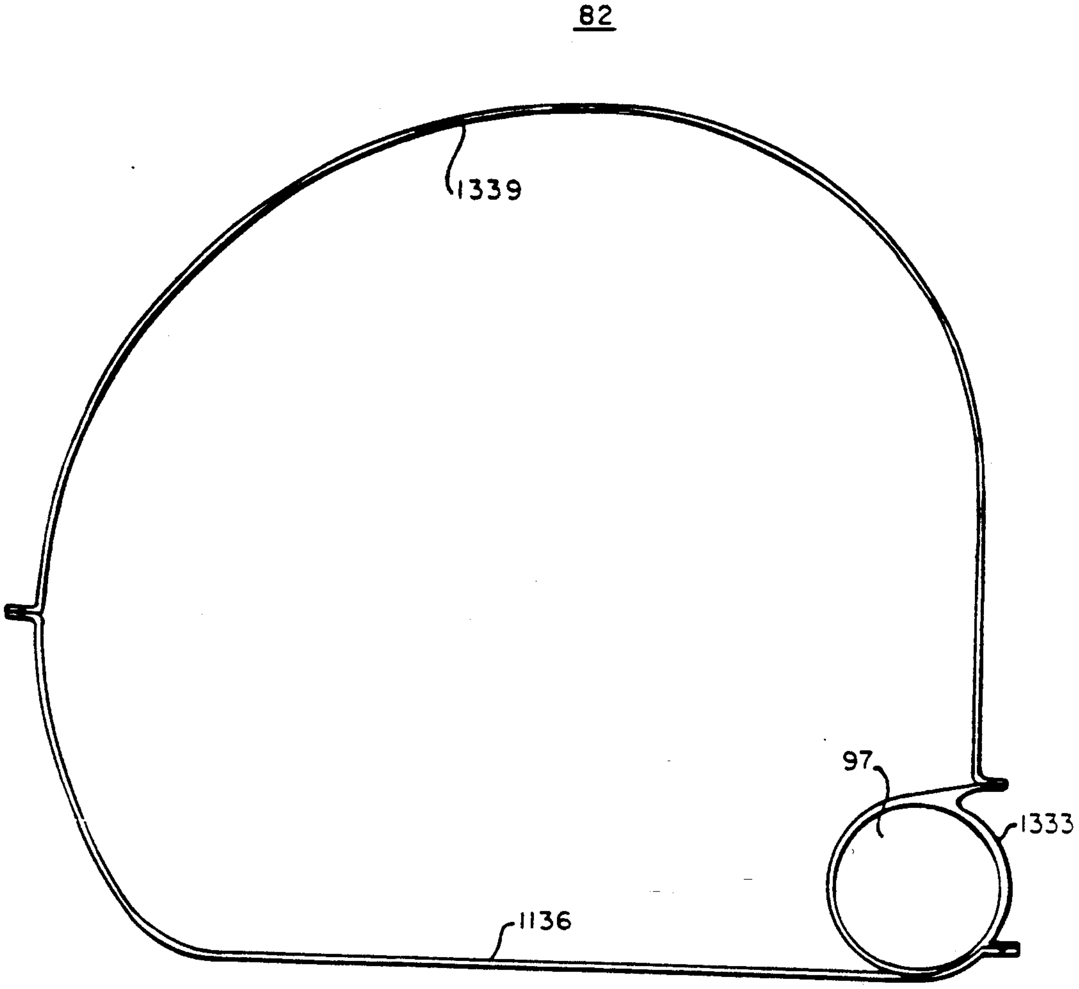
FIG. 77 is a cross-sectional view of a first shield assembly.

The series of temporary swing clamps used in aligning the return pipes 1324,1327 are again activated. End clamps are used for aligning the coolant tube 97 which is part of the 20 K. shield assembly 82 while intermediate clamps support and align its outside diameter along the longitudinal length thereof. As shown in FIG. 77, the 20 K. shield assembly 82 preferably comprises three components: a 20 K. side shield subassembly 1333, a bottom shield subassembly 1336, and a top shield subassembly 1339. The side shield subassembly 1333 includes the coolant tube 97, through which helium is transferred. The side shield 1333 and bottom shield 1336 subassemblies are aligned and welded together, and then the side shield subassembly 1333 is welded to the already fixtured helium return tube 1324, such as by spot welding. The helium tube subassembly 1333 is then aligned with, and assembled to, the cold mass re-entrant posts 79. The same is also done with the bottom shield subassembly 1336. The shield assemblies 82, 85 are preferably the length of the cold mass 64 assembly, on the order of about 17 m (55 ft) and are adapted to be secured to the re-entrant posts 79. The re-entrant posts 79, shown in detail in FIG. 76, include a bracket 1340 for receiving the 20 K. shield assembly 82. At the five areas where the re-entrant posts 79 are located, and similarly for the slide cradles 1310, the 20 K. shield bottom assembly 1336 includes a scalloped portion (not shown) for fitting into this retaining bracket 1340. When the 20 K. bottom 1336 and side 1333 shield subassemblies are thus in place, the top shield subassembly 1339 is aligned therewith. With the top shield 1339 in place, the machine bed 1315 is indexed forward through the already positioned seam track weld station 1306 and both sides of the top shield 1339 are welded simultaneously to the bottom 1336 and side 1333 subassemblies. This is accomplished by indexing the subassemblies through the seam track weld station 1306 (see FIGS. 74 and 75). Indexing is accomplished by translation of the machine bed 1315 on guide rails 1341, powered by gear motor 1342. When the subassembly has completely passed through the seam track weld station 1306 (moving to the right or bottom in FIG. 71) the 20 K. shield assembly 82 is completely welded about the cold mass 64.

Figure 78:
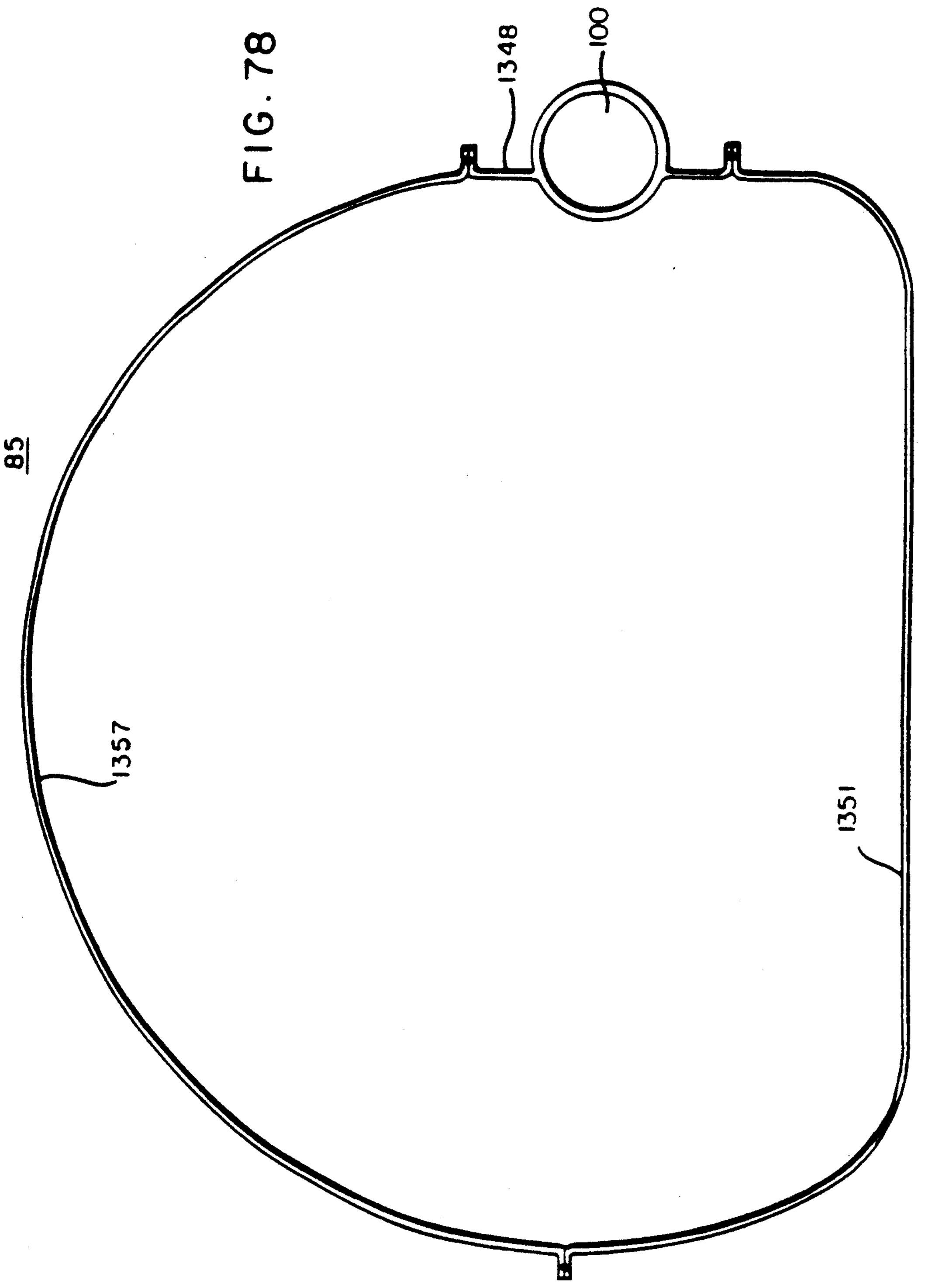
FIG. 78 is a cross-sectional view of a second shield assembly.

The seam track weld station 1306 is an overhead seam track servo-driven 1343 welding station. The seam track welder sensor heads 1344 are assembled to an (x-y) transporter with a pitch rotator 1345 which allows the sensor head 1344 to adjust to multiple positions. In this manner, the 20 K. shield assembly 82 can be completely welded in place. Each weld station 1306 can be positioned above the respective assembly station 1303 by an overhead festoon cable system 1346, sliding along rails 1347. Having done so, the next function is to cut and install an insulation sheet 88 about the entire length of the 20 K. shield 82. Installation of the 80 K shield assembly 85 can then be performed As with the 20 K. shield assembly 82, a series of swing clamps are activated so as to align the second return line 1327 with respect to the cold mass 64. Preferably this second tube 1327 is for the return of liquid nitrogen which is to be transferred through the 80 K. shield assembly 85. An 80 K. side shield subassembly 1348 (FIG. 78), having its coolant tube 100 integral therewith, is then aligned with, and assembled, to the cold mass reentrant posts 79. An 80 K. bottom shield subassembly 1351 is placed in position and secured to the cold mass reentrant posts 79 and welded to the side shield subassembly 348. The 80 K. bottom shield subassembly 1351 also includes scalloped portions for attaching the shield 85 to the cold mass re-entrant posts 79, which also include an 80 K. shield assembly bracket 1354. The bottom shield subassembly 1351 is then welded to the second return tube 1327. An 80 K. top shield subassembly 1357 is then aligned with respect to the side 1348 and bottom 1351 shield subassemblies. With the 80 K. top shield subassembly 1357 in place, the machine bed 1315 is indexed back through the already positioned seam track weld station 1306 and both sides of the 80 K. top shield subassembly 1357 are welded simultaneously, similar to the method in which the 20 K. assembly 82 was welded. After the subassembly has passed through the seam track weld station 1306 back to the station 1303 intermediate the weld station 1306 and the pressure vessel support station 1309, one or more insulation sheets 88 are then manually wrapped about the entire length of the 80 K. shield 85. Preferably the entire pre-assembly is then wrapped with a protective sheet 1358, such as mylar, for protection during its insertion into the vacuum vessel 76.

The vacuum vessel 76 is then placed in proper position for the pre-assembly to be loaded therein. Preferably the vacuum vessel 76 is indexed via a dual helical motor 1359 driven bridge girder 1360 with two end trucks 1363 running in an embedded railway 1366 (see FIGS. 72 and 73). Power is supplied preferably by an embedded multi-conductor bar system 1369 with a collector trolley and towing arm. When the pressure vessel 76 is positioned at the desired pre-assembly station 1303, a tow line 1372 is attached to the cold mass tow plate 1312. A cable reel winch 1375 attached to the other end of the tow line 1372 is then activated to pull the cold mass pre-assembly, including side shields 82 and 85, into the vacuum vessel 76. When the cold mass 64 pre-assembly has been completely inserted within the vacuum vessel 76, the cold mass re-entrant posts 79 are secured thereto. Bottom seal plates 1378 are then welded to foot plates 1380 of the re-entrant posts 79 from the underside of the fixture. Cold mass end restraints (not shown) are then installed at both ends. The final completed dipole magnet assembly 61 is then removed from the bridge girder 1360 via an overhead crane and the bridge girder 1360 is indexed to the next load position. The above steps are then repeated and in order to construct magnet assemblies 61 for the particle accelerator, such as the superconducting supercollider, according to dimensional specifications.

Figure 79:
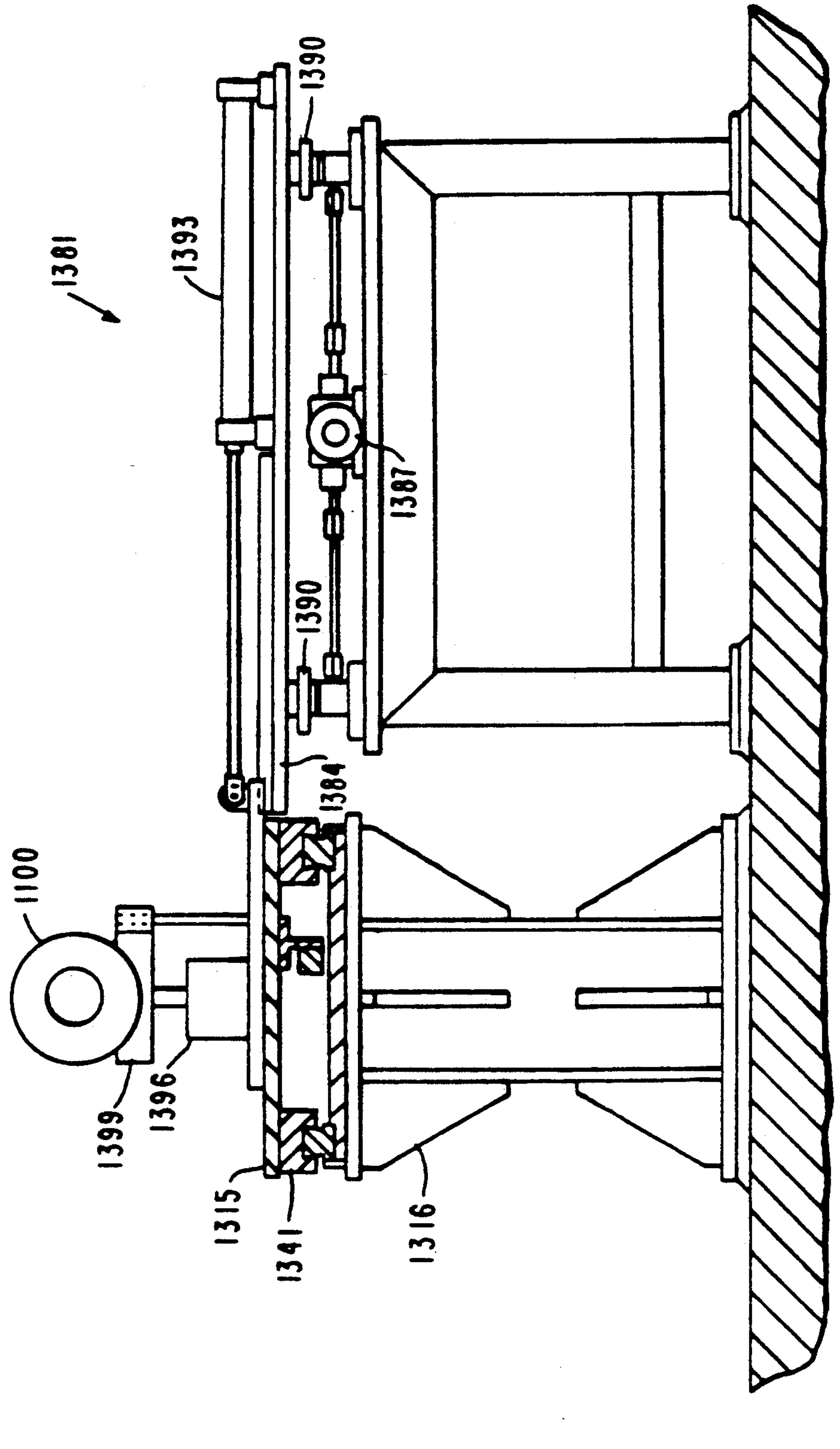
FIGS. 79 and 80 are cross-sectional and side elevational views, respectively, of an alternate cold mass loading method.
Figure 80:
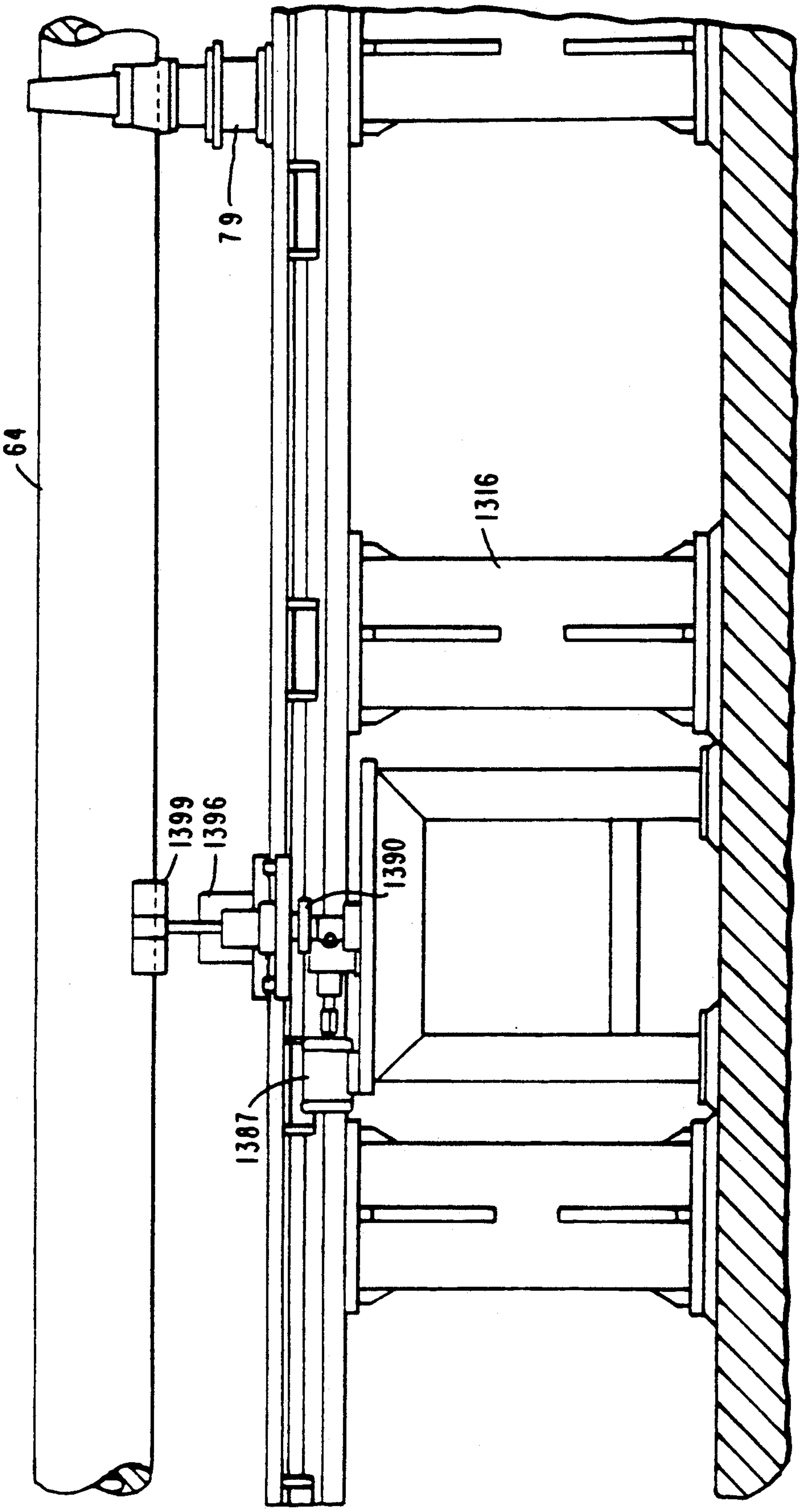
Figure 81:
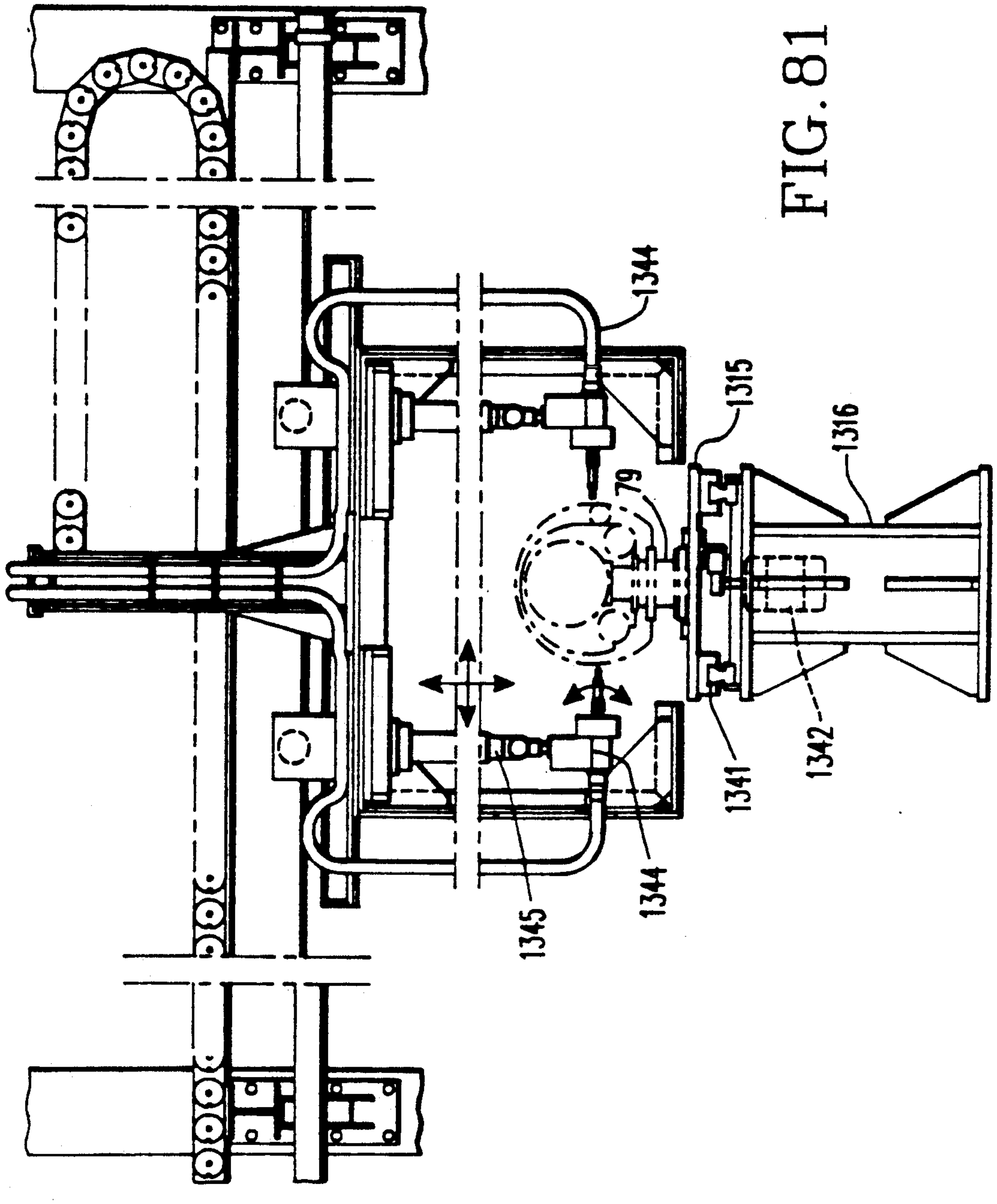
FIGS. 81 and 82 are detailed views of an alternate seam track welder supply system.
Figure 82:
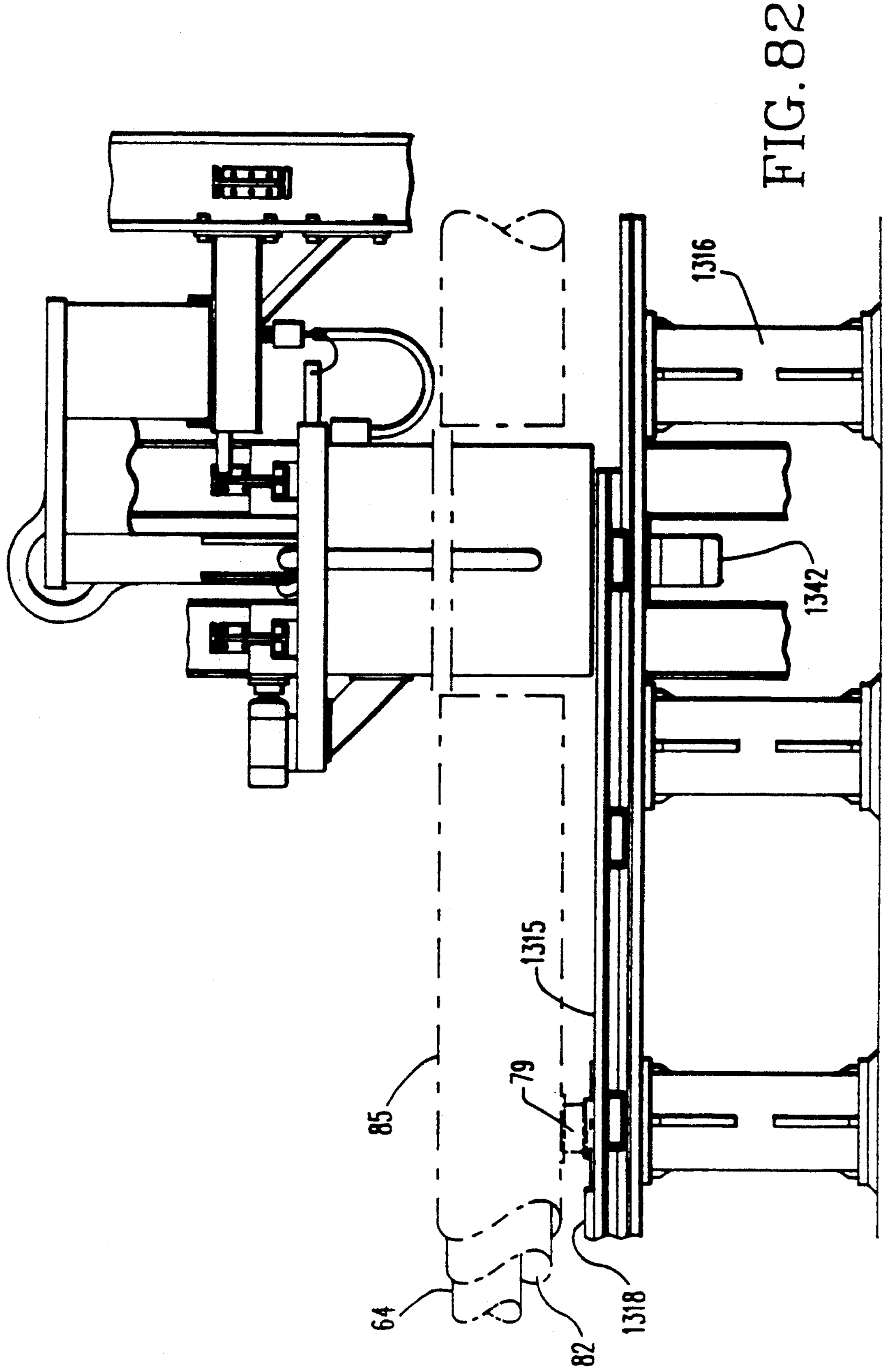

As shown in FIGS. 79 and 80, an alternate cold mass 64 loading sequence can be utilized. Located on one side of the machine bed 1315 (in front of the seam track welding units 1306) adjacent to the pre-assembly station 1303, may be included a series of cold mass loading stations 1381. Preferably there are four such stations 1381 per machine bed 1315 longitudinally disposed between the re-entrant post 79 locations. A load table 1384 is indexed upward from the machine bed 1315, preferably by a gear motor 1387 and two machine screw actuators 1390. Once the load table 1384 reaches a designated height, a positioning cylinder 1393 is activated which extends the load table 1384 top outward, positioning it above the machine bed 1315. The load table top 1384 is then lowered until it seats on the machine bed 1315. Preferably the load table top 1384 includes slots to allow clearance for the tow plate 1312 already in the loading position. Cold mass 64 support cylinders 1396 are then extended to the load position, the cylinders 1396 including saddles with anti-swivel bars 1399. The cold mass 64 is then lowered via an overhead bridge crane, onto the already extended support saddles 1399. The support cylinders 1396 are then retracted, thereby lowering the cold mass 64 onto the re-entrant posts 79. Once the cold mass 64 is thus located and seated on the re-entrant posts 79, it is clamped in place by the slide cradle assemblies 1310 (see FIG. 1). With the cold mass 64 securely in place, the cold mass support cylinders 1396 are pulled or retracted to the closed position. The load table top 1384 is then raised to clear the tow plate 1312 and is retracted via the positioning cylinder 1393. The installation of the 20 K. shield assembly 82, as delineated above, can then be performed.

Figure 83:
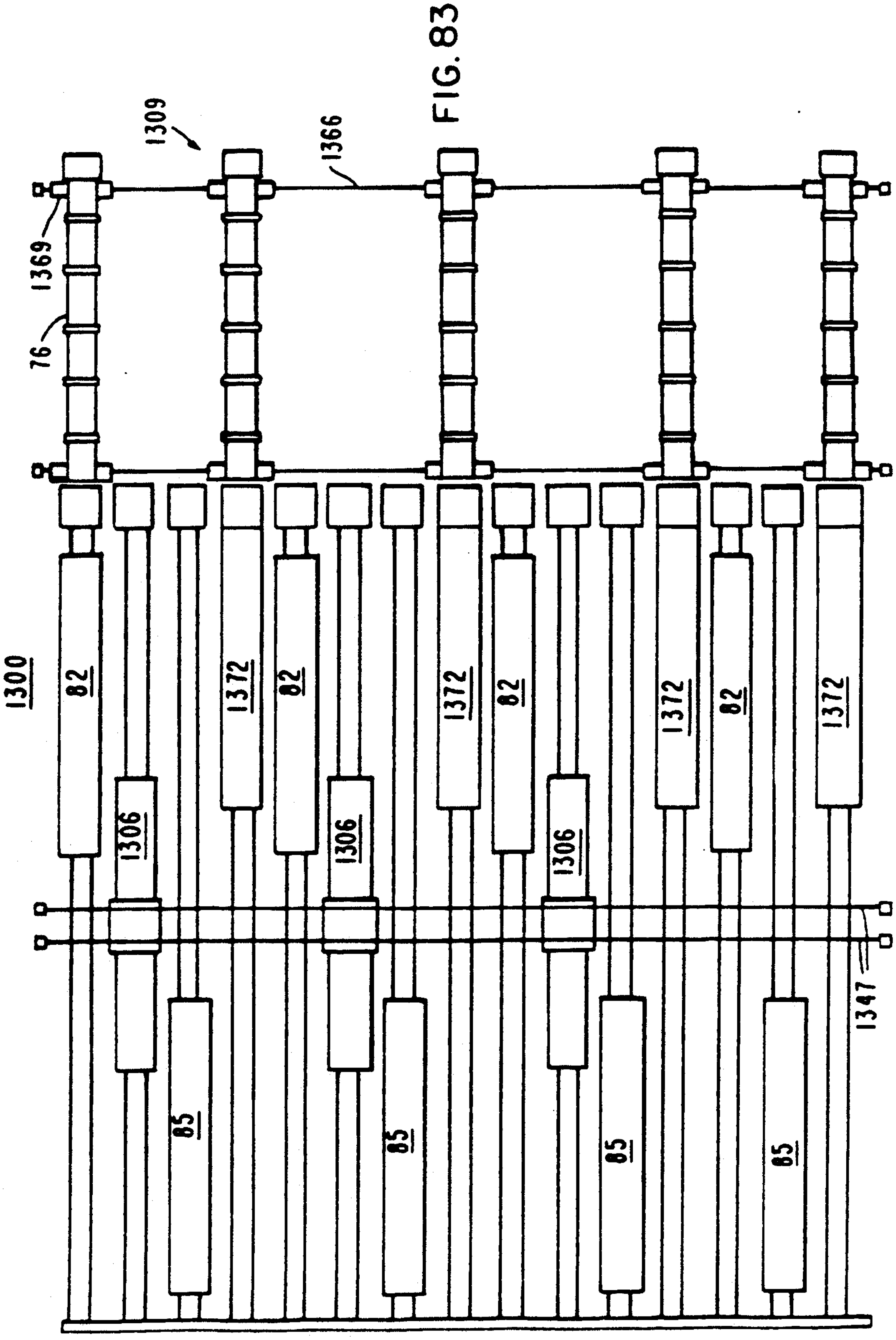
FIG. 83 is a schematic representation of an operation summary for the master assembly station of the present invention.
Figure 84A:
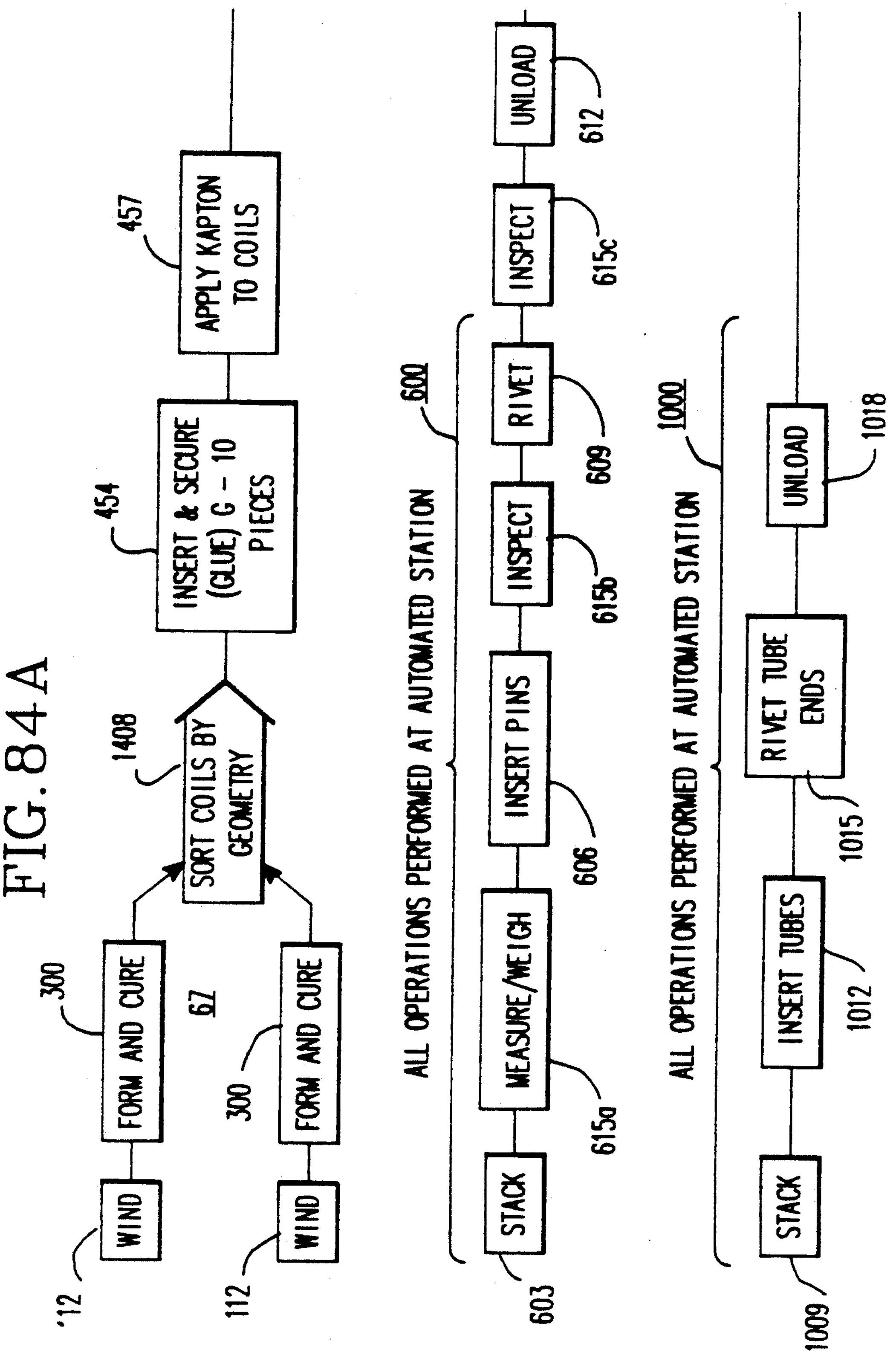
FIG. 84 is a schematic representation of a flow chart for the overall assembly procedures for the superconducting magnet.
Figure 84B:
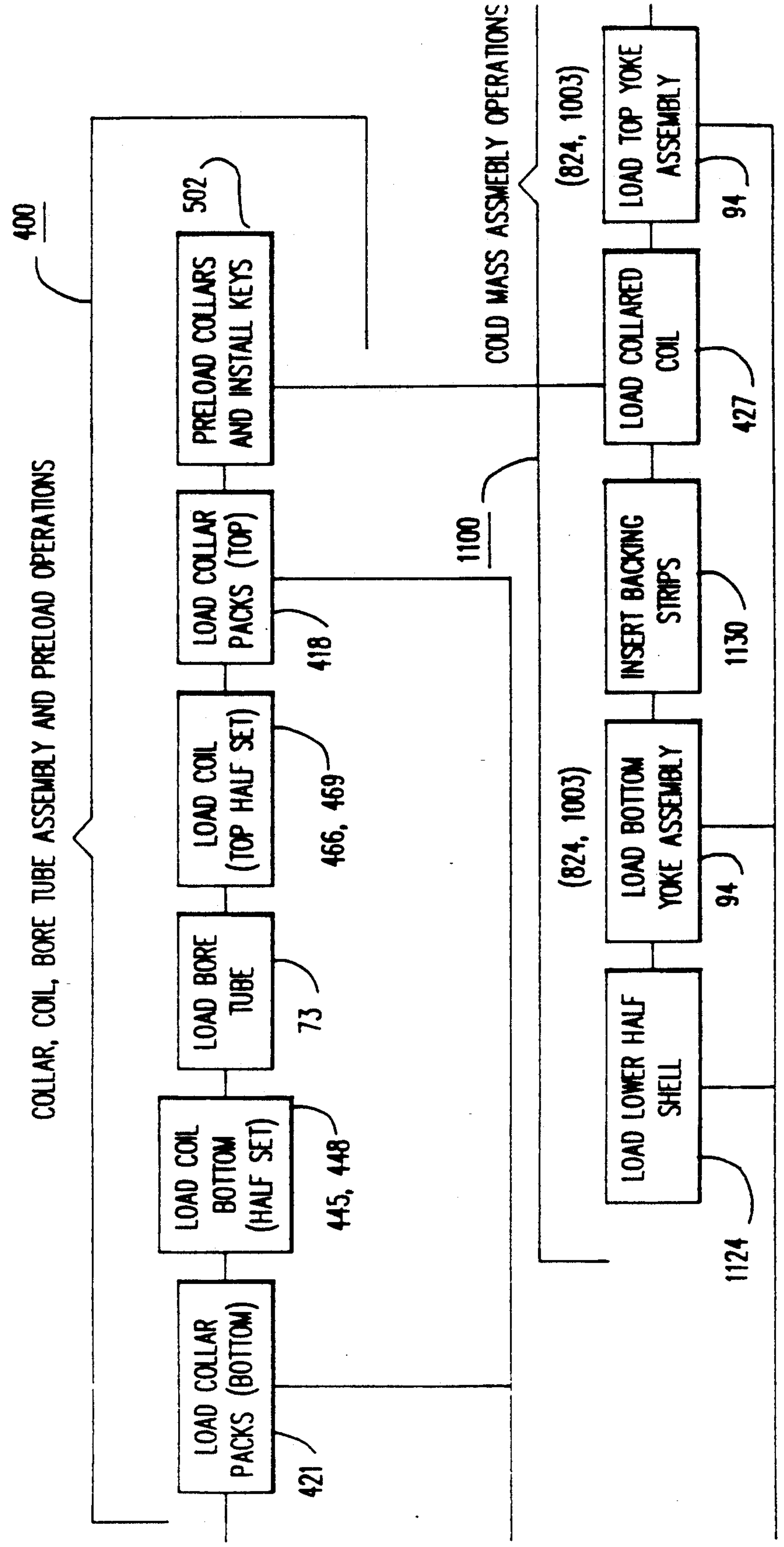
Figure 84C:
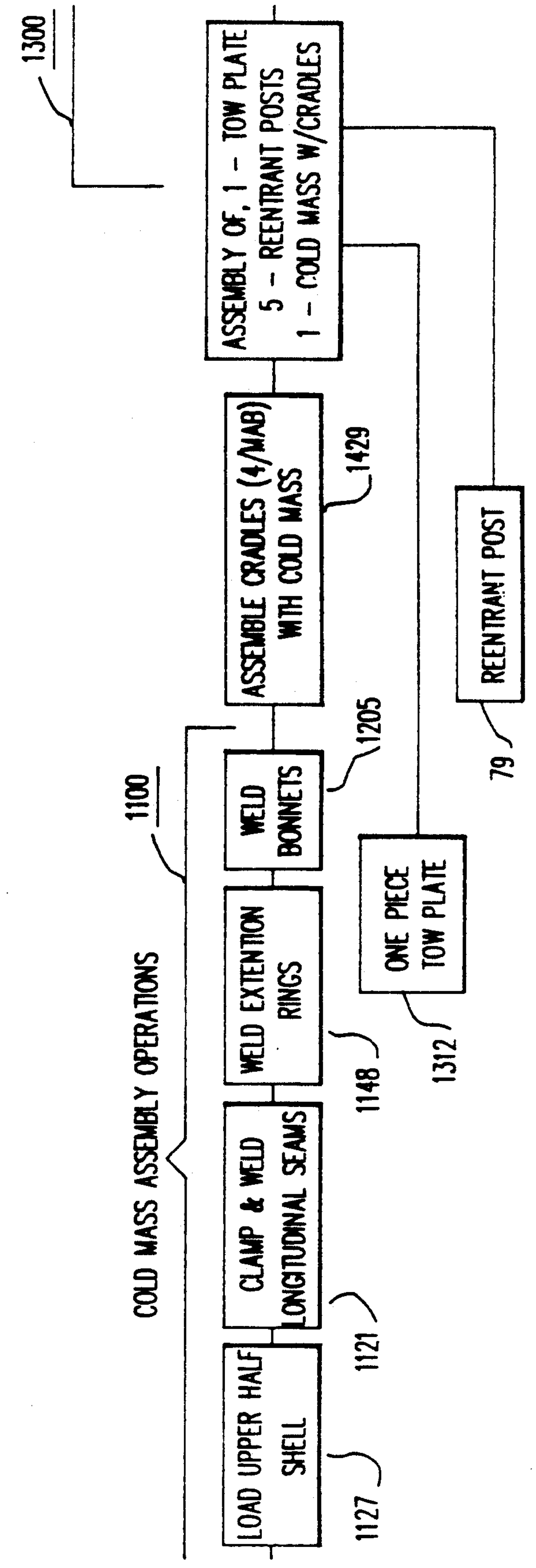
Figure 84D:
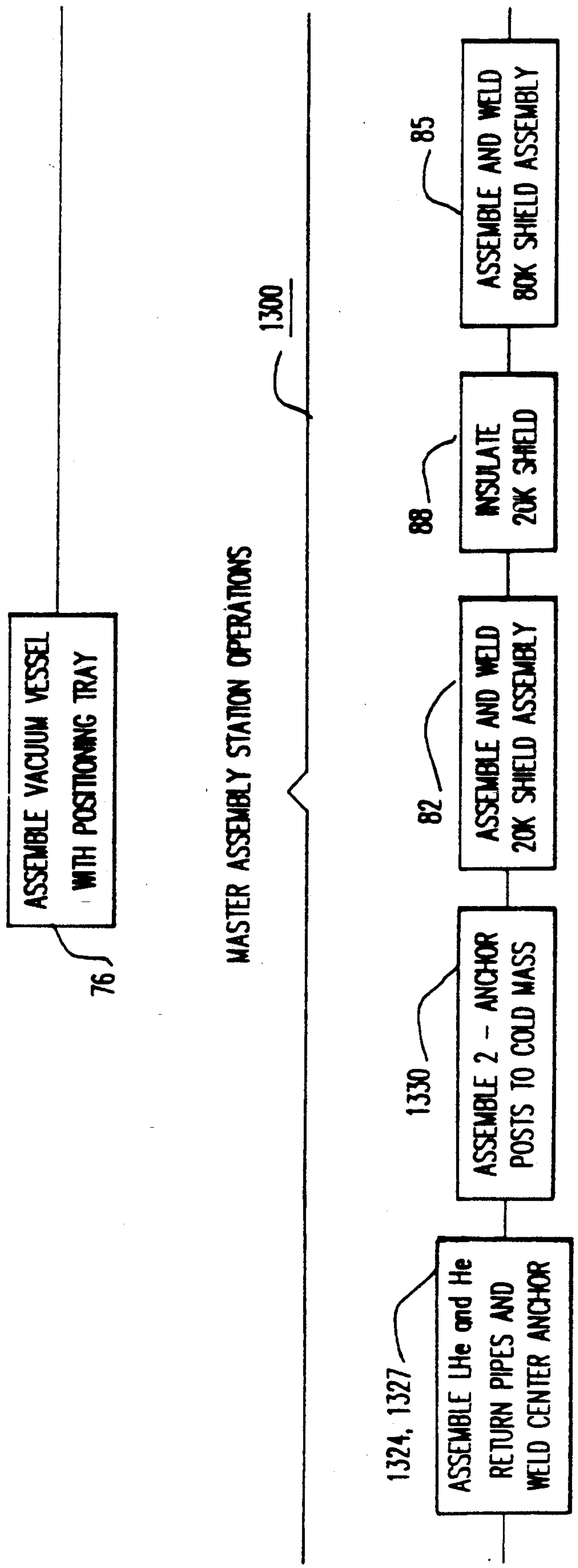
Figure 84E:
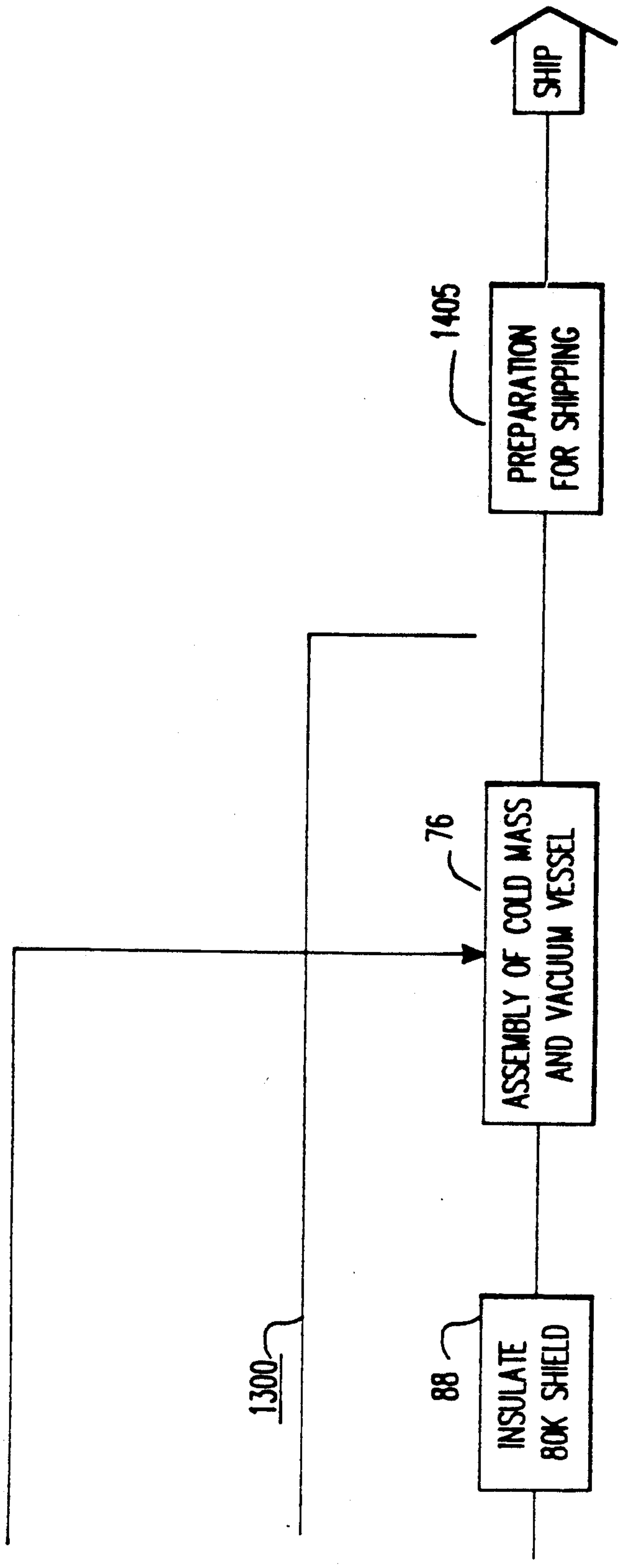

A schematic operation summary of the magnet master assembly station 1300 is shown in FIG. 83. Each vacuum vessel support station 1309 is to serve three preassembly stations 1303. At the three pre-assembly stations 1303, different stages of the pre-assembly can be performed. For example, while a 20 K. shield assembly 82 is being constructed around the cold mass 64, both a welding process and construction of an 80 K. shield assembly 85 can be on-going, as well as loading of the pre-assembly into a prepared vacuum vessel 76 by the tow line 1372. This simultaneous performance of individual pre-assembly construction steps allows for efficient utilization of the master assembly station 1300. Dipole magnet assemblies 61 can thus be assembled in an efficient and economic manner.

All the steps in the assembly sequence are under the control of a programmable controller, so as to position the various components in their proper place. Optimal utilization of the equipment is provided for by the lateral deployment of equipment, such as the welders, to any one of a bank of stations. Mechanized handling and transport facilities throughout the system provide for ease of operation. The modular design allows for staged implementation of the production facility, each of the three assembly stations 1303 being self-sustaining and designed as a module to facilitate convenient fabrication, installation, operation and routine maintenance. Flexibility of inter-module deployment of equipment or product accommodates any difficulties which may arise in the final assembly of the dipole magnet master assembly 61. In this manner, magnet assemblies 61 can be constructed on a large scale manufacturing basis commensurate with a typical particle accelerator program commitment, such as that projected for the superconducting supercollider program.

An overall manufacturing flow chart for the complete assembly of superconducting dipole magnets 61 for the particle accelerator or SSC, from the winding of coils 67 of superconducting material 103 to the operations of the final assembly station 1300, is shown in FIG. 84. As can be seen, many of the steps prior to the assembly of a cold mass 64 from its various components can be performed in parallel. These include, but are not necessarily limited to: winding, 112 curing and pressing 300 of coils 67 (both inner and outer coils), building of collar packs 415, and building of yoke assemblies 94 (either in full-length yoke halves 824, or in the form of individual yoke packs 1003 When these components have been prepared, the collaring and pressing 400 of a set of coils 67 about a bore tube 73 can be performed. Subsequent to the construction of a collared coil 427, half shells 1124, 1127 and yoke halves 824 can then be arranged about the collared coil 427, along with the T-shaped alignment keys 1130. The welding of a cold mass 64 assembly can then be performed simultaneously with the preparation of a vacuum vessel 76 for receiving the cold mass 64 therein, such as the installation of re-entrant posts 79 to the tow plate 1312. When the final assembly has been completed and inspected at an inspection station 1405, the superconducting dipole magnet 61 is ready to be transported to the chosen site for installation of the approximately 17.5 m (56 ft) length segments into the completed particle accelerator.

Figure 85:
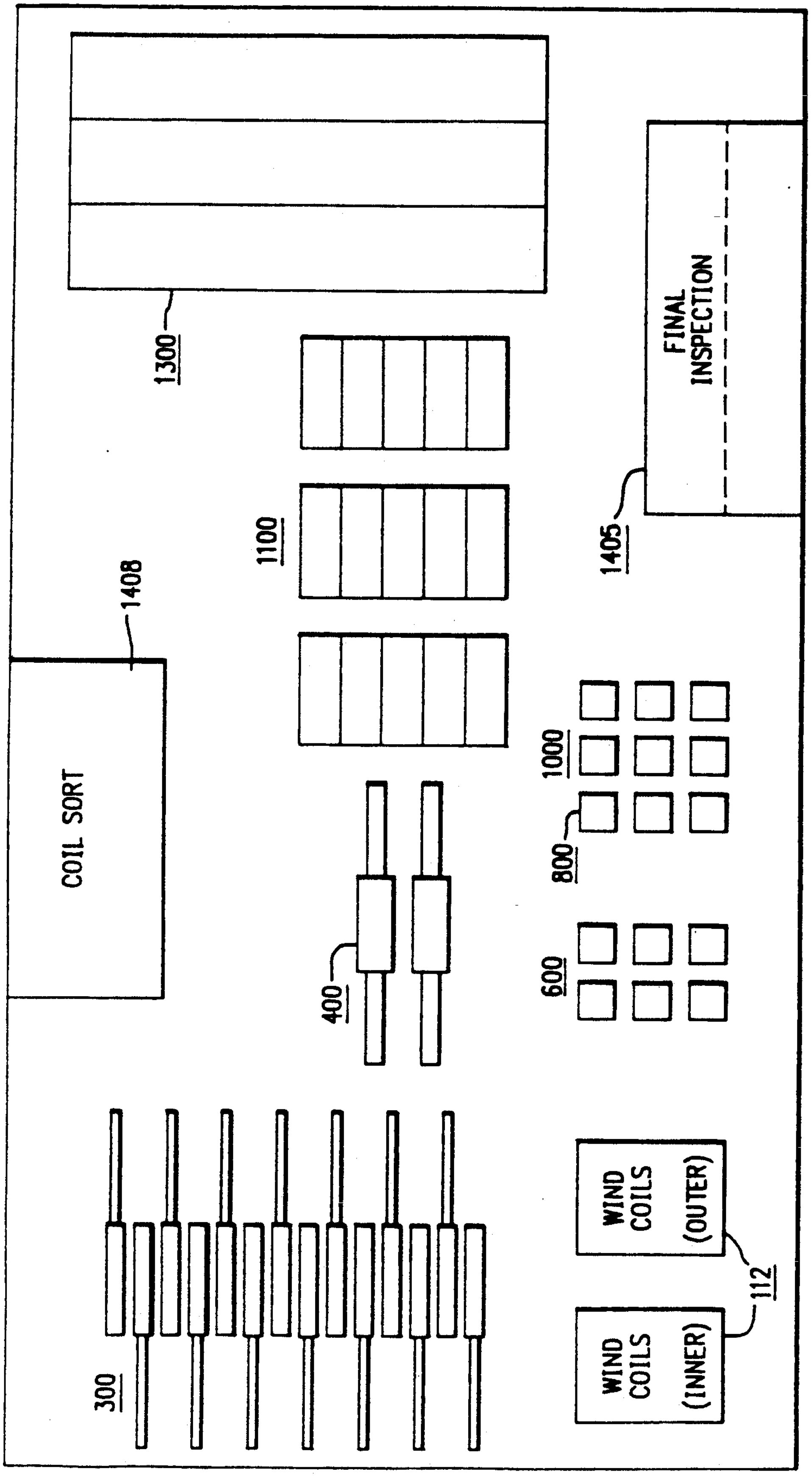
FIG. 85 shows an exemplary floor plan for the layout of the various assembly areas for the economical manufacture of components for the superconducting supercollider.

FIG. 85 shows a possible layout of the various manufacturing stations for the efficient use of them, such as outlined above. For example, both the coil winding 112, sorting (as to inner and outer coils) and inspecting 1408 of cured coils 67, curing and pressing 300 and collar pack 415 and yoke 94 construction operations can be performed adjacent to the collar pressing station 400. This minimizes the area over which the coils 67 and other components must be transported so as to also minimize the possibility of damage to these delicate components. The collared and pressed coil assembly 427 can then be moved to the adjacent cold mass assembly station 1100. As the cold mass 64 is assembled, the preliminary steps for the preparation of the vacuum vessel 76 may be carried out. When completed, these are then moved to the magnet master assembly station 1300 area for the final assembly of the superconducting dipole magnet 61. The final assemblies can then be inspected prior to shipment.

As can readily be seen, the overall construction of superconducting magnets 61 for the particle accelerator involves numerous and varied manufacturing steps. With the manufacturing process of the present invention, utilizing the automated manufacturing work stations disclosed herein, dimensionally precise superconducting dipole magnets 61 can be readily constructed on a relatively economical, large-scale manufacturing basis commensurate with production requirements. It is estimated, for example, that approximately seven thousand, seven hundred (7,700) magnet assemblies 61 will be required, over a several year period, for the SSC particle accelerator program. With the automated manufacturing process of the present invention, these magnets 61 can be economically and efficiently produced, using conventional operator skills only.

It is to be understood that, whereas the invention has been described with reference to a superconducting dipole magnet for a particle accelerator, the process and apparatus described herein have many applications. For example, the automated manufacturing equipment of the present invention can be used in the construction of quadrapole or sextapole magnets. Thus, while specific embodiments of the invention have been described in detail, it will be appreciated by those skilled in the art that various modifications and alterations would be developed in light of the overall teachings of the disclosure. Accordingly, the particular arrangements disclosed are meant to be illustrative only and not limiting as to the scope of the invention which is to be given the full breadth of the appended claims and in any and all equivalents thereof.

What is claimed is:

1. A method of constructing a particle accelerator having superconducting properties, said method comprising the steps of:
   - winding superconducting material into a plurality of inner coils and a plurality of outer coils, said inner and outer coils having a fixed shape;
   - placing a tubular member between said inner and outer coils;
   - placing said inner and outer coils with the tubular member therein within a collaring member to form a collared coil subassembly;
   - securing said collared coil subassemblies between a pair of U-shaped yoke half assemblies and a pair of arcuate-shaped shell members to form a cold mass assembly;

positioning said cold mass assembly in a vacuum vessel assembly having a cooling tube, through which is passed a cryogenic fluid, disposed therein, to thereby form a superconducting magnet;
   - joining a plurality of said superconducting magnets into a ring-shaped structure, whereby a particle accelerator having superconducting properties is constructed.

* * * * *